(12) United States Patent
Okada et al.

(10) Patent No.: US 7,955,925 B2
(45) Date of Patent: Jun. 7, 2011

(54) METHOD OF MANUFACTURING SEMICONDUCTOR DEVICE

(75) Inventors: Shigenari Okada, Tokyo (JP); Takuya Futase, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/167,445

(22) Filed: Jul. 3, 2008

(65) Prior Publication Data

US 2009/0011566 A1 Jan. 8, 2009

(30) Foreign Application Priority Data

Jul. 3, 2007 (JP) .................................. 2007-175501
Jul. 11, 2007 (JP) .................................. 2007-182031
Apr. 16, 2008 (JP) .................................. 2008-106606

(51) Int. Cl.
*H01L 21/336* (2006.01)
*H01L 21/8238* (2006.01)
*H01L 21/28* (2006.01)

(52) U.S. Cl. ........ 438/233; 438/683; 438/686; 257/384; 257/E21.634

(58) Field of Classification Search ............. 438/199, 438/233, 682, 683, 686; 257/369, 382, 384, 257/757, 770, E27.062, E29.166, E21.632, 257/E21.634, E29.255

See application file for complete search history.

(56) References Cited

U.S. PATENT DOCUMENTS

| | | | | |
|---|---|---|---|---|
| 5,679,585 A | * | 10/1997 | Gardner et al. | 438/655 |
| 5,824,600 A | * | 10/1998 | Byun et al. | 438/682 |
| 5,880,505 A | * | 3/1999 | Fujii et al. | 257/383 |
| 5,940,693 A | * | 8/1999 | Maekawa | 438/166 |
| 6,001,737 A | * | 12/1999 | Horiuchi et al. | 438/683 |
| 6,069,045 A | * | 5/2000 | Fujii et al. | 438/303 |
| 6,114,765 A | * | 9/2000 | Fujii et al. | 257/757 |
| 6,211,048 B1 | * | 4/2001 | Hwang et al. | 438/592 |
| 6,218,250 B1 | * | 4/2001 | Hause et al. | 438/302 |
| 6,221,764 B1 | * | 4/2001 | Inoue | 438/649 |
| 6,274,470 B1 | * | 8/2001 | Ichimori et al. | 438/592 |
| 6,316,362 B1 | * | 11/2001 | Inoue | 438/682 |

(Continued)

FOREIGN PATENT DOCUMENTS

CN 1495911 A 5/2004

(Continued)

OTHER PUBLICATIONS

Chinese Office Action received in Chinese App. No. 200810109647.2 (and English translation).

*Primary Examiner* — Mary Wilczewski
(74) *Attorney, Agent, or Firm* — Miles & Stockbridge P.C.

(57) ABSTRACT

After gate insulating films, gate electrodes, and n⁺ type semiconductor regions and p⁺ type semiconductor regions for source/drain are formed, a metal film and a barrier film are formed on a semiconductor substrate. And a first heat treatment is performed so as to make the metal film react with the gate electrodes, the n⁺ type semiconductor region, and the p⁺ type semiconductor region, thereby forming a metal silicide layer formed of a monosilicide of a metal element forming the metal film. After that, the barrier film and the unreacted metal film are removed, and then a second heat treatment is performed to stabilize the metal silicide layer. The heat treatment temperature is made lower than a temperature at which a lattice size of a disilicide of the metal element and that of the semiconductor substrate become same.

43 Claims, 40 Drawing Sheets

U.S. PATENT DOCUMENTS

| | | | |
|---|---|---|---|
| 6,534,871 B2 * | 3/2003 | Maa et al. | 257/769 |
| 6,916,729 B2 | 7/2005 | Fang et al. | |
| 6,949,482 B2 | 9/2005 | Murthy et al. | |
| 7,084,061 B2 * | 8/2006 | Sun et al. | 438/685 |
| 7,173,312 B2 * | 2/2007 | Cabral et al. | 257/369 |
| 7,274,055 B2 | 9/2007 | Murthy et al. | |
| 7,279,422 B2 | 10/2007 | Choi | |
| 7,314,789 B2 * | 1/2008 | Cabral et al. | 438/197 |
| 7,372,108 B2 * | 5/2008 | Iinuma | 257/369 |
| 7,470,943 B2 * | 12/2008 | Yang | 257/288 |
| 7,504,336 B2 * | 3/2009 | Purtell et al. | 438/682 |
| 2004/0113209 A1 | 6/2004 | Izuha et al. | |
| 2004/0253791 A1 * | 12/2004 | Sun et al. | 438/308 |
| 2005/0045969 A1 * | 3/2005 | Lee et al. | 257/410 |
| 2006/0124974 A1 * | 6/2006 | Cabral et al. | 257/274 |
| 2006/0163670 A1 * | 7/2006 | Ellis-Monaghan et al. | 257/388 |
| 2007/0001233 A1 * | 1/2007 | Schwan et al. | 257/369 |
| 2007/0040225 A1 * | 2/2007 | Yang | 257/369 |
| 2007/0066001 A1 * | 3/2007 | Iinuma | 438/199 |
| 2007/0108525 A1 * | 5/2007 | Yang et al. | 257/351 |
| 2007/0111421 A1 * | 5/2007 | Cabral et al. | 438/199 |
| 2007/0161218 A1 | 7/2007 | Ichinose et al. | |
| 2007/0173050 A1 | 7/2007 | Ichinose et al. | |
| 2007/0238321 A1 | 10/2007 | Futase et al. | |
| 2007/0269970 A1 * | 11/2007 | Purtell et al. | 438/581 |
| 2008/0044968 A1 | 2/2008 | Murthy et al. | |
| 2008/0242035 A1 | 10/2008 | Futase et al. | |
| 2009/0011566 A1 * | 1/2009 | Okada et al. | 438/308 |
| 2009/0134470 A1 * | 5/2009 | Yang | 257/369 |
| 2009/0227079 A1 * | 9/2009 | Iinuma | 438/233 |
| 2011/0006344 A1 | 1/2011 | Murthy et al. | |

FOREIGN PATENT DOCUMENTS

| | | |
|---|---|---|
| CN | 1591796 A | 3/2005 |
| CN | 1883040 A | 12/2006 |
| JP | 7-38104 A | 2/1995 |
| JP | 2003-119564 A | 4/2003 |
| JP | 2005-109504 A | 4/2005 |
| JP | 2006-294861 A | 10/2006 |
| JP | 2007-194468 A | 8/2007 |
| JP | 2007-214538 A | 8/2007 |
| JP | 2007-281298 A | 10/2007 |
| JP | 2007-311796 | * 11/2007 |

* cited by examiner

DIAMOND STRUCTURE (Si)

○ : Si

FLUORITE STRUCTURE ($NiSi_2$)

● : Ni
○ : Si

FIG. 30A
STRUCTURE OF Ni IN NiSi$_2$
(FLUORITE STRUCTURE)
FIG. 30B
STRUCTURE OF Si IN NiSi$_2$
(FLUORITE STRUCTURE)
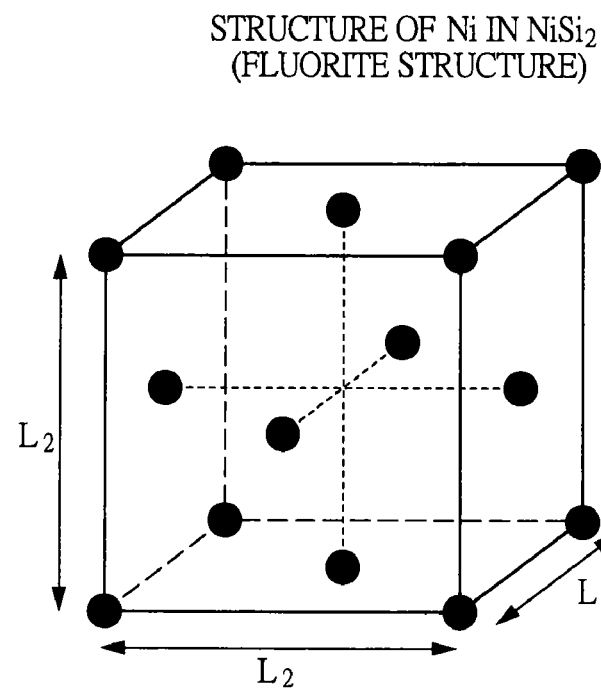
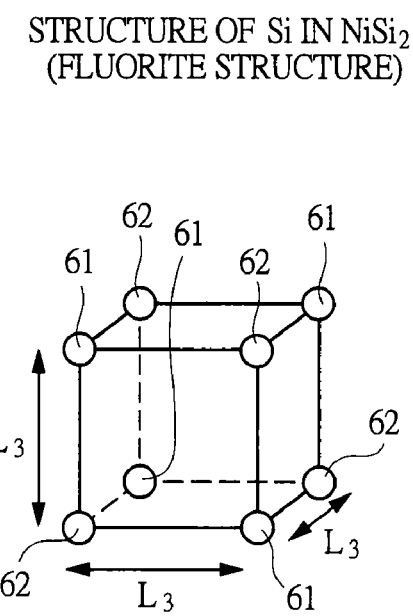

US 7,955,925 B2

METHOD OF MANUFACTURING SEMICONDUCTOR DEVICE

CROSS-REFERENCE TO RELATED APPLICATION

The present application claims priority from Japanese Patent Application No. JP 2007-175501 filed on Jul. 3, 2007, Japanese Patent Application No. JP 2007-182031 filed on Jul. 11, 2007, and Japanese Patent Application No. JP 2008-106606 filed on Apr. 16, 2008, the contents of which are hereby incorporated by reference into this application.

TECHNICAL FIELD OF THE INVENTION

The present invention relates to a method of manufacturing a semiconductor device. More particularly, it relates to a technology effectively applied to manufacture of a semiconductor element comprising a metal silicide layer.

BACKGROUND OF THE INVENTION

As the high integration of semiconductor devices has been progressed, a field effect transistor (MISFET: Metal Insulator Semiconductor Field Effect Transistor) has been miniaturized according to the scaling law. However, a problem rises that the resistances of the gate and source/drain are increased, and high-speed operations cannot be provided even if the field effect transistor is miniaturized. Accordingly, studies have been made on a salicide technology by which a low resistant metal silicide layer, for example, a nickel silicide layer or cobalt silicide layer is formed by self-alignment on a surface of a conductive film forming a gate and a surface of a semiconductor region forming a source/drain, thereby lowering the resistances of the gate and source/drain.

In Japanese Patent Application Laid-Open Publication No. 2005-109504 (Patent Document 1), there is described a technology about a method of manufacturing a semiconductor element including: a stage of forming a metal layer on a gate electrode and a source/drain region; a stage of treating a surface of the metal layer by use of Ar plasma; and a stage of annealing a silicon substrate on which the metal layer is formed at a predetermined temperature to form a thin silicide film.

In Japanese Patent Application Laid-Open Publication No. 2006-294861 (Patent Document 2), there is described a technology about a method of depositing a metal-contained film on a surface of Si-contained portion, the method comprises: a physical surface treatment step of physically processing the surface of the Si-contained portion by means of plasma using a high frequency; a chemical surface treatment step of chemically processing the surface of the plasma-treated Si-contained portion by reactive gas; and a film forming step of forming a metal-contained film on the Si-contained portion after the chemical surface treatment.

In Japanese Patent Application Laid-Open Publication No. 2003-119564 (Patent Document 3), there is described a technology where, after a natural oxide film on a surface of a Si substrate is removed in a chamber of a plasma CVD apparatus, a film containing a high-melting-point metal is deposited on the Si substrate from which the natural oxide film has been removed in series without exposing the Si substrate from which the natural oxide film has been removed to air in the same chamber in which etching and deposition are optimized.

In Japanese Patent Application Laid-Open Publication No. H07-38104 (Patent Document 4), there is described a technology where a Ni film and a metal compound film are deposited sequentially on the entire surface of an Si substrate on which a diffusion layer to become a source/drain is formed, and a nickel silicide is then formed on the surface of the diffusion layer to become the source/drain by reacting Ni and Si by heat treatment, and the unreacted Ni and the metal compound film are removed, thereby stably depositing the nickel silicide film without forming insulating matter in the nickel silicide.

SUMMARY OF THE INVENTION

According to a study by the inventors of the present invention, the following has been found.

It is preferable that the metal silicide layer to be formed by the salicide process on the surface of the conductive film forming a gate and the semiconductor region forming a source/drain is made of nickel silicide rather than cobalt silicide according to requirements of low resistance due to scaling. By making the metal silicide layer of nickel silicide instead of cobalt silicide, it is possible to make the resistance of the metal silicide layer lower, and to decrease the diffusion resistance, the contact resistance and the like of the source/drain. Further, by making the metal silicide layer of nickel silicide instead of cobalt silicide, it is possible to form the metal silicide layer thinner, and to make the junction depth of the source/drain shallower, thereby obtaining advantages for scaling field effect transistors.

In the case where the metal silicide layer formed by the salicide process is cobalt silicide, since a $CoSi_2$ phase has a lower resistance than a CoSi phase, it is necessary to form a metal silicide made of $CoSi_2$ on the surface of the conductive film forming a gate and the semiconductor region forming a source/drain. In contrast, in the case where the metal silicide layer formed by the salicide process is nickel silicide, since a NiSi phase has a lower resistance than a $NiSi_2$ phase, it is necessary to form a metal silicide made of NiSi on the surface of the conductive film forming a gate and the semiconductor region forming a source/drain.

In the case of the cobalt silicide formation, Si (silicon) is a diffusion species, and cobalt silicide is formed by Si moving into a Co film. Meanwhile, in the case of the nickel silicide formation, Ni (nickel) is a diffusion species, and nickel silicide is formed by Ni (nickel) moving into the silicon region side.

Therefore, according to the study made by the inventors, it has been found that, Ni (nickel) diffuses in excess and an unnecessary $NiSi_2$ portion is formed in the heat treatment, and the electrical resistance of the metal silicide layer may vary in every field effect transistor. For a further performance enhancement of a field effect transistor, it is desired to reduce the variation of the electrical resistance of the metal silicide layer in every field effect transistor, and to prevent the fluctuations in characteristics of a field effect transistor.

Further, according to the study by the inventors, it has been found that abnormal growth of $NiSi_2$ from NiSi layer to a channel part may occur in the heat treatment. In the case where abnormal growth of $NiSi_2$ occurs from NiSi layer to the channel part, leakage current between the source/drain of the field effect transistor increases, and the diffusion resistance of the source/drain region increases. Therefore, for a further performance enhancement of a field effect transistor, it is desired to prevent the abnormal growth of $NiSi_2$ from NiSi layer to the channel part.

Moreover, a p-channel type field effect transistor and an n-channel type field effect transistor as active elements configuring an integrated circuit are usually formed on a main surface of the semiconductor substrate. The inventors have studied about forming a nickel silicide layer on each surface of the source/drain of the p-channel type field effect transistor and the source/drain of the n-channel type field effect transistor to enhance the resistance of the source/drain of the field effect transistors.

As a result, as to the source/drain of the p-channel type field effect transistor, it has become clear that the increase and variation of a junction leakage current are apt to occur by forming the nickel silicide layer. While it is effective for reducing the abovesaid junction leakage current to make a thickness of the Ni film to be deposited on the Si substrate thin, the thickness of the nickel silicide layer that is formed by the salicide technology becomes thin when the thickness of the Ni film is made thin, and thus the effect of lowering resistance cannot be attained. The nickel silicide layer is also formed on the surface of the gate electrode of the field effect transistor, and a resistance of the gate electrode is also decreased. The gate electrode of the field effect transistor is often used as wiring in an integrated circuit, and when a wiring is not formed by the gate electrode having a low resistance, problems such as delays of circuit operations and the like occur.

An object of the present invention is to provide a technology capable of improving performance of a semiconductor device.

In addition, another object of the present invention is to provide a technology capable of improving reliability of a semiconductor device including a field effect transistor in which a metal silicide layer is formed on a surface of a source/drain.

The above and other objects and novel characteristics of the present invention will be apparent from the description of this specification and the accompanying drawings.

The typical ones of the inventions disclosed in this application will be briefly described as follows.

A method of manufacturing a semiconductor device according to a representative embodiment comprises the steps of: forming a semiconductor region on a semiconductor substrate and then cleaning a surface of the semiconductor region of a main surface of the semiconductor substrate by dry cleaning; forming a metal film on the semiconductor substrate; performing a first heat treatment to react the metal film and the semiconductor region, thereby forming a metal silicide layer comprising monosilicide MSi of a metallic element M forming the metal film, and then removing the unreacted metal film; and performing a second heat treatment thereafter. And, a heat treatment temperature of the second heat treatment is made higher than a heat treatment temperature of the first heat treatment, and is made lower than a first temperature at which a lattice size of a disilicide $MSi_2$ of the metal element M and a lattice size of the semiconductor substrate become same.

Further, in a method of manufacturing a semiconductor device according to another representative embodiment, a metal film and a first barrier film are deposited sequentially on a semiconductor substrate on which a gate insulating film, a gate electrode, and a semiconductor region for a source/drain of an n-channel type field effect transistor, and a gate insulating film, a gate electrode, and a semiconductor region for a source/drain of a p-channel type field effect transistor are formed. After that, a first heat treatment is performed in a temperature range where a reaction rate of the metal film at the moment when the semiconductor region of the p-channel type field effect transistor and the metal film are reacted becomes lower than that of the metal film when the semiconductor region of the n-channel type field effect transistor and the metal film are reacted, and a metal silicide layer is formed on a surface of the gate electrode or the semiconductor region of the n-channel type field effect transistor and on a surface of the gate electrode or the semiconductor region of the p-channel type field effect transistor. Thereafter, the first barrier film and the unreacted metal element forming the metal film are removed leaving the metal silicide layer on the surface of the gate electrode or the semiconductor region of the n-channel type field effect transistor and on the surface of the gate electrode or the semiconductor region of the p-channel type field effect transistor, and a second heat treatment whose heat treatment temperature is higher than that of the first heat treatment is performed.

The effects obtained by typical aspects of the present invention will be briefly described below.

According to the representative embodiments, it is possible to improve performance of a semiconductor device.

Further, it is possible to improve reliability of a semiconductor device having a field effect transistor on which a metal silicide layer is formed on a surface of a source/drain.

BRIEF DESCRIPTIONS OF THE DRAWINGS

FIG. 30A is an illustrative diagram showing a crystal structure of Ni in the fluorite structure of $NiSi_2$;

FIG. 30B is an illustrative diagram showing a crystal structure of Si in the fluorite structure of $NiSi_2$;

DESCRIPTIONS OF THE PREFERRED EMBODIMENTS

Figure 1:
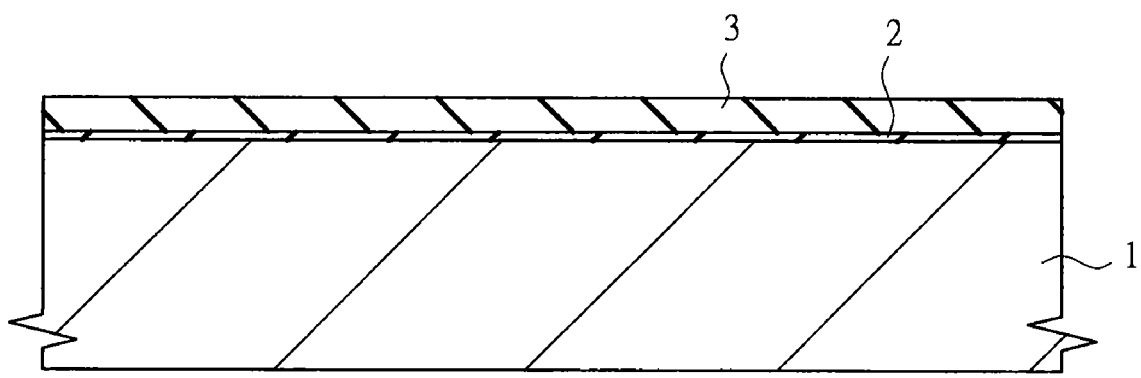
FIG. 1 is a cross-sectional view of main parts of a semiconductor device in a manufacturing step according to an embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that, components having the same function are denoted by the same reference symbols throughout the drawings for describing the embodiment, and the repetitive description thereof will be omitted.

Also, in some drawings used in the embodiments, hatching is used even in a plan view so as to make the drawings easy to see.

And, as to the dry cleaning technology, it is disclosed in Japanese Patent Application No. 2006-3704 (filed on Jan. 11, 2006) and Japanese Patent Application No. 2006-12355 (filed on Jan. 20, 2006) of Ichinose et al., Japanese Patent Application No. 2006-107780 (filed on Apr. 10, 2006) of Futase et al., and Japanese Patent Application No. 2007-81147 (filed on Mar. 27, 2007) of Futase et al. Further, about the silicide technology, effects and the like of a barrier film formed on a silicide material film, functioning as a stress control film (a film controlling stress of the active regions of the semiconductor substrate) and a film preventing transmission of oxygen, are disclosed in Japanese Patent Application No. 2007-81147 (filed on Mar. 27, 2007) of Futase et al.

First Embodiment

Manufacturing steps of a semiconductor device according to a present embodiment will be described with reference to the drawings. FIG. 1 to FIG. 8 are cross-sectional views of main parts showing the manufacturing steps of the semiconductor device according to an embodiment of the present invention, for example, a semiconductor device having a CMISFET (Complementary Metal Insulator Semiconductor Field Effect Transistor).

Figure 2:
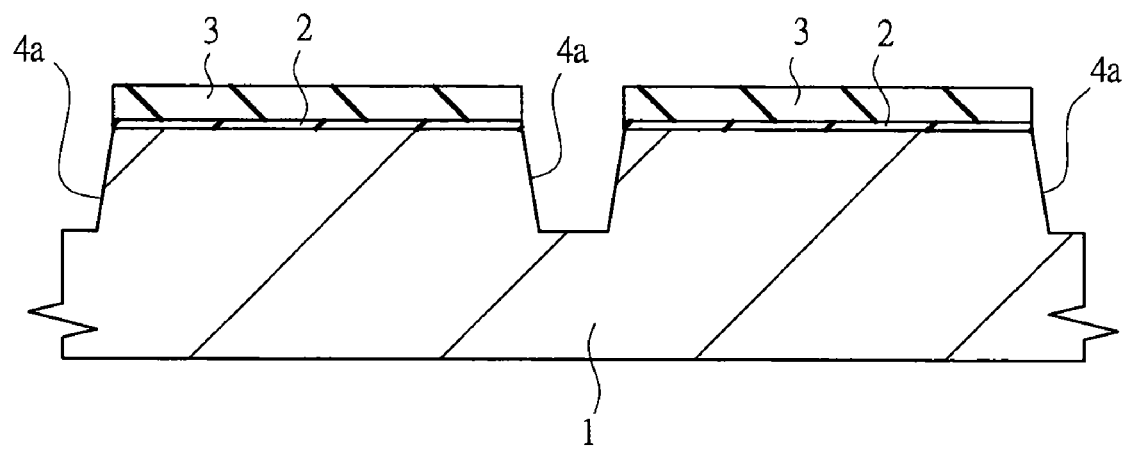
FIG. 2 is a cross-sectional view of main parts of the semiconductor device in a manufacturing step continued from FIG. 1.

First, as shown in FIG. 1, a semiconductor substrate (semiconductor wafer) 1 made of p-type single crystal silicon and the like having a resistivity of, for example, about 1 to 10Ωcm is provided. Next, the semiconductor substrate 1 is subjected to heat oxidation and an insulating film 2 having a thickness of, for example, about 11 nm is formed on the surface of the semiconductor substrate 1, and on an upper layer thereof, an insulating film 3 having a thickness of, for example, about 90 nm is deposited by a CVD (Chemical Vapor Deposition) method and the like. The insulating film 2 is made of silicon oxide and the like, and the insulating film 3 is made of a silicon nitride film and the like. Then, as shown in FIG. 2, with taking a photo resist pattern (not shown) as an etching mask, the insulating film 3, the insulating film 2 and the semiconductor substrate 1 are dry etched sequentially, and thereby forming a trench (trench for device isolation) 4a having a depth of, for example, about 300 nm is formed on a device-isolation-formation planned region of the semiconductor substrate 1. The trench 4a is a trench for device isolation, and in other words, it is a trench for forming a device isolation region 4 to be described below.

Figure 3:
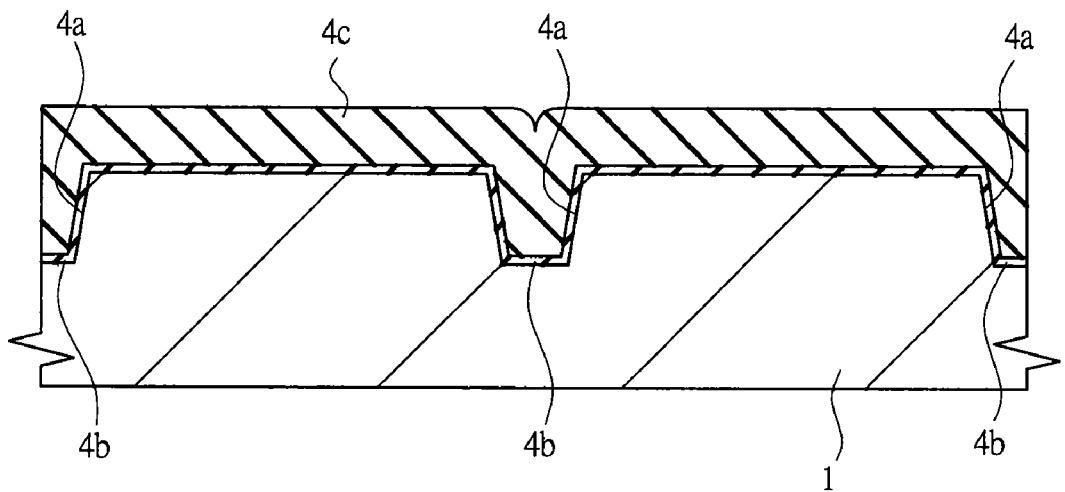
FIG. 3 is a cross-sectional view of main parts of the semiconductor device in a manufacturing step continued from FIG. 2.

Next, as shown in FIG. 3, the insulating film 3 is removed by wet etching using hot phosphoric acid and the like, and then an insulating film 4b having a thickness of, for example, about 10 nm is formed on a main surface of the semiconductor substrate 1 including the inside (sidewalls and bottom portion) of the trench 4a. Then, an insulating film 4c is formed (deposited) by a CVD method and the like on the main surface of the semiconductor substrate 1 (that is, on the insulating film 4b) so as to fill the inside of the trench 4a.

The insulating film 4b is formed of a silicon oxide film or a silicon oxynitride film. When the insulating film 4b is formed of a silicon oxynitride film, it is possible to prevent a volume expansion of the sidewalls of the trench 4a oxidized by a heat treatment after the step of forming the insulating film 4b, thereby obtaining an effect of reducing compression stress to work on the semiconductor substrate 1.

The insulating film 4c is a silicon oxide film or an $O_3$-TEOS oxide film and the like formed by a HDP-CVD (High Density Plasma CVD) method. Note that, the $O_3$-TEOS oxide film is a silicon oxide film formed by a heat CVD method by use of $O_3$ (ozone) and TEOS (Tetraethoxysilane: also referred to as Tetra Ethyl Ortho Silicate) as material gas (source gas). When the insulating film 4c is a silicon oxide film formed by the HDP-CVD method, the insulating film 4b has an effect of preventing damage to the semiconductor substrate 1 in depositing the insulating film 4c.

Figure 4:
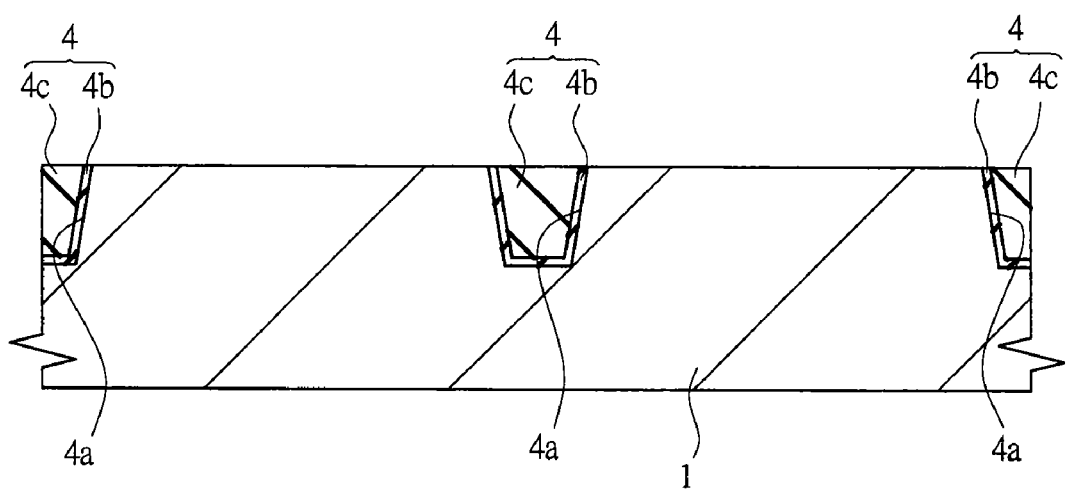
FIG. 4 is a cross-sectional view of main parts of the semiconductor device in a manufacturing step continued from FIG. 3.

Next, as shown in FIG. 4, the insulating film 4c is polished by CMP (Chemical Mechanical Polishing) method, and the insulating film 4c outside the trench 4a is removed, and the insulating films 4b, 4c are left in the inside of the trench 4a, thereby forming a device isolation region (device isolation) 4.

Then, the semiconductor substrate 1 is subjected to a heat treatment at, for example, about 1150° C., and the insulating film 4c buried in the trench 4a is annealed. In the state before annealing, the silicon oxide film formed by the HDP-CVD method is denser than the $O_3$-TEOS oxide film. Therefore, in the case where the insulating film 4c is an $O_3$-TEOS oxide film, there is an effect of reducing compression stress to work on the semiconductor substrate 1 due to shrinkage of the insulating film 4c by the annealing. On the other hand, when the insulating film 4c is a silicon oxide film formed by the HDP-CVD method, since the shrinkage of the insulating film 4c at the moment of annealing is smaller than when the insulating film 4c is $O_3$-TEOS oxide film, the compression stress to work on the semiconductor substrate 1 becomes large due to the device isolation region 4.

In this manner, the device isolation region 4 comprising the insulating film 4b, 4c buried in the trench 4a is formed. In the present embodiment, the device isolation region 4 is preferably formed by the STI (Shallow Trench Isolation) method, instead of LOCOS (Local Oxidization of Silicon) method. In other words, the device isolation region 4 of the present embodiment is preferably made of an insulator (insulating films 4b, 4c herein) buried in the trench 4a for device isolation formed in the semiconductor substrate 1. An n-channel MISFET Qn (that is, a gate insulating film 7, a gate electrode 8a, and $n^-$ type semiconductor region 9a and $n^+$ type semiconductor region 9b for source/drain configuring the n-channel MISFET Qn) described later is formed in the active region defined (surrounded) by the device isolation region 4. Further, a p-channel MISFET Qp (that is, a gate insulating film 7, a gate electrode 8b, and $p^-$ type semiconductor region lOa and $p^+$ type semiconductor region lob for source/drain configuring the p-channel MISFET Qn) described later is also formed in the active region defined (surrounded) by the device isolation region 4.

Figure 5:
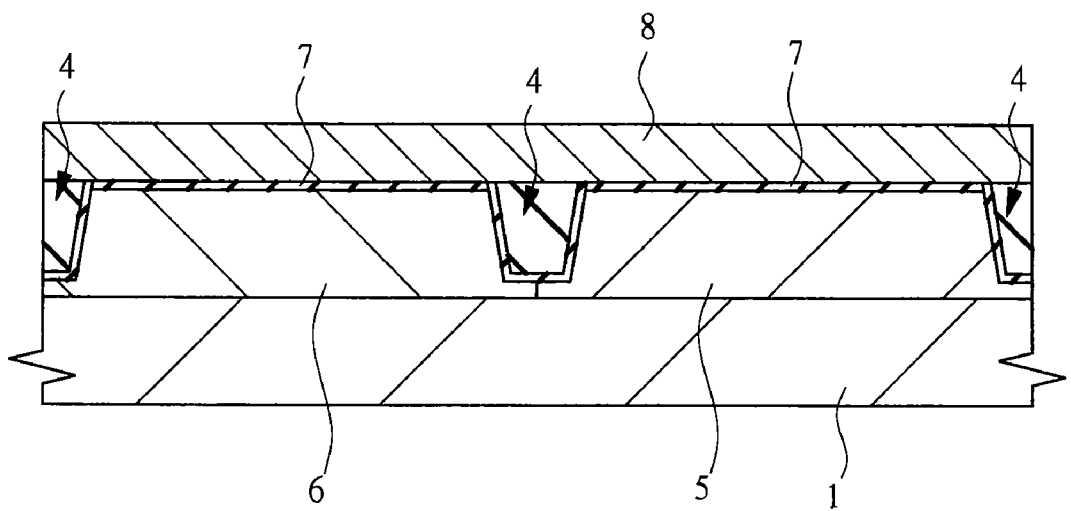
FIG. 5 is a cross-sectional view of main parts of the semiconductor device in a manufacturing step continued from FIG. 4.

Next, as shown in FIG. 5, a p-type well 5 and an n-type well 6 are formed in a predetermined depth from the main surface of the semiconductor substrate 1. The p-type well 5 may be formed by ion implantation of a p-type impurity of, for example, boron (B) into the semiconductor substrate 1 of the n-channel type MISFET formation planed region, with using a photo resist film (not shown) that covers the p-channel type MISFET formation planed region as an ion implantation blocking mask. Further, the n-type well 6 may be formed by ion implantation of an n-type impurity of, for example, phosphor (P) or arsenic (As) into the semiconductor substrate 1 of the p-channel type MISFET formation planed region, with using another photo resist film (not shown) that covers the n-channel type MISFET formation planed region as an ion implantation blocking mask.

Next, after the surface of the semiconductor substrate 1 is cleaned (washed) by wet etching using, for example, hydrofluoric acid (HF) solution, a gate insulating film 7 is formed on the surface of the semiconductor substrate 1 (that is, the surfaces of the p-type well 5 and the n-type well 6). The gate insulating film 7 is made of, for example, a thin silicon oxide film, and may be formed by, for example, the heat oxidation method.

Next, on the semiconductor substrate 1 (i.e., on the gate insulating film 7 of the p-type well 5 and the n-type well 6), as a conductive film for the gate electrode formation, a silicon film 8 such as a polycrystalline silicon film is formed as a conductive film for forming a gate electrode. The n-channel type MISFET formation planed region (region to become a gate electrode 8a to be mentioned later) of the silicon film 8 is made into a low resistant n-type semiconductor film (doped polysilicon film), by ion implantation of n-type impurities of phosphor (P) or arsenic (As) and the like with using a photo resist film (not shown) as a mask. Further, the p-channel type MISFET formation planed region (region to become a gate electrode 8b described later) of the silicon film 8 is made into a low resistant p-type semiconductor film (doped polysilicon film) by ion implantation of a p-type impurity of boron (B) and the like with using another photo resist film (not shown) as a mask. Further, the conductive film 8 may be replaced by a polycrystalline silicon film formed by subjecting an amorphous silicon film as deposited to a heat treatment after deposition (after ion implantation).

Figure 6:
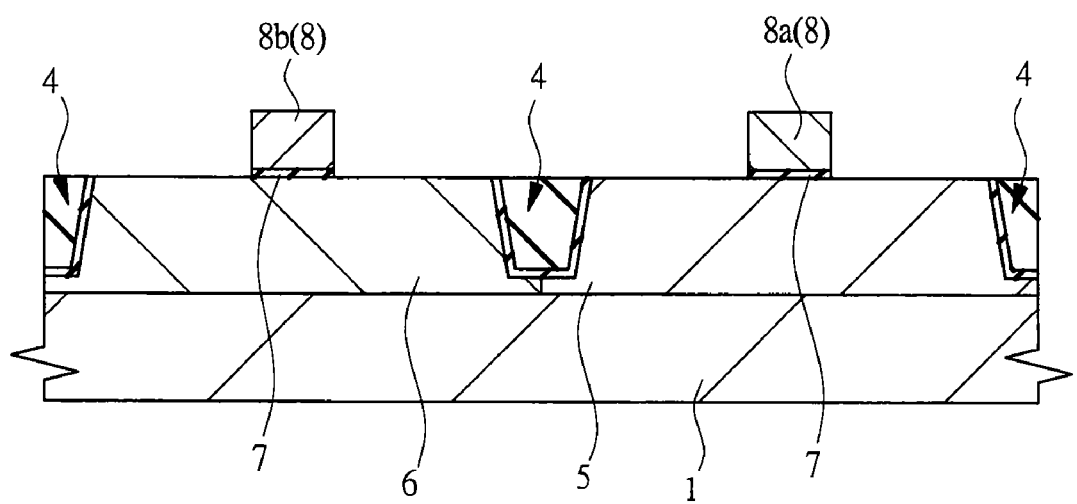
FIG. 6 is a cross-sectional view of main parts of the semiconductor device in a manufacturing step continued from FIG. 5.

Next, as shown in FIG. 6, the silicon film 8 is patterned by photo lithography method and dry etching method, thereby forming gate electrodes 8a, 8b.

The gate electrode 8a to become the gate electrode of the n-channel type MISFET is formed of polycrystalline silicon to which n-type impurities are introduced (n-type semiconductor film, a doped polysilicon film), and is formed on the p-type well 5 interposing the gate insulating film 7. In other words, the gate electrode 8a is formed on the gate insulating film 7 of the p-type well 5. Further, the gate electrode 8b to become the gate electrode of the p-channel type MISFET is formed of polycrystalline silicon to which p-type impurities are introduced (p-type semiconductor film, a doped silicon film), and is formed on the n-type well 6 interposing the gate insulating film 7. In other words, the gate electrode 8b is formed on the gate insulating film 7 of the n-type well 6. The gate lengths of the gate electrodes 8a, 8b may be changed if necessary, and it may be, for example, about 50 nm.

Figure 7:
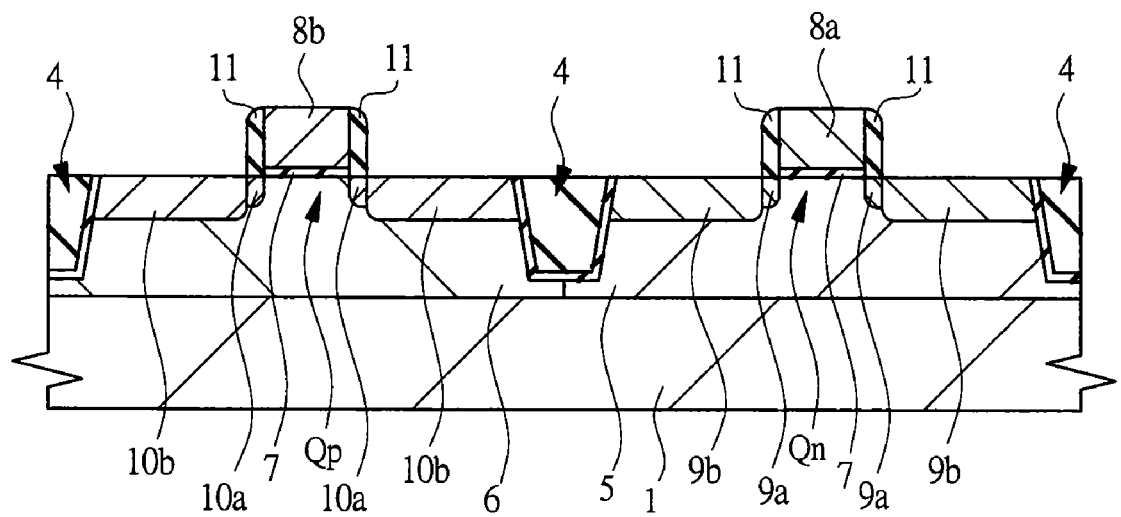
FIG. 7 is a cross-sectional view of main parts of the semiconductor device in a manufacturing step continued from FIG. 6.

Next, as shown in FIG. 7, by ion implantation of n-type impurities of phosphor (P) or arsenic (As) or the like into the regions of both the sides of the gate electrode 8a of the p-type well 5, (a pair of) $n^-$ type semiconductor regions 9a are formed, and by ion implantation of p-type impurities of boron (B) or the like into the region of both the sides of the gate electrode 8b of the n-type well 6, (a pair of) $p^-$ type semiconductor regions loa are formed. The depth (junction depth) of the $n^-$ type semiconductor regions 9a and the p-type semiconductor regions 10a may be, for example, about 30 nm.

Next, on sidewalls of the gate electrodes 8a, 8b, sidewall spacers or sidewalls (sidewall insulating films) 11 formed of, for example, silicon oxide or silicon nitride, or a stacked film of these insulating films are formed as insulating films. The sidewalls 11 may be formed by, for example, depositing a silicon oxide film or a silicon nitride film or stacking these films on the semiconductor substrate 1, and anisotropically etching the silicon oxide film or the silicon nitride film or the stacked film thereof by RIE (Reactive Ion Etching) method and the like.

After the formation of the sidewalls 11, (a pair of) $n^+$ type semiconductor regions 9b (source, drain) are formed by, for example, ion implantation of n-type impurities of phosphor (P) or arsenic (As) or the like into the regions of both the sides of the gate electrode 8a of the p-type well 5 and the sidewalls 11. For example, $n^+$ type semiconductor regions 9b are formed by implanting phosphor (P) up to about $5 \times 10^5/cm^2$ or arsenic up to about $4 \times 10^{15}/cm^2$. Further, (a pair of) $p^+$ type semiconductor regions 10b (source, drain) are formed by, for example, ion implantation of p-type impurities of boron (B) or the like into the regions of both the sides of the gate electrode 8b of the n-type well 6 and the sidewalls 11. The $n^+$ type semiconductor regions 9b may be formed first, or the $p^+$ type semiconductor regions 10b may be formed first. After the ion implantation, annealing treatment may be performed for activating the introduced impurities by means of, for example, spike annealing at about 1050° C. The depth (junction depth) of the $n^+$ type semiconductor regions 9b and the $p^+$ type semiconductor regions 10b can be, for example, about 80 nm.

The $n^+$ type semiconductor regions 9b have a higher impurity density than that of the $n^-$ type semiconductor regions 9a, and the $p^+$ type semiconductor regions 10b have a higher impurity density than that of the $p^-$ type semiconductor regions 10a. In this manner, an n-type semiconductor region (impurity diffusion layer) to function as a source or a drain of the n-channel type MISFET is formed by the $n^+$ type semiconductor region (impurity diffusion layer) 9b and $n^-$ type semiconductor region 9a, and a p-type semiconductor region (impurity diffusion layer) to function as a source or a drain of the p-channel type MISFET is formed by the $p^+$ type semiconductor region (impurity diffusion layer) 10b and the $p^-$ type semiconductor region 10a. Therefore, the source/drain regions of the n-channel type MISFET and the p-channel type MISFET have an LDD (Lightly Doped Drain) structure. The $n^-$ type semiconductor regions 9a are formed in a self-aligned manner to the gate electrode 8a, and the $n^+$ type semiconductor regions 9b are formed in a self-aligned manner to the sidewalls 11 formed on the sidewalls of the gate electrode 8a. The $p^-$ type semiconductor regions 10a are formed in a self-aligned manner to the gate electrode 8b, and the $p^+$ type semiconductor regions 10b are formed in a self-aligned manner to the sidewalls 11 formed on the sidewalls of the gate electrode 8b.

In this manner, to the p-type well 5, as a field effect transistor, an n-channel type MISFET (Metal Insulator Semiconductor Field Effect Transistor) Qn is formed. Further, to the n-type well 6, as a field effect transistor, a p-channel type MISFET (Metal Insulator Semiconductor Field Effect Transistor) Qp is formed. Therefore, the structure shown in FIG. 7 is obtained. The n-channel type MISFET Qn may be considered as an n-channel field effect transistor, and the p-channel type MISFET Qp may be considered as a p-channel field effect transistor. Furthermore, the $n^+$ type semiconductor region 9b may be considered as a semiconductor region for the source or the drain of the n-channel type MISFET Qn, and the $p^+$ type semiconductor region 10b may be considered as a semiconductor region for the source or the drain of the p-channel type MISFET QP.

Next, by the Salicide (Salicide: Self Aligned Silicide) technology, on the surface of the gate electrode 8a of the n-channel type MISFET Qn and the source/drain regions (here, the $n^+$ type semiconductor regions 9b), and on the surface of the gate electrode 8b of the p-channel type MISFET Qp and the source/drain regions (here, the $p^+$ type semiconductor regions lob), a low-resistant metal silicide layer (corresponding to a metal silicide layer 41 to be mentioned later) is formed. Hereinafter, a formation process of this metal silicide layer will be described.

Figure 8:
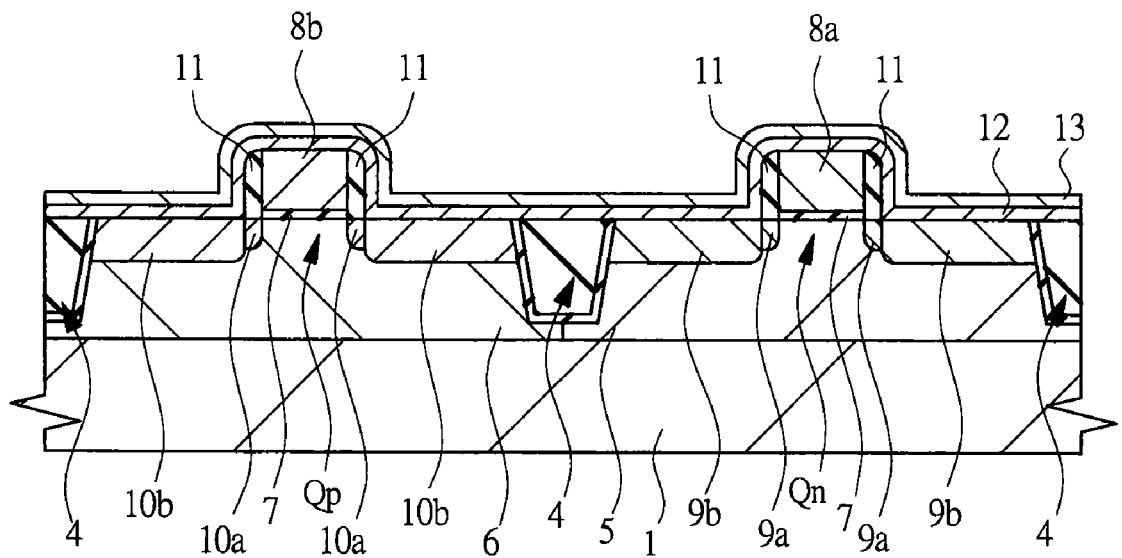
FIG. 8 is a cross-sectional view of main parts of the semiconductor device in a manufacturing step continued from FIG. 7.
Figure 9:
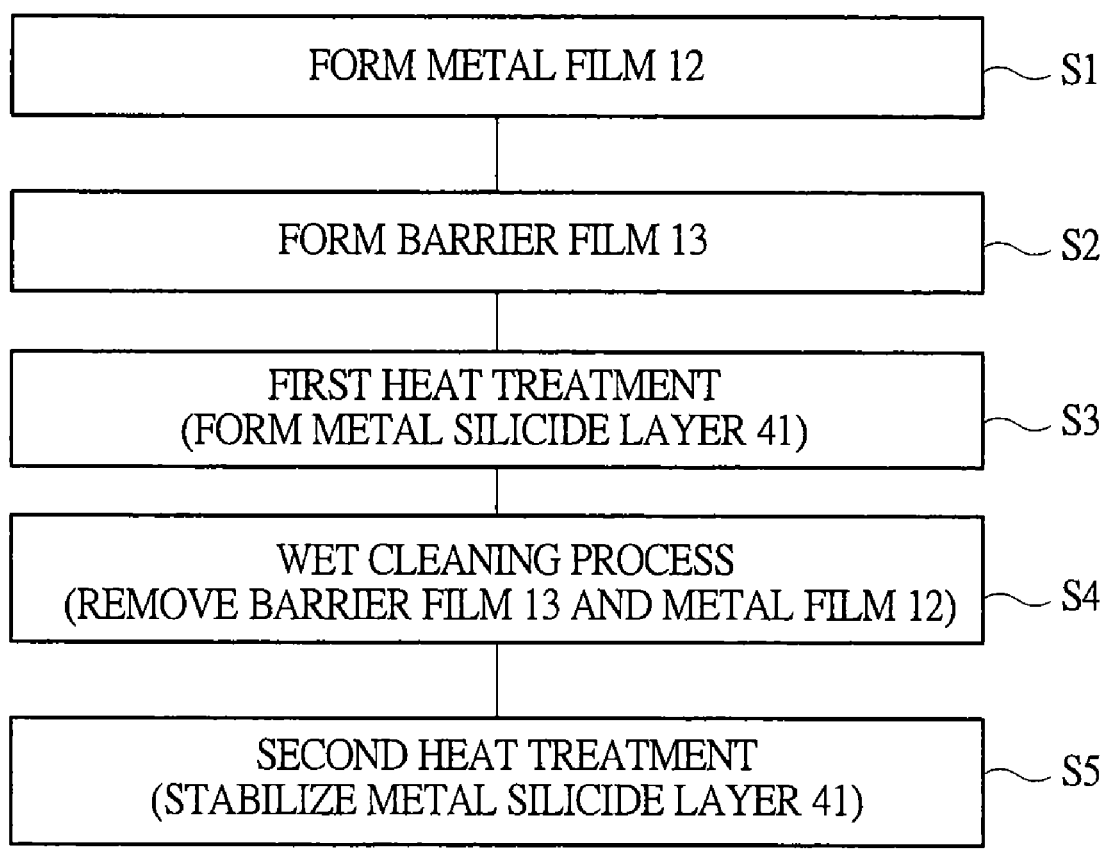
FIG. 9 is a manufacturing process flow chart showing a part of manufacturing steps of the semiconductor device according to the embodiment of the present invention.
Figure 10:
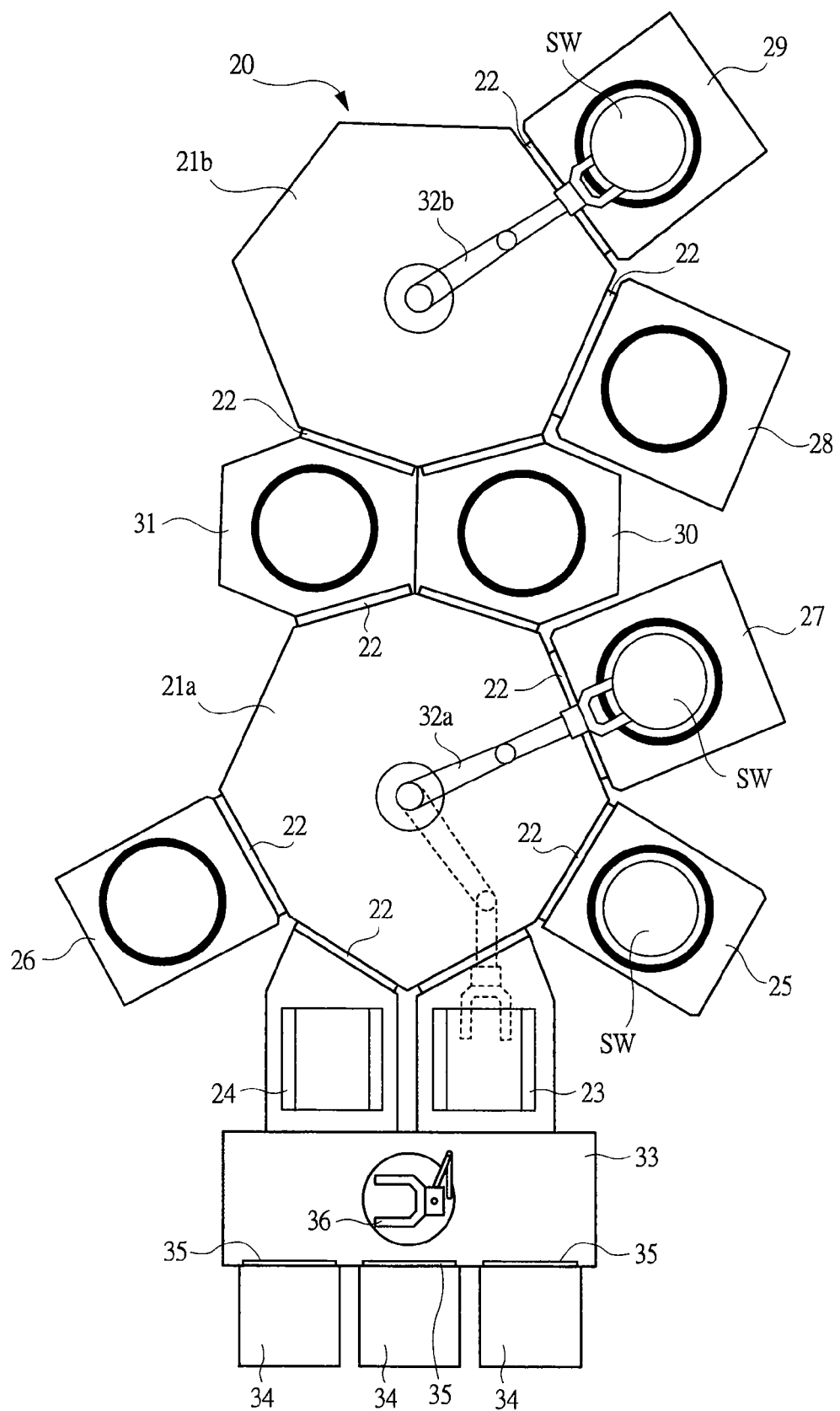
FIG. 10 is a schematic plan view of a film-deposition apparatus of a silicide material according to an embodiment of the present invention.
Figure 11:
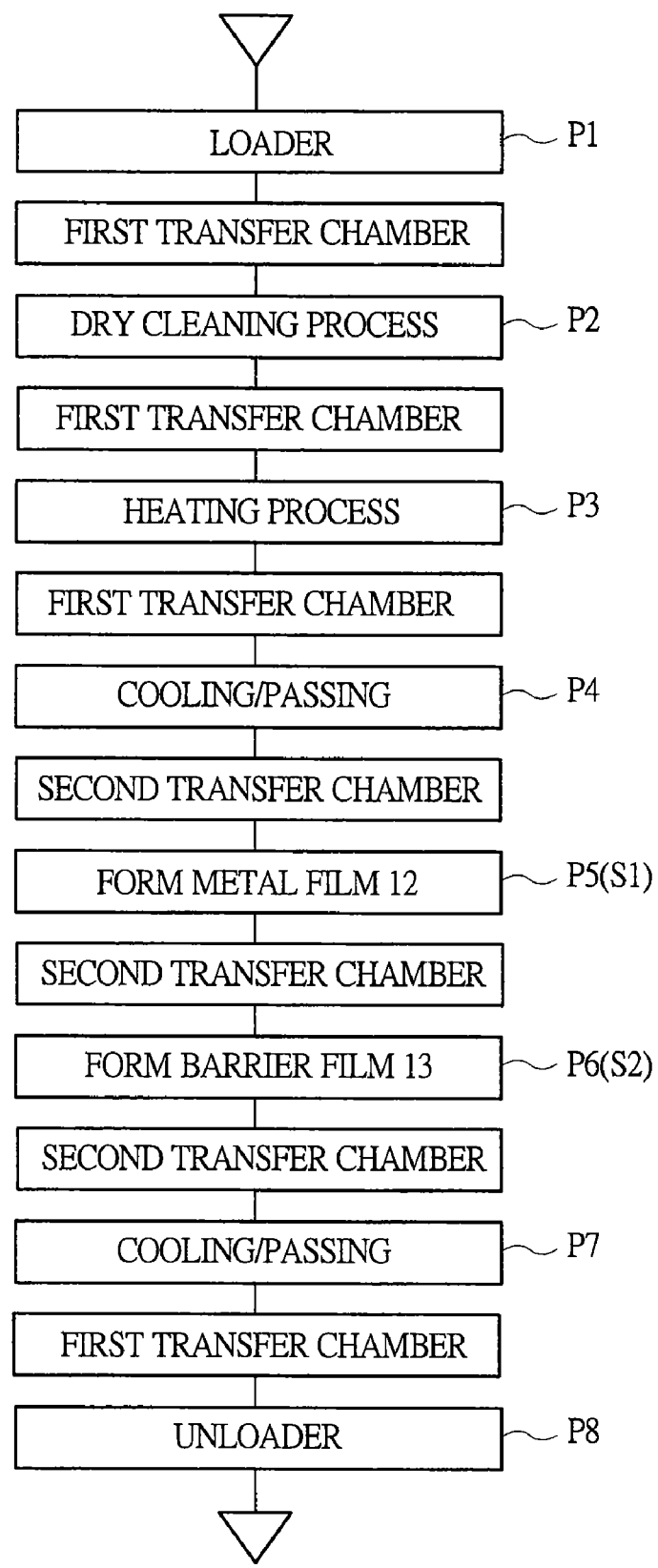
FIG. 11 is a film-deposition process chart showing the silicide material according to the embodiment of the present invention.
Figure 12:
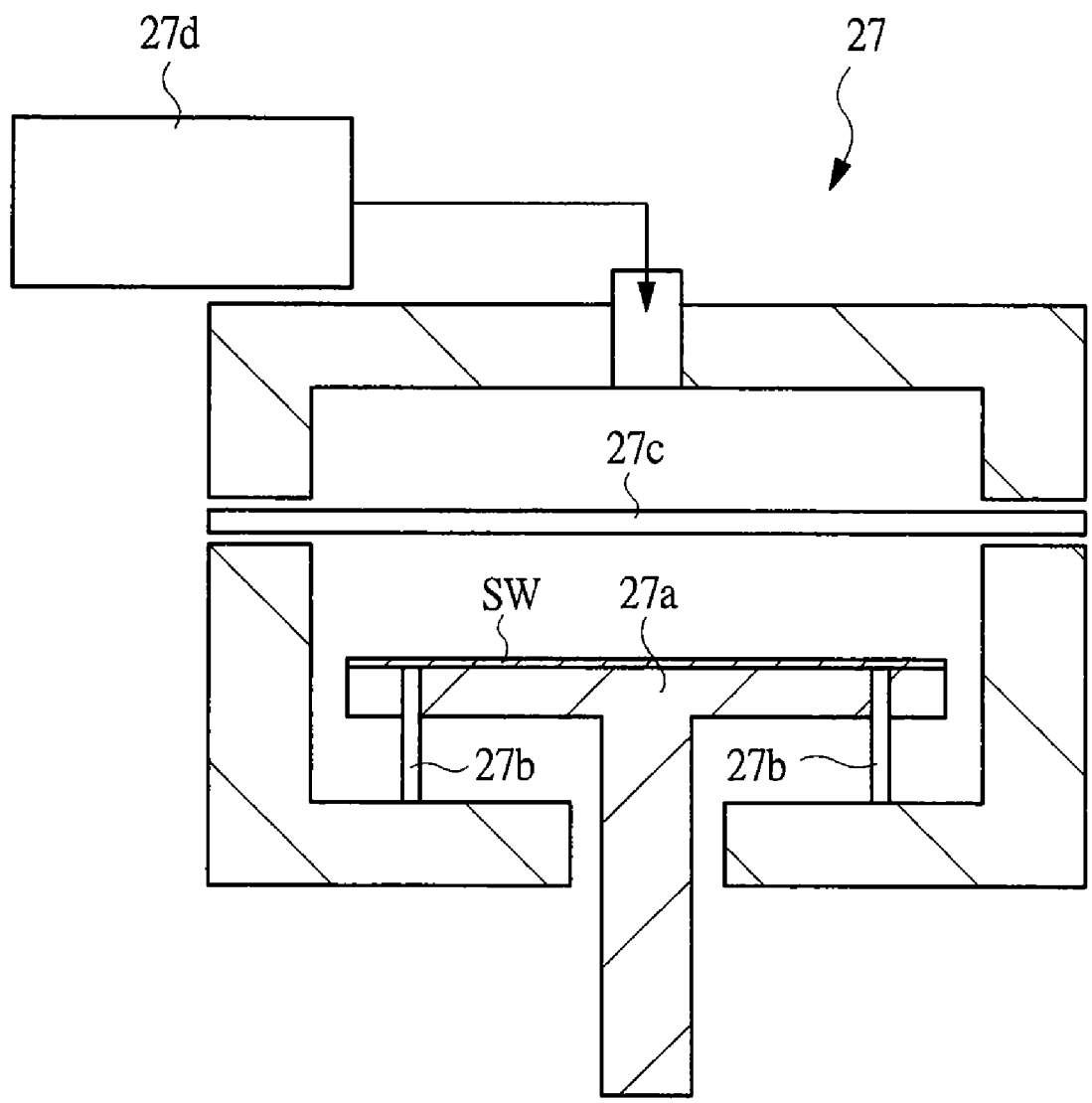
FIG. 12 is a schematic cross-sectional view of a dry cleaning processing chamber comprised in the film-deposition apparatus of the silicide material according to the embodiment of the present invention.

FIG. 8 is a cross-sectional view of main parts of the semiconductor device in a manufacturing step continued from FIG. 7. FIG. 9 is a manufacturing process flow showing a part of the manufacturing process of the semiconductor device according to the present embodiment, and showing a manufacturing process flow of the steps to form a metal silicide layer (metal/semiconductor reaction layer) on the surface of the gate electrodes 8a, 8b, the $n^+$ type semiconductor regions 9b and the $p^+$ type semiconductor regions 10b by the Salicide (Salicide: Self Aligned Silicide) process after the structure in FIG. 7 is obtained. FIG. 10 is a schematic plan view of a film-deposition apparatus of a silicide material (material film for forming the metal silicide layer 41, herein, corresponding to the metal film 12 and the barrier film 13). FIG. 11 is a film-deposition process chart (process flow chart) of a silicide material. FIG. 12 is a schematic cross-sectional view of a dry cleaning processing chamber equipped in the film-deposition apparatus of a silicide material. FIG. 13 is a schematic cross-sectional view of a chamber describing the processing steps of a semiconductor wafer in a dry cleaning processing chamber equipped in the film-deposition apparatus of a silicide material. FIG. 14 to FIG. 17 are cross-sectional views of main parts of the semiconductor device in the manufacturing steps continued from FIG. 8. Further, FIG. 9 corresponds to the manufacturing process flow of the steps of FIG. 8 and FIG. 14, and FIG. 11 corresponds to the manufacturing process flow of the process of FIG. 8.

After the structure of FIG. 7 is obtained in the manner described above, as shown in FIG. 8, the surfaces of the gate electrodes 8a, 8b, the $n^+$ type semiconductor regions 9b, and the $p^+$ type semiconductor regions 10b are exposed, and a metal film 12 is then formed (deposited) on the main surface (entire surface) of the semiconductor substrate 1 including on the gate electrodes 8a, 8b, the $n^+$ type semiconductor regions 9b, and the $p^+$ type semiconductor regions 10b by use of, for example, sputtering method (step S1 of FIG. 9). In other words, at the step S1, the metal film 12 is formed on the semiconductor substrate 1 including the $n^+$ type semiconductor regions 9b and the $p^+$ type semiconductor regions 10b so as to cover the gate electrodes 8a, 8b.

Then, a barrier film (first barrier film, stress control film, antioxidant film, cap film) 13 is formed (deposited) on the metal film 12 (step S2 of FIG. 9).

Further, it is more preferable to carry out a dry cleaning process (corresponding to step P2 to be mentioned later) by use of at least one of HF gas, $NF_3$ gas, $NH_3$ gas and $H_2$ gas before the step S1 (metal film 12 deposition process) before the step S1 (metal film 12 deposition step) so as to remove a natural oxide film of the surface of the gate electrodes 8a, 8b, the $n^+$ type semiconductor regions 9b, and the $p^+$ type semiconductor regions 10b, so that the step S1 and the step S2 are carried out without exposing the semiconductor substrate 1 to the atmosphere (oxygen containing atmosphere) thereafter.

The metal film 12 is formed of, for example, a nickel (Ni) film, and the thickness thereof (deposited film thickness) can be, for example, about 9 nm. Other than the Ni (nickel) film, for example, a nickel alloy film including a Ni—Pt alloy film (alloy film of Ni and Pt), a Ni—Pd alloy film (alloy film of Ni and Pd), a Ni—Yb alloy film (alloy film of Ni and Yb), or a Ni—Er alloy film (alloy film of Ni and Er) may be used as the metal film 12. The barrier film 13 is formed of, for example, a titanium nitride (TiN) film or a titanium (Ti) film, and the thickness thereof (deposited film thickness) can be, for example, about 15 nm. The barrier film 13 functions as a stress control film (film to control the stress of the active region of the semiconductor substrate) and as a film to prevent transmission of oxygen, and is arranged on the metal film 12 for controlling the stress working on the semiconductor substrate 1 on or prevention of oxidization of the metal film 12. In the following, a preferable example of a formation method of the metal film 12 and the barrier film 13 will be described.

To form the metal film 12 and the barrier film 13, the film-deposition apparatus 20 of a silicide material shown in FIG. 10 is used.

As shown in FIG. 10, the film-deposition apparatus 20 is a multi-chamber type in which two transfer chambers of a first transfer chamber 21a and a second transfer chamber 21b are arranged, and around the first transfer chamber 21a, load lock chambers 23, 24 and three chambers 25, 26, 27 are arranged through a gate valve 22 as opening/closing means, and around the second transfer chamber 21b, two chambers 28, 29 are arranged through a gate valve 22 as opening/closing means. Further, between the first transfer chamber 21a and the second transfer chamber 21b, two transfer chambers 30, 31 are arranged. The first transfer chamber 21a is maintained in a predetermined degree of vacuum by an exhaust mechanism, and a transfer robot 32a with many joint arm structures to transfer a semiconductor wafer SW is arranged in the central part thereof. In the same manner, the second transfer chamber 21b is maintained in a predetermined degree of vacuum by an exhaust mechanism, and a transfer robot 32b with many joint arm structures to transfer the semiconductor wafer SW is arranged in the central part thereof.

The chambers 25, 26 arranged in the first transfer chamber 21a are heat treatment chambers to perform a relatively high temperature heat treatment, and the chamber 27 is a dry cleaning processing (treatment) chamber. The chamber 28 arranged in the second transfer chamber 21b is a film formation chamber to form the metal film 12 (for example, a nickel film) by the sputtering method, and the chamber 29 is a film formation chamber to form the barrier film 13 (for example, a titanium nitride film) by the sputtering method. Further, when the barrier film 13 is formed by the plasma CVD method, the chamber 29 becomes a film formation chamber to form the barrier film 13 (for example, a titanium film) by the plasma CVD method.

The chambers 30, 31 arranged in between the first transfer chamber 21a and the second transfer chamber 21b are delivery/receipt chambers to deliver and receive the semiconductor wafer SW between the first transfer chamber 21a and the second transfer chamber 21b, and they are also cooling chambers used for cooling off the semiconductor wafer SW. Further, in the film-deposition apparatus 20, while the number of the chambers arranged in only the first transfer chamber 21a is three and the number of the chambers arranged in only the second transfer chamber 21b is two, the present invention is not limited to this, and chambers of the same application or chambers of other uses may be added.

First, one piece of the semiconductor wafer SW is taken out from any of hoops 34 by a transfer robot 36 installed in the wafer carry-in/out chamber 33 (process P1 in FIG. 11), and the semiconductor wafer SW is carried into either one of load lock chambers 23 and 24. The hoop 34 is a sealed storage container for batch transfer of the semiconductor wafer SW, and usually contains semiconductor wafers SW by batch in a unit of 25 pieces, 12 pieces, six pieces and the like. The container outside walls of the hoop 34 has an air-tight structure except a fine ventilation filter portion, so that dusts are almost completely removed. Therefore, the inside of the container can keep a cleanliness class of class 1 even if the wafer is transferred at an atmosphere of class 1000. The docking with the film-deposition apparatus 20 is made in a state where a door of the hoop 34 is attached to a port 35 and drawn into the inside of wafer carry-in/out chamber 33 so that cleanliness is maintained. Subsequently, the inside of the load lock chamber 23 is vacuumed, and then the semiconductor wafer SW is vacuum transferred from the first transfer chamber 21a to the dry cleaning processing chamber 27 by the transfer robot 32a (process P2 in FIG. 11). A schematic cross-sectional view of the chamber 27 is shown in FIG. 12. As shown in FIG. 12, the chamber 27 mainly comprises a wafer stage 27a, a wafer lift pin 27b, a shower head 27c and a remote plasma generator 27d. The wafer stage 27a and the wafer lift pin 27b have independent elevation systems, and can control the distance between the shower head 27c and the semiconductor wafer SW and the distance between the semiconductor wafer SW and the wafer stage 27a arbitrarily. Further, the shower head 27c installed above the wafer stage 27a is always maintained at a constant temperature, and the temperature is, for example, 180° C.

Figure 13A:
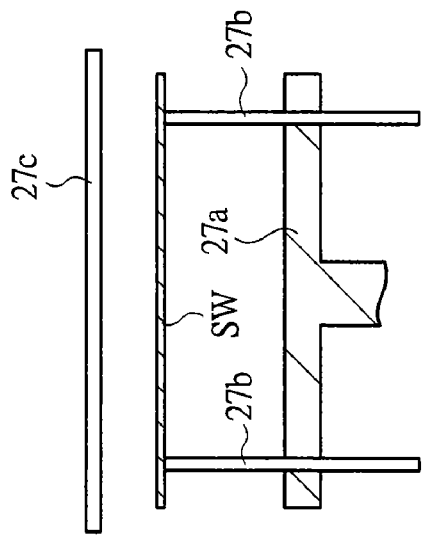
FIG. 13A is a schematic cross-sectional view of a chamber for describing a treatment step of a semiconductor wafer in a dry cleaning processing chamber comprised in the film-deposition apparatus of the silicide material according to the embodiment of the present invention.

When the semiconductor wafer SW is carried into the chamber 27, as shown in FIG. 13A, the wafer stage 27a is lowered, and the wafer lift pin 27b is raised, and the semiconductor wafer SW is put on the wafer lift pin 27b. The distance between the shower head 27c and the semiconductor wafer SW is set at, for example, 16.5±12.7 mm, and the distance between the semiconductor wafer SW and the wafer stage 27a is set at, for example, 25.4±17.8 mm.

Figure 13B:
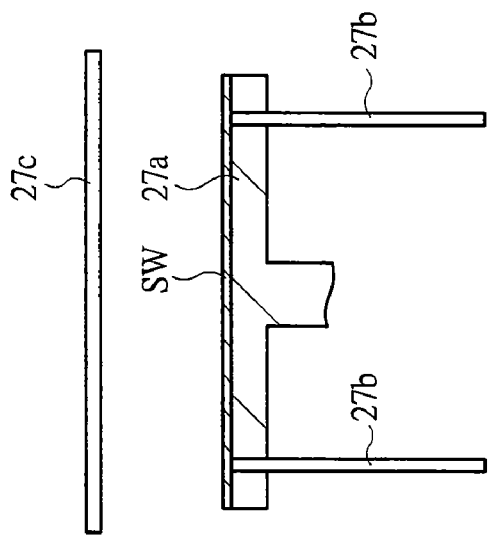
FIG. 13B is a schematic cross-sectional view of the chamber for describing a treatment step of the semiconductor wafer in a dry cleaning processing chamber comprised in the film-deposition apparatus of the silicide material according to the embodiment of the present invention.

Subsequently, when the dry cleaning is carried out on the main surface of the semiconductor wafer SW, as shown in FIG. 13B, the wafer stage 27a is raised, and the wafer lift pin 27b is lowered, and the semiconductor wafer SW is put on the wafer stage 27a. The distance between the shower head 27c and the semiconductor wafer SW is set at, for example, 17.8±5.1 mm.

At the time of the dry cleaning processing, a reduction gas, for example, Ar gas to which $NF_3$ gas and $NH_3$ gas are added, is excited in a remote plasma generator 27d so that plasma is generated, and this plasma is introduced into the chamber 27. The natural oxide film is removed by reduction reaction, for example, shown in Equation (1), that occurs between the plasma and the natural oxide film formed on the surface of the silicon (single crystal silicon forming the semiconductor substrate 1 on which the polycrystalline silicon forming the gate electrodes 8a, 8b and the $n^+$ type semiconductor regions 9b and the $p^+$ type semiconductor regions 10b are formed), by supplying the plasma introduced into the chamber 27 through the shower head 27c onto the main surface of the semiconductor wafer SW. The process conditions at the time of the dry cleaning processing are, for example, shower head temperature 180° C., $NF_3$ gas flow rate 14 sccm, $NH_3$ gas flow rate 70 sccm, pressure 400 Pa, and plasma power 30 W.

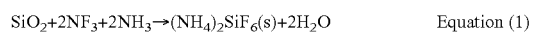

$$SiO_2 + 2NF_3 + 2NH_3 \rightarrow (NH_4)_2SiF_6(s) + 2H_2O \qquad \text{Equation (1)}$$

At this moment, product of ($(NH_4)_2SiF_6$) generated by the reduction reaction remains on the main surface of semiconductor wafer SW. Further, the semiconductor wafer SW is only put on the wafer stage 27a, and the above product remains also partially on the side surface and the back surface of the semiconductor wafer SW. The product partially remaining on the side surface and the back surface of the semiconductor wafer SW comes off when the semiconductor wafer SW is transferred to other chamber and causes pollution and dust. Therefore, by carrying out the heat treatment to the semiconductor wafer SW in the chamber 27 subsequently to the dry cleaning processing (treatment), the product remaining partially on the side surface and the back surface on the main surface of semiconductor wafer SW is removed at the same time with removing the product remaining on the main surface of the semiconductor wafer SW.

Figure 13C:
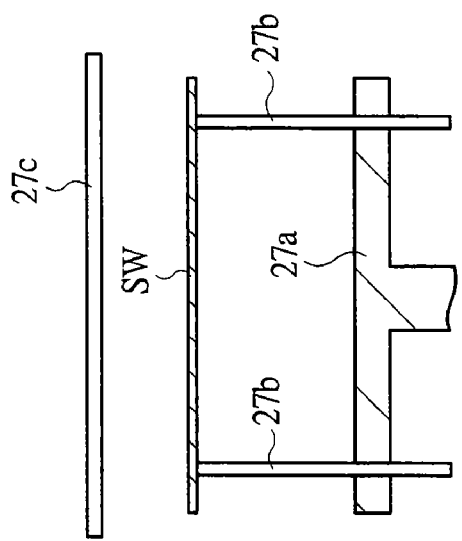
FIG. 13C is a schematic cross-sectional view of the chamber for describing a treatment step of the semiconductor wafer in a dry cleaning processing chamber comprised in the film-deposition apparatus of the silicide material according to the embodiment of the present invention.

Subsequently, when carrying out the heat treatment of the semiconductor wafer SW, as shown in FIG. 13C, the wafer stage 27a is lowered, and the wafer lift pin 27b is raised, and the semiconductor wafer SW is moved close to the shower head 27c set to temperature 180° C. The distance between the shower head 27c and the semiconductor wafer SW is set at, for example, 3.8±2.6 mm, and the distance between the semiconductor wafer SW and the wafer stage 27a is set at, for example, 5.9 mm or more.

At the time of the heat treatment, by use of the heating temperature (180° C.) of the shower head 27c, the semiconductor wafer SW is heated. The temperature of the semiconductor wafer SW becomes 100 to 150° C., and the product ((NH$_4$)$_2$SiF$_6$) formed on the main surface of semiconductor wafer SW at the moment of the abovesaid dry cleaning processing (treatment) is sublimated and removed by reaction, for example, as shown in Equation (2). Further, the side surface and the back surface of the semiconductor wafer SW are heated by this heat treatment, and the product remaining partially on the side surface and the back surface is also removed.

$$(NH_4)_2SiF_6(s) \rightarrow (NH_4)_2SiF_6(g) \qquad \text{Equation (2)}$$

However, if the composition of the product formed on the main surface of semiconductor wafer SW at the moment of the above dry cleaning processing is slightly different from (NH$_4$)$_2$SiF$_6$, the reaction of the Equation (2) is difficult to occur by the heat treatment at the temperature of 100 to 150° C., and so the product cannot be completely removed, and a very small quantity of the product remains on the main surface of the semiconductor wafer SW. As mentioned above, when a very small product remains on the main surface of the semiconductor wafer SW, unevenness occurs in the electrical resistance of a metal silicide layer (for example, nickel silicide layer) formed on the main surface of the semiconductor wafer SW afterwards. Therefore, in the next step, heat treatment at a temperature that is higher than 150° C. is carried out on the semiconductor wafer SW, thereby removing the very small amount of product remaining on the main surface of the semiconductor wafer SW.

Next, the semiconductor wafer SW is vacuum transferred from the chamber 27 for dry cleaning processing to the chamber 25 (or, chamber 26) for heat treatment by the transfer robot 32a through the first transfer chamber 21a, and is put on the stage equipped in the chamber 25 (or, chamber 26) (process P3 of FIG. 11). When the semiconductor wafer SW is put on the stage of the chamber 25 (or, chamber 26), the semiconductor wafer SW is heated at a predetermined temperature, thereby sublimating and removing the product which has not been sublimated and has remained on the main surface of the semiconductor wafer SW at the temperatures from 100 to 150° C. The temperature on the main surface of semiconductor wafer SW is preferably in the range of, for example, 150 to 400° C. (of course, the present invention is not limited to this range according to other conditions). Further, the range of 165 to 350° C. is considered to be a suitable range for a mass production, but furthermore, it is considered that the range centering 200° C. such as the range from 180 to 220° C. is the most suitable.

Next, the semiconductor wafer SW is vacuum transferred from the chamber 25 (or, chamber 26) for heat treatment to chamber 30 (or, chamber 31) for cooling/passing through the first transfer chamber 21a by the transfer robot 32a, and is put on the stage equipped in the chamber 30 (or, chamber 31) (process P4 of FIG. 11). When the semiconductor wafer SW is put on the stage equipped in the chamber 30 (or, chamber 31), the semiconductor wafer SW is cooled down.

Next, the semiconductor wafer SW is vacuum transferred from the chamber 30 (or, chamber 31) for cooling/passing to the chamber 28 for depositing the metal film 12 through the second transfer chamber 21b by the transfer robot 32b (process P5 of FIG. 11). After the inside of the chamber 28 is made into a predetermined degree of vacuum, for example, about 1.33×10$^{-6}$ Pa by the exhaust mechanism, the semiconductor wafer SW is heated to a predetermined temperature, and Ar gas is introduced into the chamber 28 a predetermined flow rate, thereby depositing the metal film 12 (for example, nickel film) on the main surface of the semiconductor wafer SW by sputtering. The deposition process of the metal film 12 corresponds to the above step S1 (step S1 of FIG. 9). The thickness of the metal film 12 is, for example, 9 nm, and the sputtering conditions at the moment of the film formation are, for example, film formation temperature 40° C., and Ar gas flow rate 13 sccm.

Next, the semiconductor wafer SW is vacuum transferred from the chamber 28 for film formation of the metal film 12 to the chamber 29 for film formation of the barrier film 13 through the second transfer chamber 21b by the transfer robot 32b (process P6 of FIG. 11). After the inside of the chamber 29 is made into a predetermined degree of vacuum by the exhaust mechanism, the semiconductor wafer SW is heated to a predetermined temperature, and Ar gas and N$_2$ gas are introduced into the chamber 29 at a predetermined flow rate, thereby depositing the barrier film 13 formed of a titanium nitride film and the like on the main surface of the semiconductor wafer SW by sputtering. The deposition process of this barrier film 13 corresponds to the above step S2 (step S2 of FIG. 9). The thickness of the barrier film 13 is, for example, 15 nm, and, the sputtering conditions at the moment of the film formation are, for example, film formation temperature 40° C., Ar gas flow rate 28 sccm, and nitrogen gas flow rate 80 sccm.

Next, the semiconductor wafer SW is vacuum transferred from the chamber 29 for film formation of the barrier film 13 to the chamber 30 (or, chamber 31) for cooling/passing through the second transfer chamber 21b by the transfer robot 32b (process P7 of FIG. 11).

Next, the semiconductor wafer SW is vacuum transferred from the chamber 30 (or, chamber 31) for cooling/passing to either of the load lock chambers 23 and 24 by the transfer robot 32a, and the semiconductor wafer SW is returned from the load lock chamber 23 or 24 to any of the hoops 34 through the wafer carrying-in/out chamber 33 by the transfer robot 36 (process P8 of FIG. 11).

Note that, in the above dry cleaning processing, the reduction gas, for example, Ar gas to which NF$_3$ gas and NH$_3$ gas are added (Ar gas is often used as the gas for plasma excitation, but other rare gas or a mixture thereof may be used) is activated in the remote plasma generator 27d, and plasma is generated, and this plasma is introduced into the chamber 27, thereby removing the natural oxide film by reduction reaction. As another embodiment, the natural oxide film may be removed by reduction reaction without using plasma by introducing reduction gas such as HF gas and NH$_3$ gas or NF$_3$ gas and the NH$_3$ gas into the chamber 27.

Further, the present invention is not limited to the remote plasma device, and a normal plasma device may be used if there is not any problem to other characteristics. The remote plasma is advantageous that it does not damage the substrate.

Furthermore, in the case of processing using plasma, the present invention is not limited to the above combination of gases, and even combinations of other gases that generate respective radicals or reaction species of nitrogen, hydrogen, fluorine (including compound radicals thereof) may be used if they are not particularly harmful to this process. In other words, mixture gas atmosphere of nitrogen, hydrogen and fluorine radical generation gas (including the mixture) and plasma excitation gas and the other additional gas and the like may be used appropriately.

Moreover, the reaction gas such as the reduction gas is not limited to the abovementioned gases, and it is sufficient when the gas reacts at relatively low temperature with the oxide film of the silicon surface and generates reaction species to vaporize.

After the metal film 12 and the barrier film 13 are formed in this manner, a first heat treatment (annealing process) is performed on the semiconductor substrate 1 (step S3 of FIG. 9). It is preferable to perform the first heat treatment of the step S3 under ordinary pressure by being filled with an inert gas (for example, argon (Ar) gas or helium (He) gas) or a nitrogen ($N_2$) gas atmosphere. Further, it is preferable to perform the first heat treatment of step S3 at 400 to 500° C. when the metal film 12 is a nickel (Ni) film. For example, the first heat treatment of step S3 can be performed by performing the heat treatment on the semiconductor substrate 1 by use of RTA (Rapid Thermal Annealing) in inert gas or nitrogen gas atmosphere at temperature about 410° C and for 10 seconds or longer and equal to or shorter than one minute, and the amount of heat on the metal film 12 can be made even in all regions of the main surface of the semiconductor substrate 1, and it is further preferable to set the temperature increase rate low (3° C./second or more and 10° C./second or lower).

Figure 14:
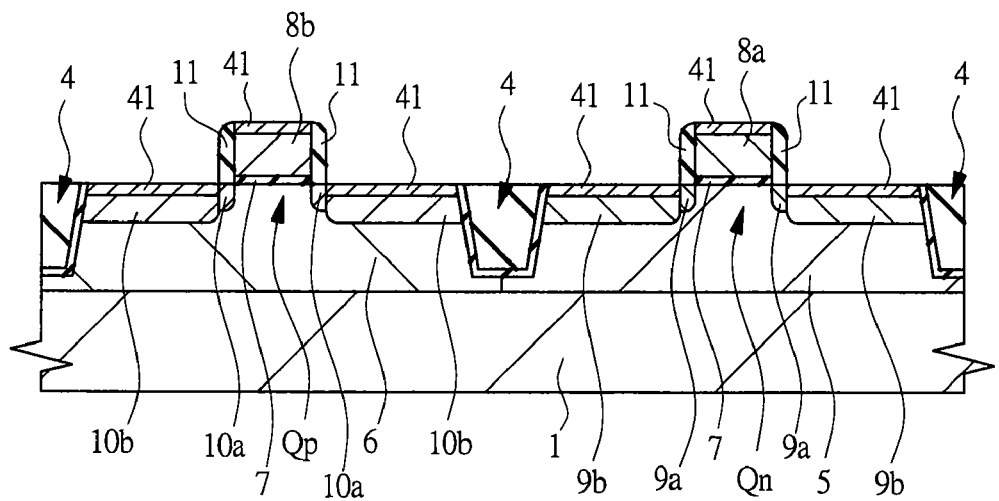
FIG. 14 is a cross-sectional view of main parts of the semiconductor device in a manufacturing step continued from FIG. 8.

By the first heat treatment of the step S3, as shown in FIG. 14, the polycrystalline silicon film and the metal film 12 forming the gate electrodes 8a, 8b, and the single crystal silicon and the metal film 12 forming the $n^+$ type semiconductor regions 9b and the $p^+$ type semiconductor regions 10b are reacted selectively, thereby forming a metal silicide layer 41 that is a metal/semiconductor reaction layer. In the present embodiment, by the first heat treatment of the step S3, a metal silicide layer 41 formed of monosilicide (that is, MSi) of a metal element M forming the metal film 12 is formed. Further, the metal silicide layer 41 is formed by reacting each upper portion (upper layer portion) of the gate electrodes 8a, 8b, the $n^+$ type semiconductor regions 9b and the $p^+$ type semiconductor regions 10b with the metal film 12. Therefore, the metal silicide layer 41 is formed on the each upper portion (upper layer portion) of the gate electrodes 8a, 8b, the $n^+$ type semiconductor regions 9b and the $p^+$ type semiconductor regions 10b.

More particularly, by the first heat treatment of the step S3, the metal element M forming the metal film 12 and Si (silicon) of polycrystalline silicon forming the gate electrodes 8a, 8b are reacted (M+Si→MSi), thereby forming the metal silicide layer 41 comprising MSi on the surface (upper layer portions of the gate electrodes 8a, 8b) of the gate electrodes 8a, 8b. Further, by the first heat treatment of the step S3, the metal element M forming the metal film 12 and Si (silicon) of the $n^+$ type semiconductor regions 9b are reacted (M+Si→MSi), thereby forming the metal silicide layer 41 formed of MSi on the surface of the $n^+$ type semiconductor regions 9b (the upper layer portion of the $n^+$ type semiconductor regions 9b). Further, by the first heat treatment of the step S3, the metal element M forming the metal film 12 and Si (silicon) of the $p^+$ type semiconductor regions 10b are reacted (M+Si→MSi), thereby forming the metal silicide layer 41 formed of MSi on the surface of the $p^+$ type semiconductor regions 10b (the upper layer portion of the $p^+$ type semiconductor regions 10b).

In this manner, by the first heat treatment of the step S3, while (silicon forming) the gate electrodes 8a, 8b, the $n^+$ type semiconductor regions 9b and the $p^+$ type semiconductor regions 10b are reacted selectively with the metal film 12 so that the metal silicide layer 41 is formed, at the stage of the first heat treatment of the step S3, the metal silicide layer 41 is made to MSi (metal monosilicide) phase, and not made to $M_2Si$ (dimetal silicide) phase or $MSi_2$ (metal disilicide) phase. Herein, the MSi (metal monosilicide) is monosilicide of the metal element M forming the metal film 12, and the $MSi_2$ (metal disilicide) is disilicide of the metal element M forming the metal film 12. For example, when the metal film 12 is a nickel (Ni) film, at the stage of the first heat treatment of the step S3, the metal silicide layer 41 is made into NiSi (nickel monosilicide) phase, and is not made into $Ni_2Si$ (dinickel silicide) phase or $NiSi_2$ (nickel disilicide) phase.

Meanwhile, in the present first embodiment and the following embodiments 2 to 6, a metal element forming the metal film 12 is described as M in the chemical equation, and "metal" in alphabets. For example, when the metal film 12 is a nickel (Ni) film, the above M (metal element M forming the metal film 12) is Ni, and so the above MSi (metal monosilicide) is NiSi (nickel monosilicide), the above $M_2Si$ (dimetal silicide) is $Ni_2Si$ (dinickel silicide), and the above $MSi_2$ (metal disilicide) is $NiSi_2$ (nickel disilicide). When the metal film 12 is a Ni—Pt alloy film ($Ni_{0.98}Pt_{0.02}$ alloy film) of Ni 98 atomic % and Pt 2 atomic %, the above M (metal element M forming the metal film 12) is Ni and Pt (but the above M is $Ni_{0.98}Pt_{0.02}$ in consideration of the composition ratio of Ni and the Pt), and so the above MSi is $Ni_{0.98}Pt_{0.02}Si$, the above $M_2Si$ is $(Ni_{0.98}Pt_{0.02})_2Si$, and the above $MSi_2$ is $Ni_{0.98}Pt_{0.02}Si_2$. When the metal film 12 is Ni—Pd alloy film ($Ni_{0.99}Pd_{0.01}$ alloy film) of Ni 99 atomic % and Pd 1 atomic %, the above M (metal element M forming the metal film 12) is Ni and Pd (but the above M is $Ni_{0.99}Pd_{0.01}$ in consideration of the composition ratio of Ni and the Pd), the above MSi is $Ni_{0.99}Pd_{0.01}Si$, the above $M_2Si$ is $(Ni_{0.99}Pd_{0.01})_2Si$, and the above $MSi_2$ is $Ni_{0.99}Pd_{0.01}Si_2$. The above can be considered same in the case where the metal film 12 is an alloy film of other composition.

Next, by performing wet cleaning process, the barrier film 13 and the unreacted metal film 12 (that is, the metal film 12 that did not react with the gate electrodes 8a, 8b, the $n^+$ type semiconductor regions 9b or the $p^+$ type semiconductor regions 10b) are removed (step S4 of FIG. 9). At this time, the metal silicide layer 41 is left on the surfaces of the gate electrodes 8a, 8b, the $n^+$ type semiconductor regions 9b and $p^+$ type semiconductor regions 10b. The wet cleaning process of the step S4 can be performed by a wet cleaning using sulfuric acid or a wet cleaning using sulfuric acid and oxygenated water.

Next, a second heat treatment (annealing process) is performed on the semiconductor substrate 1 (step S5 of FIG. 9). It is preferable to perform the second heat treatment of the step S5 under ordinary pressure by being filled with an inert gas (for example, argon (Ar) gas or helium (He) gas) or a nitrogen ($N_2$) gas atmosphere. Further, the second heat treatment of the step S5 is performed at a heat treatment temperature that is higher than the heat treatment temperature of the first heat treatment of the above step S3. For example, the second heat treatment of the step S5 may be performed on the semiconductor substrate 1 by a heat treatment of an RTA method in inert gas or nitrogen gas atmosphere for 10 seconds or longer and shorter than or equal to one minute.

By performing the second heat treatment of this step S5, the metal silicide layer 41 can be stabilized. In other words, the metal silicide layer 41 of the MSi phase is formed by the first heat treatment of the step S3, and this metal silicide layer 41 remains as a MSi phase even when the second heat treatment of the step S5 is performed. However, by performing the second heat treatment of the step S5, the composition of the metal silicide layer 41 is made more uniform, and the composition ratio of the metal element M and Si in the metal silicide layer 41 becomes closer to the stoichiometry ratio 1:1, thereby stabilizing the metal silicide layer 41. Further, the MSi phase has a low resistivity than that of the $M_2Si$ phase and the $MSi_2$ phase, and the metal silicide layer 41 is maintained as a MSi phase having the low resistance after the step S5 (until manufacture of the semiconductor device finishes), and the metal silicide layer 41 is in the MSi phase having a low resistance the in manufactured semiconductor device (for example, also in the state where the semiconductor substrate 1 is divided into pieces, and becomes semiconductor chips).

If a heat treatment temperature $T_2$ of the second heat treatment of the step S5 is lower than the heat treatment temperature $T_1$ of the first heat treatment of the step S3, even performing the second heat treatment of the step S5, the metal silicide layer 41 is difficult to be changed, and so the stabilization effect of the metal silicide layer 41 may not be obtained. Therefore, the heat treatment temperature $T_2$ of the second heat treatment of the step S5 is set higher than the heat treatment temperature $T_1$ of the first heat treatment of the step S3 ($T_2 > T_1$). By performing the second heat treatment of the step S5 at the heat treatment temperature $T_2$ higher than the heat treatment temperature $T_1$ of the first heat treatment of the step S3 (that is, $T_2 > T_1$), the composition of the metal silicide layer 41 is made uniform, and the stoichiometry ratio of the metal element M and Si in the metal silicide layer 41 becomes closer to the stoichiometry ratio of 1:1, thereby stabilizing the metal silicide layer 41.

However, when the heat treatment temperature $T_2$ of the second heat treatment of the step S5 is too high, the metal element M forming the metal silicide layer 41 diffuses excessively by the second heat treatment of the step S5, and $MSi_2$ (metal disilicide) abnormally grows from the metal silicide layer 41 to the channel part, which has been found in the study by the present inventors. Further, it has been found that unnecessary $MSi_2$ part is formed, and the electric resistance of the metal silicide layer 41 may fluctuate in every field effect transistor.

Therefore, in the present embodiment, the heat treatment temperature $T_2$ of the second heat treatment of step the S5 is made lower than temperature $T_3$ (first temperature) at which the lattice size (lattice constant) of the $MSi_2$ (metal disilicide) which is the disilicide of the metal element M forming the metal film 12 and the lattice size (lattice constant) of the semiconductor substrate 1 become same ($T_3 > T_2$). In this manner, when the second heat treatment of the step S5 is performed, it is possible to suppress or prevent the abnormal growth of the $MSi_2$ (metal disilicide) from the metal silicide layer 41 to the channel part, and to suppress or prevent the formation of unnecessary $MSi_2$ portion, thereby reducing the unevenness of the electrical resistance of each metal silicide film 41. This feature will be described in more details later herein.

In the manner described above, the metal silicide layer 41 made of MSi (metal monosilicide) is formed on the surfaces (upper layer portions) of the gate electrode 8a and the source/drain region of the n-channel type MISFET Qn ($n^+$ type semiconductor region 9b), and on the surfaces (upper layer portions) of the gate electrode 8b and the source/drain region of the p-channel type MISFET Qp ($p^+$ type semiconductor region lob). Further, although it depends on the film thickness of the metal film 12, the film thickness of the metal silicide layer 41 is, for example, about 19 nm when the film thickness of the metal film 12 is, for example, about 9 nm.

Figure 15:
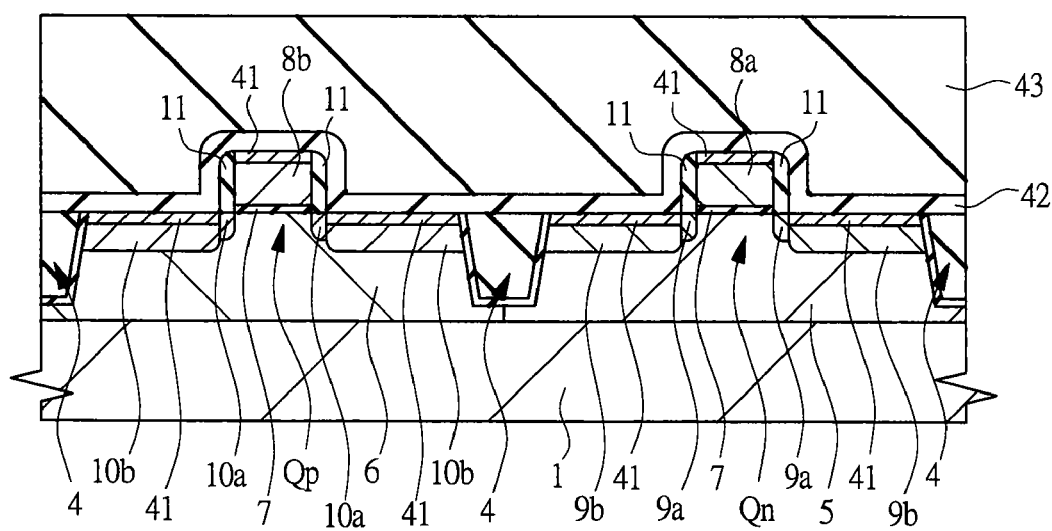
FIG. 15 is a cross-sectional view of main parts of the semiconductor device in a manufacturing step continued from FIG. 14.

Next, as shown in FIG. 15, an insulating film 42 is formed on the main surface of the semiconductor substrate 1. More particularly, the insulating film 42 is formed on the semiconductor substrate 1 including the metal silicide layer 41 so as to cover the gate electrodes 8a, 8b. The insulating film 42 is formed of, for example, a silicon nitride film, and may be formed by a plasma CVD method at a film formation temperature (substrate temperature) about 450° C. Then, an insulating film 43 which is thicker than the insulating film 42 is formed on the insulating film 42. The insulating film 43 is formed of, for example, a silicon oxide film, and may be formed by a plasma CVD method by use of TEOS (Tetraethoxysilane, also referred to as Tetra Ethyl Ortho Silicate). Therefore, an interlayer insulating film comprising the insulating films 42, 43 is formed. Thereafter, the surface of the insulating film 43 is polished by CMP, and the upper surface of the insulating film 43 is planarized. Even if unevenness occurs on the surface of the insulating film 42 due to base topology, the surface of insulating film 43 can be planarized by polishing by CMP, and an interlayer insulating film whose surface is planarized can be obtained.

Figure 16:
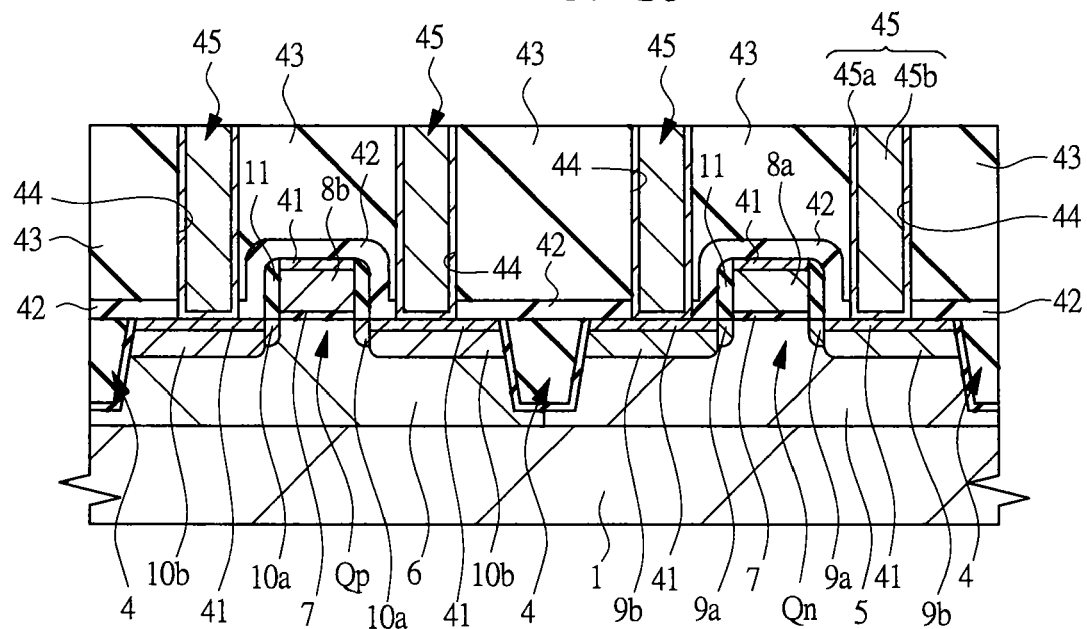
FIG. 16 is a cross-sectional view of main parts of the semiconductor device in a manufacturing step continued from FIG. 15.

Next, as shown in FIG. 16, with a photo resist pattern (not shown) formed on the insulating film 43 as an etching mask, the insulating films 43, 42 are dry etched, thereby forming contact holes (through holes, holes) 44 in the insulating films 42, 43. At this time, dry etching of the insulating film 43 is carried out under the condition that the insulating film 43 is etched more easily than the insulating film 42, and the insulating film 42 is made to function as an etching stopper film, so that the contact holes 44 are formed in the insulating film 43, and then the insulating film 42 of the bottom of the contact holes 44 is dry etched and removed under the condition that the insulating film 42 is etched more easily than the insulating film 43. In the bottom of the contact holes 44, a part of the main surface of semiconductor substrate 1, for example, a part of the metal silicide layer 41 on the surface of the $n^+$ type semiconductor regions 9b and the $p^+$ type semiconductor regions 10b, and a part of the metal silicide layer 41 on the surface of the gate electrodes 8a, 8b are exposed.

Next, in the contact holes 44, a plug (a conductor part for connection, a buried plug, a buried conductor part) 45 formed of tungsten (W) and the like is formed. To form the plug 45, for example, a barrier conductive film 45a (for example, a titanium film, a titanium nitride film or a stacked film thereof) is formed by a plasma CVD method at a film formation temperature (substrate temperature) at 440° C. or more and 460° C. or lower, on the insulating film 43 including the inside (bottom and sidewalls) of the contact holes 44. Then, a main conductive film 45b comprising a tungsten film is formed by CVD method and the like on the barrier conductive film 45a so as to fill the contact holes 44, and unnecessary main conductive film 45b in the insulating film 43 and the barrier conductive film 45a are removed by CMP method or etch back method, thereby forming the plug 45. The plugs 45 formed on the gate electrodes 8a, 8b, the $n^+$ type semiconductor regions 9b and the $p^+$ type semiconductor regions 10b contact and are electrically connected to the metal silicide layers 41 on the surface of the gate electrodes 8a, 8b, the $n^+$ type semiconductor regions 9b and the $p^+$ type semiconductor regions 10b at the bottom.

Figure 17:
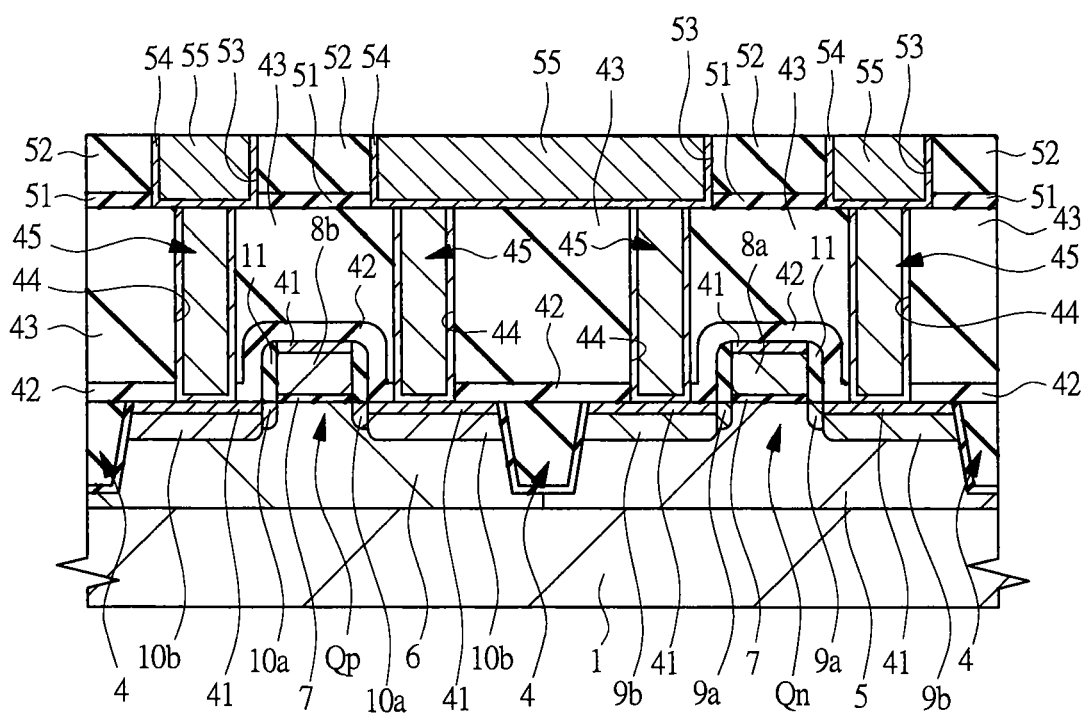
FIG. 17 is a cross-sectional view of main parts of the semiconductor device in a manufacturing step continued from FIG. 16.

Next, as shown in FIG. 17, on the insulating film 43 having the plug 45 buried therein, a stopper insulating film 51 and an insulating film 52 for wiring formation are formed sequentially. The stopper insulating film 51 is a film to become the etching stopper in the case of trench processing to the insulating film 52, and materials having the etching choice ratio for the insulating film 52 are used. And, the stopper insulating film 51 may be, for example, a silicon nitride film formed by plasma CVD method, and the insulating film 52 may be, for example, a silicon oxide film formed by plasma CVD method. Further, a first layer wiring to be described next is formed on the stopper insulating film 51 and the insulating film 52.

Next, the first layer wiring is formed by single damascene method. First, after a wiring trench 53 is formed by dry etching with a resist pattern (not shown) as a mask in the predetermined region of the insulating film 52 and the stopper insulating film 51, a barrier conductive film (barrier metal film) 54 is formed on the main surface of the semiconductor substrate 1 (that is, on the insulating film 52 including the bottom of and sidewalls of the wiring trench). As the barrier conductive film 54, for example, a titanium nitride film, a tantalum film or a tantalum nitride film may be used. Thereafter, a copper seed layer is formed on the barrier conductive film 54 by CVD method or sputtering method, and further, a copper plating film is formed on the seed layer by use of electroplating and the like. The inside of the wiring trench 53 is buried by the copper plating film. Then, the copper plating film in the region except the wiring trench 53, the seed layer and the barrier metal film 54 are removed by CMP method, thereby forming a first layer wiring 55 mainly formed of copper as its main conductive material. The wirings 55 are electrically connected to the n$^+$ type semiconductor regions 9b and the p$^+$ type semiconductor regions 10b for the source or drain of the n-channel type MISFET Qn and the p-channel type MISFET Qp and the gate electrodes 8a, 8b and the like through the plugs 45. Thereafter, a second layer wiring is formed by damascene method, but illustration and description thereof are omitted herein.

Figure 18:
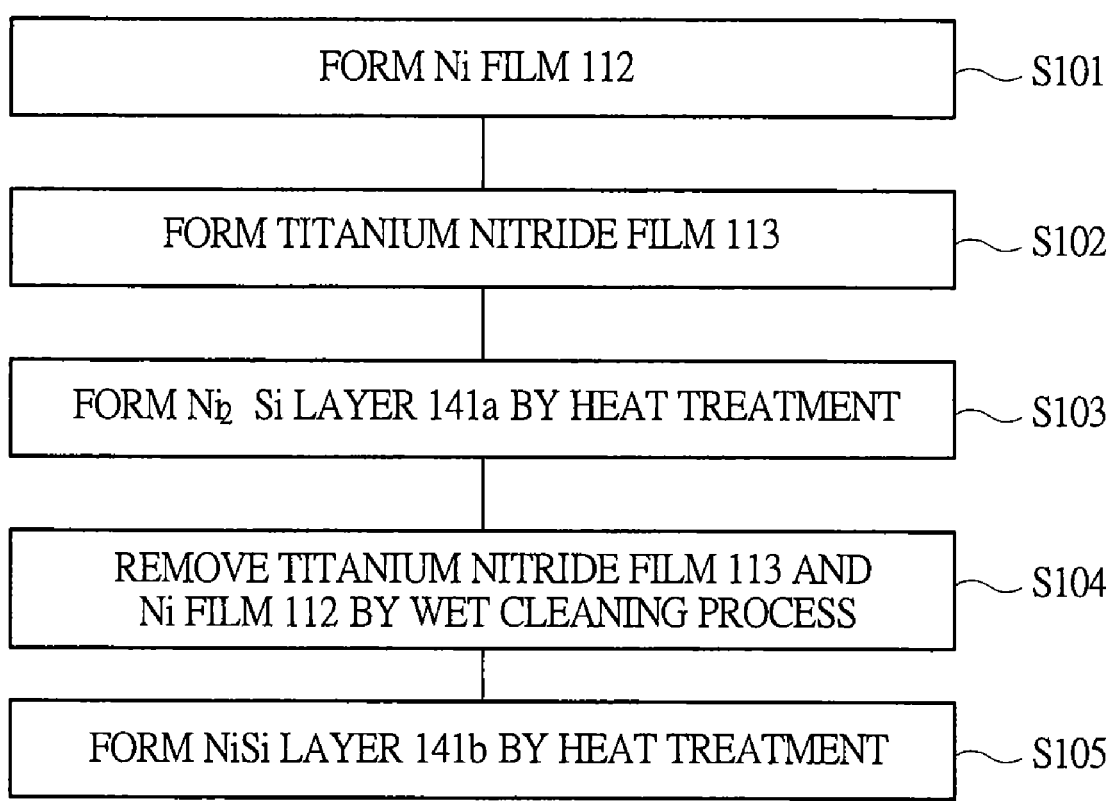
FIG. 18 is a process flow chart showing formation steps of a NiSi layer in a semiconductor device according to a comparative example.
Figure 19:
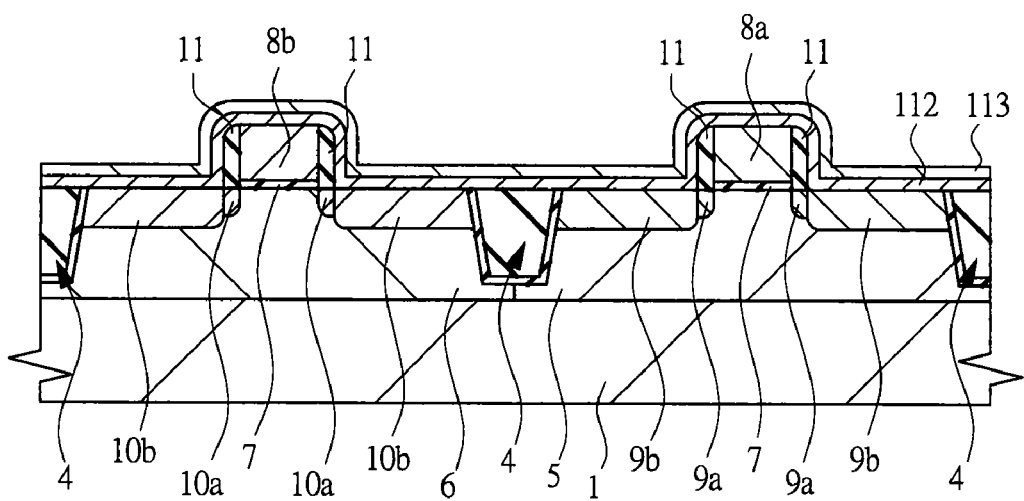
FIG. 19 is a cross-sectional view of main parts of the semiconductor device in a manufacturing step according to the comparative example.
Figure 20:
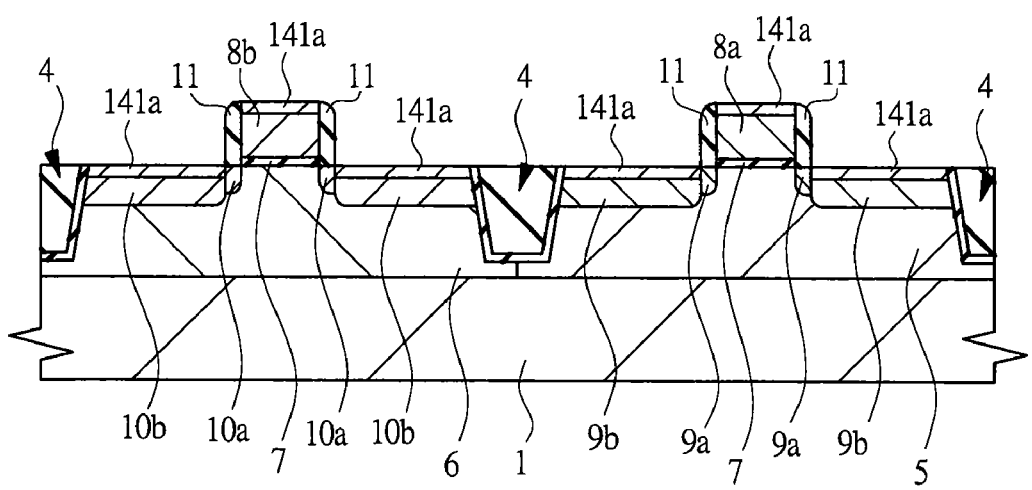
FIG. 20 is a cross-sectional view of main parts of the semiconductor device according to the comparative example in a manufacturing step continued from FIG. 19.
Figure 21:
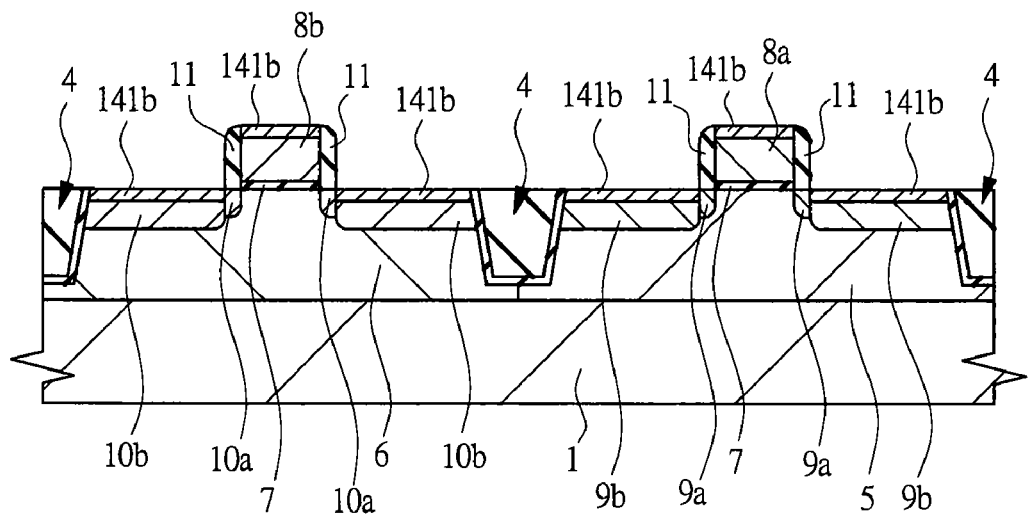
FIG. 21 is a cross-sectional view of main parts of the semiconductor device according to the comparative example in a manufacturing step continued from FIG. 20.
Figure 22:
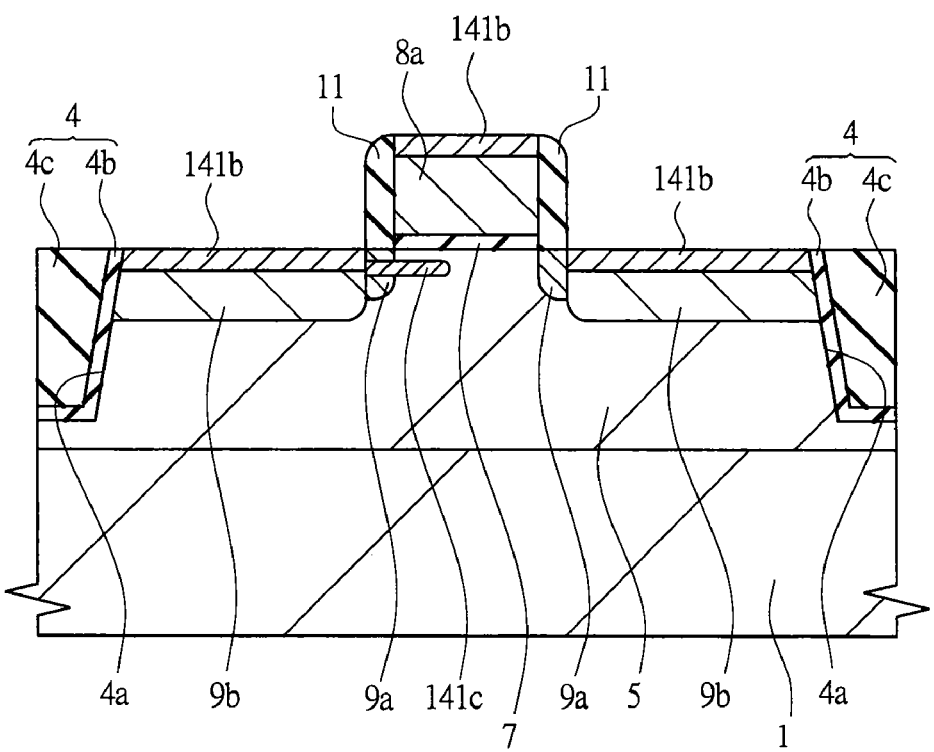
FIG. 22 is a cross-sectional view of main parts of the semiconductor device in a manufacturing step according to the comparative example.

Next, effects of the present embodiment will be explained in more details. FIG. 18 is a process flow chart showing a formation process of a NiSi layer 141b in a semiconductor device of a comparative example and corresponds to FIG. 9 of the present embodiment. FIG. 19 to FIG. 21 are cross-sectional views of main parts of the semiconductor device in the manufacturing process of the comparative example. FIG. 22 is a cross-sectional view of main parts of the semiconductor device in the manufacturing process of the comparative example, and the region where an n-channel type MISFET in the process stage corresponding to FIG. 21 is formed is shown.

The semiconductor device of the comparative example of FIG. 18 to FIG. 22 is manufactured in the same manner as in the present embodiment, except that the NiSi layer 141b corresponding to the metal silicide layer 41 of the present embodiment is formed by a process different from the present embodiment.

To manufacture the semiconductor device of the comparative example, after a structure corresponding to the above-described FIG. 7 of the present embodiment is obtained, as shown in FIG. 19, a Ni film 112 (equivalent to the metal film 12 of the present embodiment) is deposited on the main surface of the semiconductor substrate 1 including the gate electrodes 8a, 8b, the n$^+$ type semiconductor regions 9b and the p$^+$ type semiconductor regions 10b (step S101 of FIG. 18). Then, a titanium nitride film 113 (equivalent to the barrier film 13 of the present embodiment) is deposited on the Ni film 112 (step S102 of FIG. 18). Thereafter, as shown in FIG. 20, by performing heat treatment at about 320° C. by RTA method for about 30 seconds, (silicon forming) the gate electrodes 8a, 8b, the n$^+$ type semiconductor regions 9b and the p$^+$ type semiconductor regions 10b, and the Ni film 112 are selectively reacted, thereby forming a Ni$_2$Si (dinickel silicide) layer 141a on the surfaces of the gate electrodes 8a, 8b, the n$^+$ type semiconductor regions 9b, and the p$^+$ type semiconductor regions 10b (step S103 of FIG. 18).

Next, by performing wet cleaning process, the titanium nitride film 113 and the unreacted Ni film 112 are removed (step S104 of FIG. 18), and then heat treatment is performed at about 550° C. by RTA method for about 30 seconds (step S105 of FIG. 18). The Ni$_2$Si layer 141a, and the silicon (Si) of the gate electrodes 8a, 8b, the n$^+$ type semiconductor regions 9b and the p$^+$ type semiconductor regions 10b are further reacted by the heat treatment of the step S105 (by the reaction Ni$_2$Si+Si→2NiSi), and as shown in FIG. 21, a NiSi layer 141b comprising a NiSi phase having a lower resistivity and is more stabile than the Ni$_2$Si phase is formed on the surfaces of the gate electrodes 8a, 8b, the n$^+$ type semiconductor regions 9b, and the p$^+$ type semiconductor regions 10b. In other words, the Ni$_2$Si phase (Ni$_2$Si layer 141a) is formed once by heat treatment of the step S103, and this is changed into a NiSi phase (NiSi layer 141b) by the heat treatment of step S105. Thereafter, even in the semiconductor device of the comparative example, in the same manner as in the present embodiment, insulating films 42, 43, contact holes 44, plug 45, wiring 46 and insulating film 47 are formed, but the illustration and description thereof are omitted herein. The semiconductor device of the comparative example is manufactured in this manner.

In the case of forming the cobalt silicide, Si (silicon) is diffusion species, and cobalt silicide is formed by Si moving into the Co film. Meanwhile, in the case of forming the nickel silicide, Ni (nickel) is diffusion species, and nickel silicide is formed by Ni (nickel) moving into the silicon region side.

In the careful study by the present inventors on the semiconductor device of the comparative example manufactured in the above manner, it has been found that NiSi$_2$ (nickel disilicide) is apt to grow abnormally from the NiSi layer 141b to the channel part. In FIG. 22, the region where NiSi$_2$ is easy to grow abnormally is schematically shown as a NiSi$_2$ abnormal growth region 141c. The occurrence of such a NiSi$_2$ abnormal growth region 141C is confirmed by the experiments (the cross-sectional observation of the semiconductor device and the composition analysis of the cross section) by the present inventors. And, it has been found that when the NiSi$_2$ grows abnormally from the NiSi layer 141b into the channel part, the increase of the leakage current between the source/drain of the MISFET and the increase of the diffusion resistance of the source/drain region are posed.

Therefore, in the present embodiment, as mentioned above, the metal film 12 is deposited on the main surface of the semiconductor substrate 1 including the gate electrodes 8a, 8b, the n$^+$ type semiconductor regions 9b and the p$^+$ type semiconductor regions 10b as the step S1, and the barrier film 13 is deposited on the metal film 12 as the step S2, and then, the first heat treatment is performed as the step S3, and the metal silicide layer 41 of the MSi (metal monosilicide) phase is formed by this first heat treatment. In other words, by the first heat treatment of step S3, (silicon forming) the gate electrodes 8a, 8b, the n$^+$ type semiconductor regions 9b and the p$^+$ type semiconductor regions 10b and the metal film 12 are selectively reacted, and the metal silicide layer 41 is formed, and at the stage of the first heat treatment of this step S3, the metal silicide layer 41 is made into the MSi (metal monosilicide) phase instead of M$_2$Si (dimetal silicide) phase or MSi$_2$ (metal disilicide) phase. For example, when the metal film 12 is a nickel (Ni) film, at the stage of the first heat treatment of the step S3, the metal silicide layer 41 is made into the NiSi (nickel monosilicide) phase instead of Ni$_2$Si (dinickel silicide) phase or NiSi$_2$ (nickel disilicide). Therefore, in the present embodiment, the first heat treatment of step S3 is performed at the heat treatment temperature that is higher than that of the heat treatment of step S103 of the above comparative example. It is preferable that, in the case where the metal film 12 is a nickel (Ni) film, the heat treatment temperature of the first heat treatment of step S3 is within a range of 400 to 500° C., for example, it may be set at 410° C.

Figure 23:
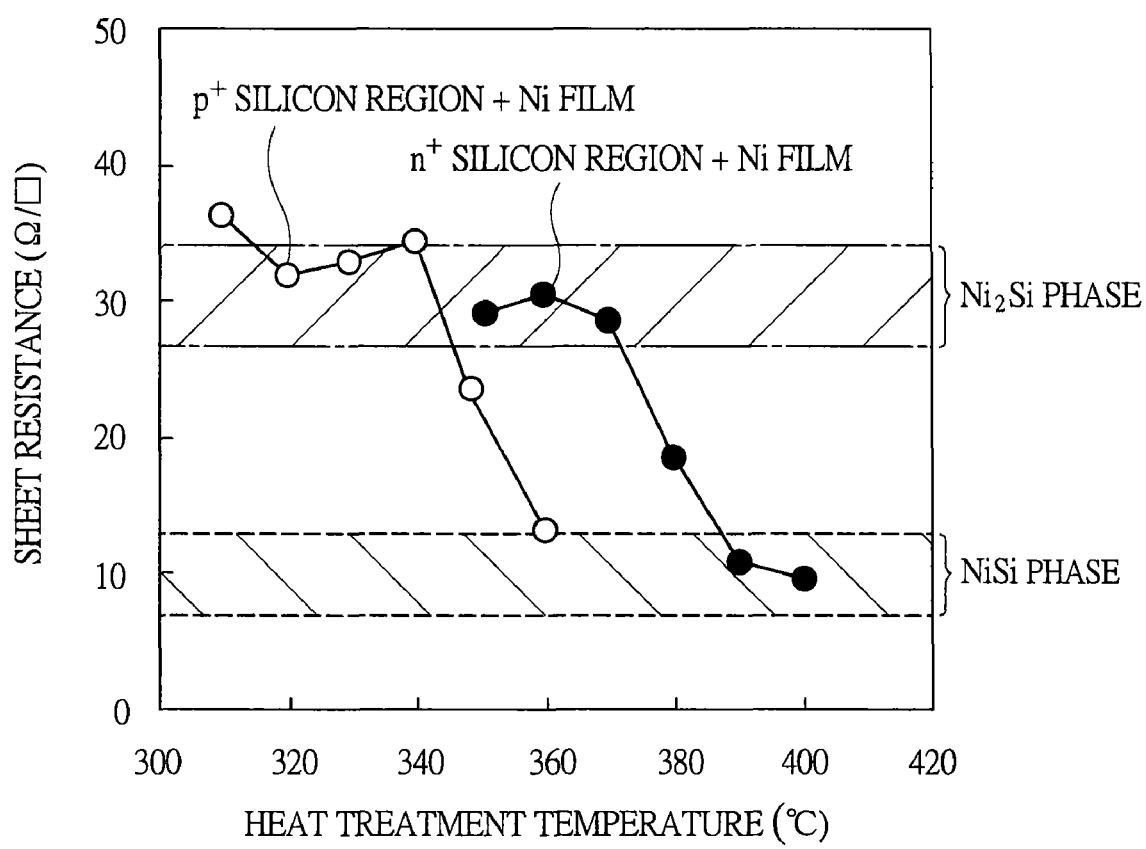
FIG. 23 is a graph showing a thermal treatment temperature dependency of a sheet resistance of a nickel silicide layer.

FIG. 23 is a graph showing heat treatment temperature dependence of the sheet resistance of the formed nickel silicide layer, in the case where a p$^+$ type silicon region and an n$^+$ type silicon region are formed on a semiconductor substrate, and a Ni film is formed about 10 nm and a TiN (titanium nitride) film is formed about 15 nm, and the Ni film and the p$^+$ type silicon region and the n$^+$ type silicon region are reacted by heat treatment, and the nickel silicide layer is formed, and unreacted Ni film and TiN film are removed. The horizontal axis of the graph of FIG. 23 corresponds to the heat treatment temperature to react the Ni film and p$^+$ type silicon region and the n$^+$ type silicon region by heat treatment, and the vertical axis of the graph of FIG. 23 corresponds to the sheet resistance value of the nickel silicide layer formed by the heat treatment. The heat treatment in FIG. 23 is performed about 30 seconds by RTA. Further, in the graph of FIG. 23, the sheet resistance value of the nickel silicide layer that is formed by reacting the Ni film and the p$^+$ type silicon region by heat treatment is shown by white circle (p$^+$ type silicon region+Ni film), and the sheet resistance value of the nickel silicide layer that is formed by reacting the Ni film and the n$^+$ type silicon region by heat treatment is shown by black circle (n$^+$ type silicon region+Ni film).

As seen in the graph of FIG. 23, in the nickel silicide layer, NiSi (nickel silicide) phase has a sheet resistance lower than Ni$_2$Si (dinickel silicide) phase (about 30Ω/□ in Ni$_2$Si phase, and 10Ω/□ in NiSi). As is seen in the graph of FIG. 23, if the heat treatment temperature is low, the nickel silicide layer to be formed is a Ni$_2$Si phase with high resistance, but, if the heat treatment temperature is high, the nickel silicide layer to be formed is a NiSi phase with low resistance. Furthermore, the temperature of the change from a Ni$_2$Si phase into a NiSi phase is lower in the nickel silicide layer (corresponding to one shown by the white circle in the graph of FIG. 23) formed by reaction of a Ni film and a p$^+$ type silicon region by heat treatment, than in the nickel silicide layer (corresponding to one shown by the black circle in the graph of FIG. 23) by reaction of a Ni film and an n$^+$ type silicon region by heat treatment (that is, a NiSi phase can be formed at lower heat treatment temperature). If the heat treatment temperature is more than 400° C., whether p$^+$ type silicon region or n$^+$ type silicon region, it is possible to form the nickel silicide layer of the NiSi phase.

In the above comparative example, since the Ni$_2$Si layer 141a is formed by the heat treatment of step S103, the heat treatment temperature of step S103 is carried out at the temperature that is lower than the temperature at which the NiSi phase is formed, for example, at about 320° C. In contrast, in the present embodiment, by the first heat treatment of step S3, the metal silicide layer 41 of not the M$_2$Si phase but the MSi phase is formed by the first heat treatment of step S3 is carried out at the heat treatment temperature at which the MSi phase can be formed (temperature that is higher than the lowest heat treatment temperature at which the MSi phase can be formed). For example, when the metal film 12 is a nickel (Ni) film, as seen from FIG. 23, it is preferable that the first heat treatment of step S3 is performed at about 400° C. or more, and for example, it is carried out at about 410° C. Thereby, at the stage of the first heat treatment of step S3, the metal silicide layer 41 can be made into not M$_2$Si (dimetal silicide) phase but MSi (metal monosilicide) phase.

However, in the first heat treatment of step S3, the reaction of M+Si→MSi accompanying the movement of the metal element M occurs, and the metal element M is easily to move, and accordingly, when the heat treatment temperature is too high, the metal element M diffuses (moves) excessively even if there is the barrier film 13, and MSi$_2$ (metal disilicide) may be formed partially. Furthermore, if the heat treatment temperature of the first heat treatment of step S3 is higher than the temperature of the change from an MSi phase to an MSi$_2$ phase, the whole metal silicide layer 41 becomes a MSi$_2$ phase. Therefore, for example, in the case when the metal film 12 is a nickel (Ni) film, the heat treatment temperature of the first heat treatment of step S3 is preferably set 500° C. or lower, and further preferably 450° C. or lower, and thereby, it is possible to prevent MSi$_2$ from being formed at the moment of formation of the metal silicide layer 41 comprising MSi. Therefore, it is preferable that the heat treatment temperature of the first heat treatment of step S3 is in the range within 400 to 500° C. when the metal film 12 is the nickel (Ni) film.

In the case of the heat treatment with the reaction that the metal element M diffuses (moves), the metal element M diffuses abnormally, and the abnormal growth of MSi$_2$ from the metal silicide layer to the channel part easily occurs. In the present embodiment, in the first heat treatment of step S3, the reaction of M+Si→MSi with the movement of metal element M is made, and there is a threat that the metal element M is easy to move, and the metal element M diffuses abnormally, and abnormal growth of MSi$_2$ from the metal silicide layer 41 to the channel part may take place, but the barrier film 13 prevents it.

In other words, as the above comparative example, when the heat treatment (heat treatment of the above step S105) in which the phases of the nickel silicide layer changes (from Ni$_2$Si layer 141a into NiSi layer 141b) in the state where the nickel silicide layer is not covered with the barrier film, is carried out, there will be oxygen (O) on the surface at the moment of the NiSi phase formation. Therefore, defects caused by oxygen increase, and Ni is easy to spread through the defects, and the abnormal growth of NiSi$_2$ is facilitated during the heat treatment for the NiSi layer 141b formation.

In contrast, in the present embodiment, when the metal silicide layer 41 comprising MSi by the first heat treatment of step S3 is formed, the barrier film 13 suppresses or prevents the transmission of oxygen (O), and it is possible to prevent oxygen (O) from being supplied to the metal silicide layer 41. Thereby, when the metal silicide layer 41 comprising MSi by the first heat treatment of step S3 is formed, it is possible to suppress or prevent defects caused by oxygen from being generated, and it is possible to suppress or prevent the metal element M from diffusing through defects caused by oxygen. Therefore, at the moment of the first heat treatment of step S3, it is possible to suppress or prevent the abnormal growth of MSi$_2$ from the metal silicide layer 41 to the channel part. In order to increase such an effect, it is preferable that the barrier film 13 is a film which does not penetrate (hardly transmits) oxygen (O), namely, the barrier film 13 is a film with non oxygen permeability, and as such a barrier film 13, a titanium nitride (TiN) film and a titanium (Ti) film are preferable.

Furthermore, in the present embodiment, it is preferable that the barrier film 13 is a film that causes tensile stress to the semiconductor substrate 1. In other words, in a state where the barrier film 13 that causes tensile stress to the semiconductor substrate 1 is arranged on the metal film 12, and the first heat treatment of step S3 is carried out, and the metal film 12 and the silicon region (the gate electrodes 8a, 8b, the n$^+$ type semiconductor regions 9b and the p$^+$ type semiconductor regions 10b) are reacted, and the metal silicide layer 41 of the MSi phase is formed.

When the heat treatment with the reaction that the metal element M diffuses (moves) is carried out, in a state where the lattice size of the semiconductor substrate 1 is close to the lattice size of MSi$_2$ (metal disilicide), substitution easily occurs between lattices of the metal element M and the Si (Si forming the semiconductor substrate 1), and the metal element M easily diffuses abnormally during the heat treatment, and the abnormal growth of MSi$_2$ from metal silicide layer 41 to the channel part easily takes place.

In contrast, in the present embodiment, in condition that the barrier film 13 to cause tensile stress in the semiconductor substrate 1 is formed, the first heat treatment of step S3 is carried out, and for the tensile stress that the barrier film 13 makes, it is possible to make the lattice size of the semiconductor substrate 1 larger than in the case without the barrier film 13, and it is possible to make large the difference between the lattice size of the semiconductor substrate 1 and the lattice size of $MSi_2$ (metal disilicide). Accordingly, it is possible to suppress or prevent the abnormal growth of $MSi_2$ from occurring from the metal silicide layer 41 to the channel part at the moment of the first heat treatment of step S3.

Further, in the present embodiment, as mentioned above, after the first heat treatment of step S3 is carried out and the metal silicide layer 41 of the MSi phase is formed, the wet cleaning process is carried out as step S4, and thereby the barrier film 13 and the unreacted metal film 12 are removed, then the second heat treatment is carried out as step S5. In the present embodiment, at the stage of the first heat treatment of step S3, the metal silicide layer 41 already becomes an MSi phase, and even if the second heat treatment of step S5 is carried out, the metal silicide layer 41 remains as a MSi phase, and the phase (MSi phase) of the metal silicide layer 41 does not change before and after the second heat treatment of step S5. Unlike the heat treatment of step S105 of the comparative example, the second heat treatment of step S5 of the present embodiment is stabilization annealing performed for the stabilization of the metal silicide layer 41, and not for an phase change of the metal silicide layer 41 (phase change from $M_2Si$ phase to MSi phase). After the second heat treatment of step S5, to the production end of the semiconductor device (for example, to cutting semiconductor substrate 1 and making it into pieces of semiconductor chips), the semiconductor substrate 1 is kept so as not to become the temperature that is higher than the heat treatment temperature $T_2$ of the second heat treatment of step S5.

That is, in the various heating processes after the second heat treatment of step S5 (for example, processes with heating of the semiconductor substrate 1 such as the film formation processes of various kinds of insulating films and conductive films), the temperature of the semiconductor substrate 1 is kept so as not to become higher than the heat treatment temperature $T_2$ of the second heat treatment of step S5, and after the second heat treatment of step S5, the processes in which the temperature of semiconductor substrate 1 becomes higher temperature than the heat treatment temperature $T_2$ of the second heat treatment are not performed. In other words, the heat treatment temperature $T_2$ of the second heat treatment of step S5 is made higher than the heating temperature of semiconductor substrate 1 in all the later heating processes than step S5 (for example, processes with heating of the semiconductor substrate 1 such as the film formation processes of various kinds of insulating films and conductive films). Thereby, it is possible to prevent the metal element M which constitutes the metal silicide layer 41 (MSi phase) from diffusing into the semiconductor substrate 1 (the gate electrodes 8a, 8b, the $n^+$ type semiconductor regions 9b and the $p^+$ type semiconductor regions 10b) and causing property fluctuation of the MISFET due to the heating processes after the step S5 (for example, the film formation processes of various kinds of insulating films and conductive films).

Furthermore, unlike the present embodiment, when the second heat treatment of step S5 is not performed, since there is a possibility that the characteristics of the metal silicide layer 41 may be changed depending on the condition of the later heating processes (for example, processes with heating of the semiconductor substrate 1 such as the film formation processes of various kinds of insulating films and conductive films), it is necessary to perform carefully the management or control and review of the processes with the heating of the semiconductor substrate 1. In contrast, in the present invention, by performing the heat treatment of step S5, the metal silicide layer 41 is stabilized, it is possible to suppress or prevent the characteristics of the metal silicide layer 41 from changing depending on the condition of the heating processes after the step S5 (for example, processes with heating of the semiconductor substrate 1 such as the film formation processes of various kinds of insulating films and conductive films), and make easy the management or control and review of the processes with heating of the semiconductor substrate 1.

Further, it is preferable that the heat treatment temperature $T_2$ of the second heat treatment of step S5 is made higher than the heating temperature of semiconductor substrate 1 in all the heating processes after the step S5 (for example, processes with heating of the semiconductor substrate 1 such as the film formation processes of various kinds of insulating films and conductive films), and thereby, process in which the temperature of the semiconductor substrate 1 becomes higher than the heat treatment temperature $T_2$ of the second heat treatment after step S5 is not performed. And thereby, the characteristics of the metal silicide layer 41 are not influenced by the changes of the conditions of the heating processes after the step S5 (for example, processes with heating of the semiconductor substrate 1 such as the film formation processes of various kinds of insulating films and conductive films). Therefore, the management or control and review of the processes with the heating of the semiconductor substrate 1 after step S5 become extremely easy.

Thus, by performing the second heat treatment of step S5, it is possible to obtain the stabilization effect and characteristic change prevention effect of the metal silicide layer 41.

In the first heat treatment of step S3, the reaction of M+Si→MSi occurs, and the metal element M diffuses (moves) greatly to the silicon region (the gate electrodes 8a, 8b, the $n^+$ type semiconductor regions 9b and the $p^+$ type semiconductor regions 10b), but in the second heat treatment of step S5, such a reaction (M+Si→MSi) does not occur, and the metal element M in the metal silicide layer 41 is hard to diffuse (move) to the silicon region. Further, because the first heat treatment of step S3 is carried out in condition that the metal film 12 has been formed, the metal element M is supplied from the metal film 12, but the second heat treatment of step S5 is carried out in condition that the metal film 12 has been removed, the metal element M is not supplied newly. Therefore, it is more effective for preventing the abnormal growth of $MSi_2$ from the last metal silicide layer 41 to the channel part, to raise the stability of the metal silicide layer 41 of the MSi phase by the second heat treatment of step S5, than to raise the first heat treatment of step S3 to raise the stability of the metal silicide layer 41 of the MSi phase at the stage of the first heat treatment of step S3.

However, it has been found by the examinations by the present inventors that even in the second heat treatment of step S5, there is a possibility that the metal element M which constitutes the metal silicide layer 41 diffuses excessively, and $MSi_2$ (metal disilicide) grows abnormally from the metal silicide layer 41 to the channel part depending on the heat treatment temperature $T_2$. Furthermore, it has been found by the examinations by the present inventors that depending on the heat treatment temperature $T_2$ of the second heat treatment of step S5, an unnecessary $MSi_2$ part is formed, and the electrical resistance of the metal silicide layer 41 may fluctuate per every field effect transistor. The heat treatment temperature $T_2$ of the second heat treatment of this step S5 is explained in more details hereinafter.

When the heat treatment temperature $T_2$ of the second heat treatment of step S5 is lower than the heat treatment temperature $T_1$ of the first heat treatment of step S3, even if the second heat treatment of step S5 is performed, the metal silicide layer 41 hardly changes, and the stabilization effect of metal silicide layer 41 cannot be obtained, therefore, it is necessary to make the heat treatment temperature $T_2$ of the second heat treatment of step S5 higher than the heat treatment temperature $T_1$ of the first heat treatment of step S3 ($T_2 > T_1$). By making the heat treatment temperature $T_2$ of the second heat treatment of step S5 higher than the heat treatment temperature $T_1$ of the first heat treatment of step S3 ($T_2 > T_1$), in the second heat treatment of step S5, the composition of the metal silicide layer 41 is made further uniform, and the composition ratio of the metal element M in the metal silicide layer 41 and the Si becomes closer to the stoichiometry ratio 1:1, and the metal silicide layer 41 can be stabilized. By stabilizing the metal silicide layer 41, it is possible to suppress leakage currents between the source/drain of the MISFET.

However, when the heat treatment temperature $T_2$ of the second heat treatment of step S5 is too high, in the second heat treatment of step S5, the metal element M forming the metal silicide layer 41 diffuses excessively, and $MSi_2$ (metal disilicide) is easy to grow abnormally from the metal silicide layer 41 to the channel part. That is, when the heat treatment temperature $T_2$ of the second heat treatment of step S5 is too high, the abnormal growth of $MSi_2$ (metal disilicide) as shown as $NiSi_2$ abnormal growth region 141c in the above FIG. 22 occurs. The occurrence of such an abnormal growth of $MSi_2$ (metal disilicide) from the metal silicide layer 41 to the channel part depending on the heat treatment temperature $T_2$ of the second heat treatment of step S5 is confirmed by the experiments (the cross-sectional observation of the semiconductor device and the composition analysis of the cross section) by the present inventors. Because the abnormal growth of $MSi_2$ (metal disilicide) from the metal silicide layer 41 to the channel part invites the increase of the leakage current of source/drain region of the field effect transistor, and invites increase of the diffusion resistance of the source/drain region, as mentioned above, therefore, it is necessary to prevent the abnormal growth of $MSi_2$ (metal disilicide) from the metal silicide layer 41 to the channel part for the improvement of the performance and reliability of the field effect transistor.

Therefore, the inventors have examined the interphase between the second heat treatment of step S5 and the abnormal growth of $MSi_2$ (metal disilicide) from metal silicide layer 41 to the channel part and found the following. That is, it has been found that it is extremely effective to make the heat treatment temperature $T_2$ of the second heat treatment of step S5 lower than the temperature $T_3$ at which the lattice size (lattice constant) of $MSi_2$ (metal disilicide) that is the disilicide of metal element M forming the metal film 12 and the lattice size (lattice constant) of the semiconductor substrate 1 become same ($T_2 < T_3$), in order to prevent the abnormal growth of $MSi_2$ (metal disilicide) from the metal silicide layer 41 to the channel part. This is because, when the lattice size (lattice constant) of the semiconductor substrate 1 and the lattice size (lattice constant) of $MSi_2$ (metal disilicide) become same during heat treatment, the abnormal growth of $MSi_2$ (metal disilicide) from the metal silicide layer 41 to the channel part easily takes place. Further, in the present application, the lattice size means a lattice constant (length of the unit cell).

In other words, when the lattice size of the semiconductor substrate 1 is far apart from the lattice size of $MSi_2$ (metal disilicide), even if the second heat treatment of step S5 is performed, because it is hard to produce substitution between lattices of the metal element M and the Si, it is hard to scatter metal element M from the metal silicide layer 41 of the MSi phase in the semiconductor substrate region (a single crystal silicon region), and the $MSi_2$ (metal disilicide) part is hard to be generated. In contrast, if the lattice size of the semiconductor substrate 1 is almost close to that of $MSi_2$ (metal disilicide), substitution is easy to occur between lattices of the metal element M and the Si, and it is easy to scatter the metal element M from the metal silicide layer 41 of the MSi phase in the semiconductor substrate region (a single crystal silicon region), and a $MSi_2$ (metal disilicide) part is easy to be generated by heat treatment. Therefore, if the lattice size (lattice constant) of the semiconductor substrate 1 and the lattice size (lattice constant) of $MSi_2$ (metal disilicide) are not same when the second heat treatment of step S5 is performed, it is possible to suppress or prevent the abnormal growth of $MSi_2$ (metal disilicide) from the metal silicide layer 41 to the channel part.

Therefore, in the present embodiment, the heat treatment temperature $T_2$ of the second heat treatment of step S5 is made lower than the temperature $T_3$ at which the lattice size of $MSi_2$ (metal disilicide) and the lattice size of the semiconductor substrate 1 become same ($T_2 < T_3$), and thereby, when the second heat treatment of step S5 is performed, the lattice size of the semiconductor substrate 1 and the lattice size of $MSi_2$ (metal disilicide) are made not to become same. Thereby, it is possible to suppress or prevent the abnormal growth of $MSi_2$ (metal disilicide) from the metal silicide layer 41 to the channel part in the second heat treatment of step S5, and prevent an abnormal growth region of $MSi_2$ (metal disilicide) from occurring from the metal silicide layer 41 to the channel part in a produced semiconductor device.

Next, an applied example of a case where the semiconductor substrate 1 is a single crystal silicon (Si) substrate, the metal film 12 is a nickel (Ni) film, and the metal silicide layer 41 is a nickel silicide (NiSi) layer is explained concretely. In this case, the above metal element M becomes Ni (nickel), and the above MSi becomes NiSi (nickel monosilicide), and the above $MSi_2$ becomes $NiSi_2$ (nickel disilicide).

Figure 24:
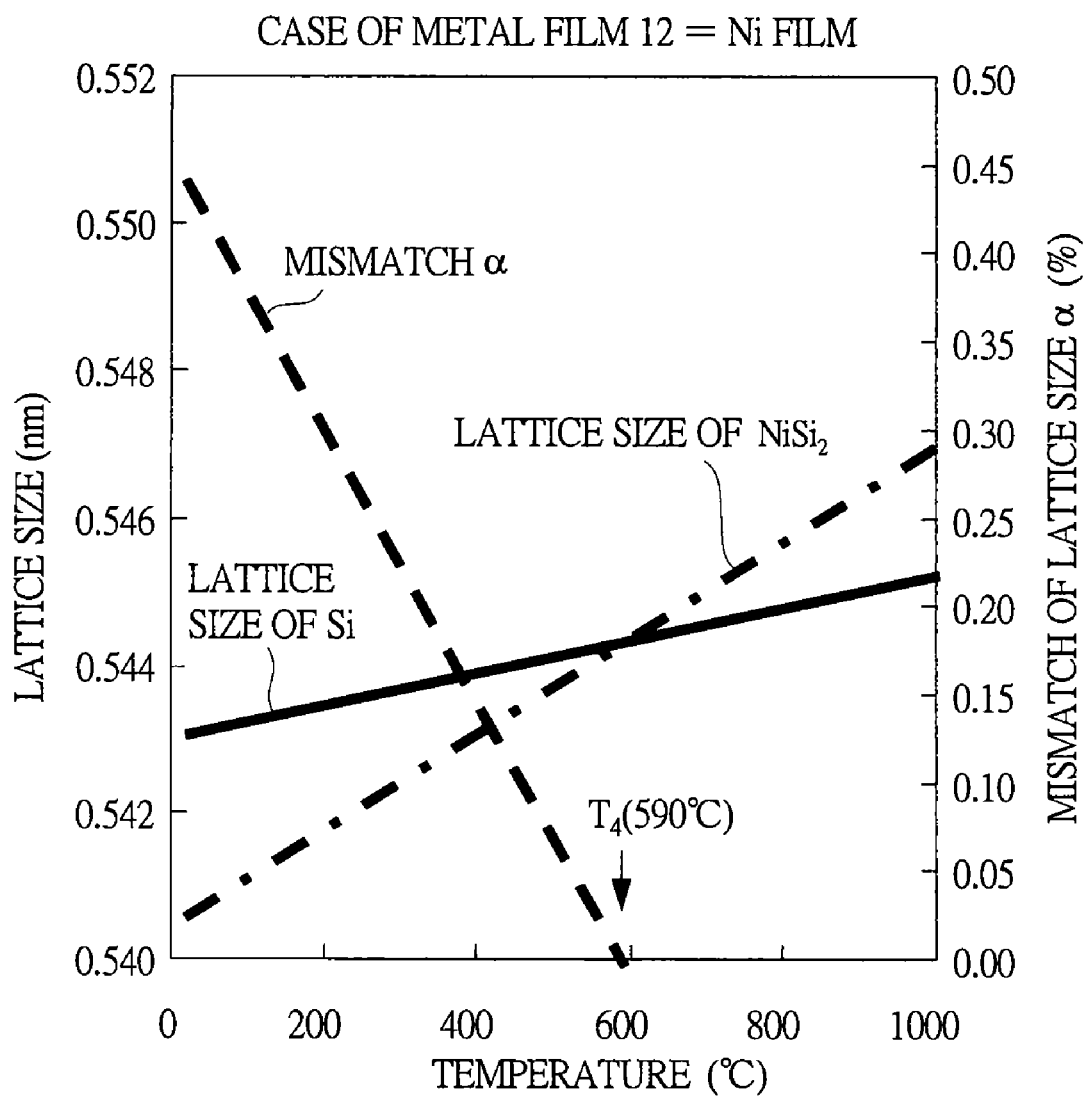
FIG. 24 is a graph showing a temperature dependency of a lattice size of single crystal silicon and that of a lattice size of $NiSi_2$.

FIG. 24 is a graph showing temperature dependence of the lattice size of single crystal silicon (Si) and $NiSi_2$ (nickel disilicide). The horizontal axis of the graph of FIG. 24 corresponds to temperature, and the vertical axis of the graph of FIG. 24 corresponds to the lattice size or mismatch $\alpha$ of lattice size to be mentioned later. In the graph of FIG. 24, the temperature dependence of the lattice size (lattice constant, corresponding to lattice size $L_S$ and length $L_1$ to be mentioned later) of the single crystal silicon (Si) is shown in a solid line, and the temperature dependence of the lattice size (lattice constant, corresponding to lattice size $L_M$ and length $L_2$ to be mentioned later) of $NiSi_2$ (nickel disilicide) is shown in a dash line. Further, the temperature dependence of mismatch $\alpha$ of the lattice size of the single crystal silicon (Si) and the lattice size of $NiSi_2$ (nickel disilicide) is shown in a dotted line.

Both single crystal silicon (Si) and $NiSi_2$ (nickel disilicide) expand with a rise of the temperature, but the line coefficient of expansion (coefficient of thermal expansion) is different between single crystal silicon (Si) and $NiSi_2$ (nickel disilicide). As shown in a graph of FIG. 24, for the lattice size at the room temperature, that of $NiSi_2$ (nickel disilicide) is larger than that of single crystal silicon (Si), but as for the line coefficient of expansion, that of $NiSi_2$ (nickel disilicide) is larger than that of single crystal silicon (Si), and as the temperature is increased from room temperature, the difference between the lattice size of single crystal silicon (Si) and $NiSi_2$ (nickel disilicide) becomes small. And the lattice size (lattice constant) of crystal silicon (Si) and that of $NiSi_2$ (nickel disilicide) become same at temperature $T_4$. Furthermore, when the temperature becomes higher than the temperature $T_4$, the lattice size of NiSi$_2$ (nickel disilicide) becomes larger than that of single crystal silicon (Si). In the case of single crystal silicon (Si) and NiSi$_2$ (nickel disilicide), the temperature $T_4$ at which the lattice sizes thereof become same is about 590° C. ($T_4$=590° C.).

Because the substitution is hard to occur between lattices of Ni and Si even if the second heat treatment of step S5 is carried out, when the lattice size of the semiconductor substrate 1 is far apart from the lattice size of NiSi$_2$ (nickel disilicide), Ni hardly diffuses from the nickel silicide layer of the NiSi phase (metal silicide layer 41) to the semiconductor substrate region (single-crystal silicon region), and the NiSi$_2$ (nickel disilicide) part is hardly generated. However, unlike the present embodiment, when the heat treatment temperature $T_2$ of the second heat treatment of step S5 is the temperature $T_4$ or more ($T_2 \geq T_4$), at the stage when the temperature of the semiconductor substrate 1 reaches the temperature $T_4$ in the second heat treatment of step S5, a state occur where the lattice size of single crystal silicon (Si) forming semiconductor substrate 1 becomes same as the lattice size of NiSi$_2$ (nickel disilicide). At this moment, substitution easily occurs between lattices of Ni and Si, and Ni diffuses from the nickel silicide layer (metal silicide layer 41) to the single crystal silicon region (semiconductor substrate region), and the abnormal growth of NiSi$_2$ (nickel disilicide) is facilitated.

Therefore, in the present embodiment, when the semiconductor substrate 1 is a single crystal silicon (Si) substrate and the metal film 12 is a Ni film, the heat treatment temperature $T_2$ of the second heat treatment of step S5 is made lower than the temperature $T_4$ ($T_2 < T_4$). Thereby, in the case of the second heat treatment of step S5, from the start of the second heat treatment to the end, the lattice size of single crystal silicon (Si) forming the semiconductor substrate 1 is always larger than the lattice size of NiSi$_2$ (nickel disilicide), and thereby, the state where the lattice size of single crystal silicon (Si) forming the semiconductor substrate 1 becomes same as that of NiSi$_2$ (nickel disilicide) does not occur. Therefore, it is possible to suppress or prevent NiSi$_2$ (nickel disilicide) of the NiSi phase from abnormally growing from the nickel silicide layer (metal silicide layer 41) to the channel part, during the second heat treatment of step S5.

As mentioned above, since the temperature $T_4$ at which the lattice size (lattice constant) of NiSi$_2$ (nickel disilicide) becomes same as that of single crystal silicon (Si) is about 590° C. ($T_4$=590° C.), and accordingly, in the case when the semiconductor substrate 1 is a single crystal silicon (Si) substrate and the metal film 12 is a nickel (Ni) film, the heat treatment temperature $T_2$ of the second heat treatment of step S5 is made lower than the temperature $T_4$, namely, 590° C. ($T_2 < T_4$=590° C.).

Next, an applied example of a case where the semiconductor substrate 1 is a single crystal silicon (Si) substrate and the metal film 12 is an alloy film of nickel (Ni) and platinum (Pt), namely, a Ni—Pt alloy film, and the metal silicide layer 41 is a nickel platinum silicide (Ni$_{1-x}$Pt$_x$Si) layer is explained concretely. In this case, the above metal element M becomes Ni and Pt, and, the above MSi becomes Ni$_{1-x}$Pt$_x$Si, and, the above MSi$_2$ becomes Ni$_{1-x}$Pt$_x$Si$_2$.

Figure 25:
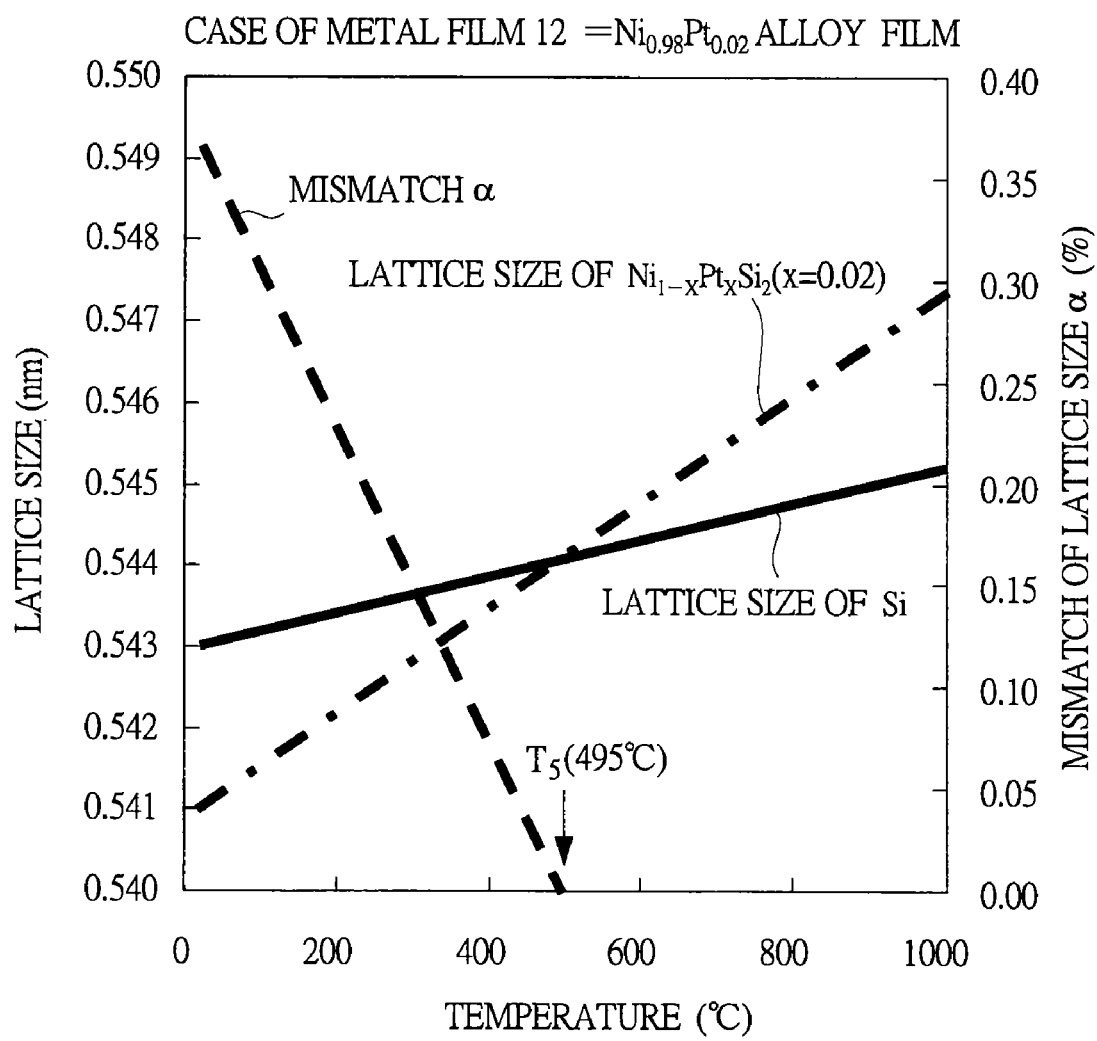
FIG. 25 is a graph showing a temperature dependency of a lattice size of single crystal silicon and that of a lattice size of $Ni_{1-x}Pt_xSi_2$.

FIG. 25 is a graph showing temperature dependence of the lattice size of single crystal silicon (Si) and Ni$_{1-x}$Pt$_x$Si$_2$, and corresponds to the above FIG. 24. The horizontal axis of the graph of FIG. 25 corresponds to temperature, and the vertical axis of the graph of FIG. 25 corresponds to the lattice size or mismatch α of the lattice size to be mentioned later. In the graph of FIG. 25, the temperature dependence of the lattice size (lattice constant, corresponding to lattice size $L_S$ and length $L_1$ to be mentioned later) of the single crystal silicon (Si) is shown in a solid line, and the temperature dependence of the lattice size (lattice constant, corresponding to lattice size $L_M$ and length $L_2$ to be mentioned later) of Ni$_{1-x}$Pt$_x$Si$_2$ is shown in a dash line. Further, the temperature dependence of mismatch α of the lattice size of the single crystal silicon (Si) and the lattice size of Ni$_{1-x}$Pt$_x$Si$_2$ is shown in a dotted line. But, what is shown in the graph of FIG. 25 is the case where x=0.02 in Ni$_{1-x}$Pt$_x$Si$_2$, that is the case where Ni$_{1-x}$Pt$_x$Si$_2$ is Ni$_{0.98}$Pt$_{0.02}$Si$_x$. Thus, the case where x of Ni$_{1-x}$Pt$_x$Si$_x$ becomes x=0.02 corresponds to the case where the ratio of the Pt of the Ni—Pt alloy film forming metal film 12 is 2.0 atomic % (the ratio of Ni is, 98 atomic %), that is, the case where the metal film 12 is a Ni$_{0.98}$Pt$_{0.02}$ alloy film.

The temperature dependence of the lattice size of single crystal silicon (Si) shown in FIG. 25 is same as the temperature dependence of the lattice size of the single crystal silicon (Si) in above FIG. 24. On the other hand, the lattice size (the lattice size at the room temperature) of Ni$_{1-x}$Pt$_x$Si$_2$ can be obtained by use of theorem of Vegard (law of Vegard). For a part of Ni site of NiSi$_2$ (herein, 2% to Ni site) is substituted by Pt, as seen in the comparison of FIG. 24 and FIG. 25, the lattice size (the lattice size at the room temperature) of Ni$_{0.98}$Pt$_{0.02}$Si$_2$ is larger than the lattice size (the lattice size at the room temperature) of NiSi$_2$. And, for example, in the case where Pt content is small, for example, in the case where x in Ni$_{1-x}$Pt$_x$Si$_2$ is about 0.02 (x=0.02), the line coefficient of expansion (coefficient of thermal expansion) of Ni$_{1-x}$Pt$_x$Si$_2$ (that is, Ni$_{0.98}$Pt$_{0.02}$Si$_2$) may be considered to be almost same as the line coefficient of expansion (coefficient of thermal expansion) of NiSi$_2$. The temperature dependence of the lattice size of Ni$_{1-x}$Pt$_x$Si$_2$ obtained in this manner (Ni$_{0.98}$Pt$_{0.02}$Si$_2$ in FIG. 25) is shown in the graph of FIG. 25.

As shown in the graph of FIG. 25, the lattice size at the room temperature of Ni$_{1-x}$Pt$_x$Si$_2$ is larger than that of the single crystal silicon (Si), but the line coefficient of expansion of Ni$_{1-x}$Pt$_x$Si$_2$ is larger than that of the single crystal silicon (Si), and as the temperature is raised from room temperature, the difference of the lattice size of single crystal silicon (Si) and that of Ni$_{1-x}$Pt$_x$Si$_2$ shrinks. And, at the temperature $T_5$, the lattice size of the single crystal silicon (Si) and that of Ni$_{1-x}$Pt$_x$Si$_2$ becomes same, and further, at temperature higher than the temperature $T_5$, the lattice size of Ni$_{1-x}$Pt$_x$Si$_2$ becomes larger than that of the single crystal silicon (Si). In the case when x in Ni$_{1-x}$Pt$_x$Si$_2$ is 0.02 (i.e., in the case of Ni$_{0.98}$Pt$_{0.02}$Si$_2$), the temperature at which the lattice size of the single crystal silicon (Si) and the lattice size Ni$_{1-x}$Pt$_x$Si$_2$ become same is about 495° C. ($T_5$=495° C.).

In the present embodiment, when the semiconductor substrate 1 is a single crystal silicon (Si) substrate and the metal film 12 is a Ni—Pt alloy film, the heat treatment temperature $T_2$ of the second heat treatment of step S5 is made lower than the temperature $T_5$ at which the lattice size of the single crystal silicon (Si) and that of Ni$_{1-x}$Pt$_x$Si$_2$ becomes same ($T_2 < T_5$). Thereby, in the case of the second heat treatment of step S5, from the start of the second heat treatment to the end, the lattice size (lattice constant) of single crystal silicon (Si) forming the semiconductor substrate 1 is always larger than the lattice size of Ni$_{1-x}$Pt$_x$Si$_2$, and thereby, the state where the lattice size of single crystal silicon (Si) forming the semiconductor substrate 1 becomes same as that of Ni$_{1-x}$Pt$_x$Si$_2$ does not occur. Therefore, it is possible to suppress or prevent Ni$_{1-x}$Pt$_x$Si$_2$ from abnormally growing from the Pt containing nickel silicide layer (metal silicide layer 41) of Ni$_{1-x}$Pt$_x$Si phase to the channel part, during the second heat treatment of step S5.

As mentioned above, since the temperature $T_5$ at which the lattice size of the single crystal silicon (Si) and that of $Ni_{1-x}Pt_xSi_2$ becomes same is about 495° C. ($T_5$=495° C.). Therefore, in the case when the semiconductor substrate 1 is a single crystal silicon (Si) substrate and the metal film 12 is a $Ni_{0.98}Pt_{0.02}$ film (an alloy film whose Ni content is 98 atomic % and Pt content is 2.0 atomic % is expressed as $Ni_{0.98}Pt_{0.02}$ film or $Ni_{0.98}Pt_{0.02}$ alloy film), the heat treatment temperature $T_2$ of the second heat treatment of step S5 is made lower than the temperature $T_5$, namely, 495° C. ($T_2<T_5$=495° C.).

Further, even in the case when the semiconductor substrate 1 is a single crystal silicon (Si) substrate, and the metal film 12 is a Ni—Pt alloy film, the temperature $T_5$ mentioned above changes according to the Pt content of the metal film 12. In the case when the Pt content in Ni—Pt alloy film (metal film 12) is 2.0 atomic %, the above temperature $T_5$ is about 495° C., but if the Pt content in Ni—Pt alloy film (metal film 12) is lower than 2.0 atomic %, the above temperature $T_5$ shifts to the higher temperature side than about 495° C., and if the Pt content in Ni—Pt alloy film (metal film 12) is higher than 2.0 atomic %, the above temperature $T_5$ shifts to the lower temperature side than about 495° C.

Furthermore, the above temperature $T_4$ and the above temperature $T_5$ correspond to the above temperature $T_3$. In other words, the temperature $T_3$ at which the lattice size of the semiconductor substrate 1 and that of $MSi_2$ (metal disilicide) in the case where the semiconductor substrate 1 is a single crystal silicon (Si) substrate and the metal film 12 is a nickel (Ni) film become same is the above temperature $T_4$ ($T_3$=$T_4$). Further, the temperature $T_3$ at which the lattice size of semiconductor substrate 1 and that of $MSi_2$ (metal disilicide) in the case where the semiconductor substrate 1 is a single crystal silicon (Si) substrate and the metal film 12 is a Ni—Pt alloy film become same is the above temperature $T_5$ ($T_3$=$T_5$).

Moreover, the above explanations are made with the examples where the metal film 12 is a Ni film and the metal film 12 is a Ni—Pt alloy film, but they are same to the case where the metal film 12 is a Ni—Pd alloy film, a Ni—Y alloy film, a Ni—Yb alloy film, a Ni—Er film, or a Ni-lanthanoid alloy film etc. In other words, in the case when the metal film 12 is $Ni_{1-x}Pt_x$ alloy film, the heat treatment temperature $T_2$ of the second heat treatment of step S5 is made lower than the temperature at which the lattice size of $Ni_{1-x}Pt_xSi_2$ and that of the semiconductor substrate 1 become same, but in the case when the metal film 12 is a $Ni_{1-x}Pt_x$ alloy film, the heat treatment temperature $T_2$ of the second heat treatment of step S5 is made lower than the temperature at which the lattice size of $Ni_{1-x}Pt_xSi_2$ and that of the semiconductor substrate 1 become same. Further, in the case when the metal film 12 is a $Ni_{1-x}Yb_x$ alloy film, the heat treatment temperature $T_2$ of the second heat treatment of step S5 is made lower than the temperature at which the lattice size of $Ni_{1-x}Yb_x$ and that of the semiconductor substrate 1 become same. Furthermore, in the case when the metal film 12 is a $Ni_{1-x}Er_x$ alloy film, the heat treatment temperature $T_2$ of the second heat treatment of step S5 is made lower than the temperature at which the lattice size of $Ni_{1-x}Er_xSi_2$ and the lattice size of the semiconductor substrate 1 become same. Further, in the case where the metal film 12 is $Ni_{1-x}Y_x$ alloy film, the heat treatment temperature $T_2$ of the second heat treatment of step S5 is made lower than the temperature at which the lattice size of $Ni_{1-x}Y_xSi_2$ and that of the semiconductor substrate 1 become same. Further, in the case where the metal film 12 is a $Ni_{1-x}Ln_x$ alloy film (here, Ln: lanthanoid element), the heat treatment temperature $T_2$ of the second heat treatment of step S5 is made lower than the temperature at which the lattice size of $Ni_{1-x}Ln_x$ and that of the semiconductor substrate 1 become same.

In this manner, in the present embodiment, at least, the heat treatment temperature $T_2$ of the second heat treatment of step S5 is made lower than the temperature $T_3$ at which the lattice size of $MSi_2$ and that of the semiconductor substrate 1 becomes same (i.e., mismatch α becomes 0%), ($T_2<T_3$). And further, it is preferable that the difference (modulus) between the lattice size of $MSi_2$ (metal disilicide) at the heat treatment temperature $T_2$ of the second heat treatment of step S5 and the lattice size of the semiconductor substrate 1 is 0.01% or more of the lattice size of the semiconductor substrate 1 (in other words, α≧0.01%), and it is further preferable that the difference is 0.02% or more of the lattice size of the semiconductor substrate 1 (i.e., α≧0.02%).

When the expression by percent of the ratio (rate) of the difference between the lattice size $L_M$ (corresponding to length $L_2$ to be mentioned later) of $MSi_2$ (metal disilicide) and the lattice size $L_S$ (corresponding to length $L_1$ to be mentioned later) of the semiconductor substrate 1 to the lattice size $L_S$ of the semiconductor substrate 1 is defined as mismatch α, this mismatch α is expressed by the following formula.

$$\alpha=[(L_S-L_M)/L_S]\times 100 \text{ (unit in \%)}$$

In the above graphs of FIG. 24 and FIG. 25, the temperature dependence of above mismatch α is shown in a dotted line. In both cases of FIG. 24 and FIG. 25, $L_S$ of the above formula corresponds to the lattice size of single crystal silicon (Si), but, in the case of FIG. 24, $L_M$ of the above formula corresponds to the lattice size of $NiSi_2$, and in the case of FIG. 25, $L_M$ of the above formula corresponds to the lattice size of $Ni_{0.98}Pt_{0.02}Si_2$.

In the case of FIG. 24, since the difference between the lattice size of crystal silicon (Si) and that of $NiSi_2$ become small as the temperature increases from room temperature, the above mismatch α shrinks, and, at temperature $T_4$ (about 590° C.), the lattice size of crystal silicon (Si) and that of $NiSi_2$ becomes same ($L_S$=$L_M$), and the above mismatch α becomes zero % (α=0%). On the other hand, in the case of FIG. 25, since the difference between the lattice size of crystal silicon (Si) and the lattice size of $Ni_{0.98}Pt_{0.02}Si_2$ become small as the temperature increases from room temperature, the above mismatch a shrinks, and, at temperature $T_5$ (about 495° C.), the lattice size of crystal silicon (Si) and the lattice size of $Ni_{0.98}Pt_{0.02}Si_2$ become same ($L_S$=$L_M$), and the above mismatch α becomes zero % (α=0%).

During the second heat treatment of step S5, not only by preventing the state where the lattice size of the semiconductor substrate 1 and that of $MSi_2$ become same, but also by maintaining the state where the difference between the lattice size of the semiconductor substrate 1 and the lattice size of $MSi_2$ large to some extent, it is possible to suppress the diffusion of the metal element M from the metal silicide layer 41 of the MSi phase to the semiconductor substrate region more properly or precisely, and prevent the abnormal growth of $MSi_2$ to the channel part more properly or precisely. Therefore, it is preferable that the above mismatch α in the heat treatment temperature $T_2$ of the second heat treatment of step S5 is larger than zero % (α>0%), but it is further preferable 0.01% or more (α≧0.01%), and it is furthermore preferable 0.02% or more (α≧0). Therefore, when the temperature at which the above mismatch α becomes 0.01% is defined as temperature $T_6$, and the temperature at which the above mismatch ay becomes 0.02% is defined as temperature $T_7$, it is preferable that the heat treatment temperature $T_2$ of the second heat treatment of step S5 is lower than the temperature $T_6$ at which the above mismatch α becomes 0.01% ($T_2≦T_6$), and lower than the temperature $T_7$ at which the above mismatch α becomes 0.02% ($T_2≦T_7$). Thereby, in the second heat treatment of step S5, since the difference between the lattice size of the semiconductor substrate 1 and that of $MSi_2$ is large to some extent, it is possible to suppress the diffusion of the metal element M from metal silicide layer 41 of the MSi phase to the semiconductor substrate region more properly or precisely, and it is possible to prevent the abnormal growth of $MSi_2$ to the channel part more properly or precisely.

In the case when the semiconductor substrate 1 is a single crystal silicon (Si) substrate and the metal film 12 is a nickel (Ni) film as shown in the graph of FIG. 24, namely, in the case when the metal silicide layer 41 is a nickel silicide (NiSi) layer, the temperature $T_6$ at which the above mismatch α becomes 0.01% is about 575° C. ($T_6$=575° C.), and the temperature $T_7$ at which the above mismatch α becomes 0.02% is about 560° C. ($T_7$=560° C.). Therefore, in the case when the semiconductor substrate 1 is a single crystal silicon (Si) substrate and the metal film 12 is a nickel (Ni) film, the heat treatment temperature $T_2$ of the second heat treatment of step S5 is at least made the temperature $T_4$ or lower (about 590° C.) at which the above mismatch α becomes zero %, but it is preferable that it is lower than the temperature $T_6$ at which the above mismatch ac becomes 0.01%, that is, about 575° C. or lower ($T_2 \leq T_6$=575° C.) And it is further preferable that the heat treatment temperature $T_2$ of the second heat treatment of step S5 is lower than the temperature $T_7$ at which the above mismatch α becomes 0.02%, that is, about 560° C. or lower ($T_2 \leq T_7$=560° C.).

Further, In the case when the semiconductor substrate 1 is a single crystal silicon (Si) substrate and the metal film 12 is a $Ni_{0.98}Pt_{0.02}$ alloy film as shown in the graph of FIG. 25, namely, in the case when the metal silicide layer 41 is a $Ni_{0.98}Pt_{0.02}Si$ alloy layer, the temperature $T_6$ at which the above mismatch α becomes 0.01% is about 480° C. ($T_6$=480° C.), and the temperature $T_7$ at which the above mismatch α becomes 0.02% is about 470° C. ($T_7$=470° C.). Therefore, in the case when the semiconductor substrate 1 is a single crystal silicon (Si) substrate and the metal film 12 is a $Ni_{0.98}Pt_{0.02}$ alloy film, the heat treatment temperature $T_2$ of the second heat treatment of step S5 is at least made the temperature $T_5$ or lower (about 495° C.) at which the above mismatch α becomes zero %, but it is preferable that it is lower than the temperature $T_6$ at which the above mismatch α becomes 0.01%, that is, about 480° C. or lower ($T_2 \leq T_6$=480° C.). And it is further preferable that the heat treatment temperature $T_2$ of the second heat treatment of step S5 is lower than the temperature $T_7$ at which the above mismatch α becomes 0.02%, that is, about 470° C. or lower ($T_2 \leq T_7$=470° C.).

Figure 26:
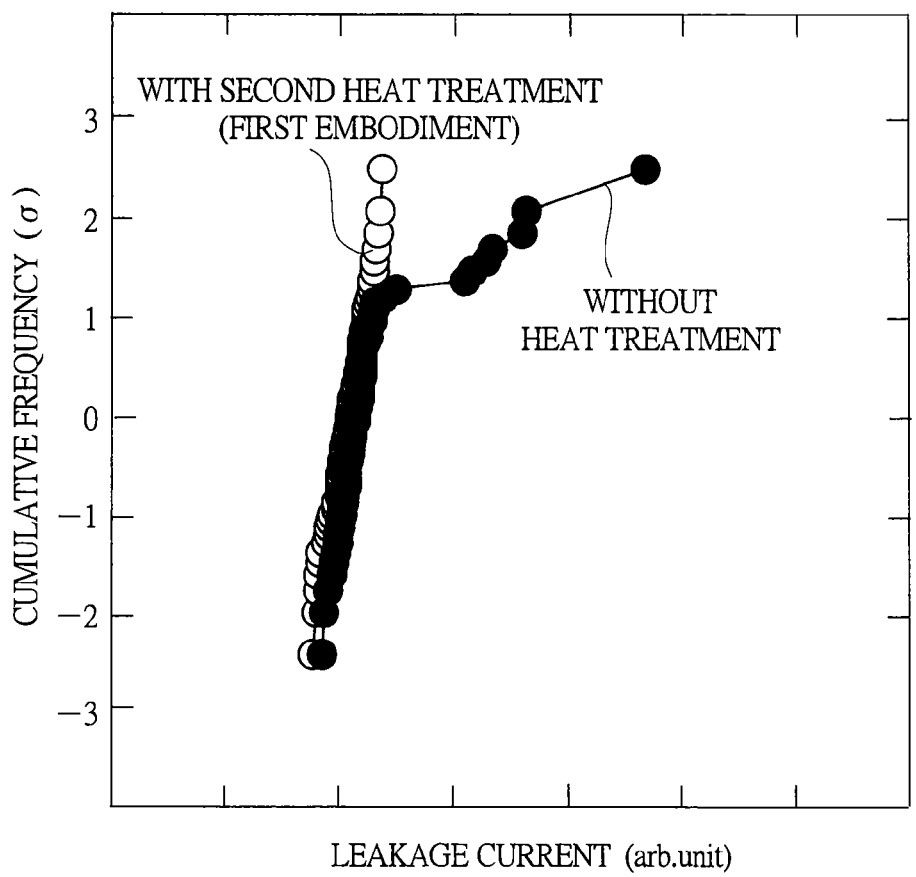
FIG. 26 is a graph showing leakage current distributions in the case where a nickel silicide layer is formed by performing a second heat treatment and the case where a nickel silicide layer is formed without performing the second heat treatment.

FIG. 26 is a graph showing the distribution (unevenness) of leakage current. In FIG. 26, there are shown the case where the nickel silicide layer (corresponding to the metal silicide layer 41) according to steps S1 to S5 of the present embodiment is formed (in FIG. 26, shown in a white circle as "with the second heat treatment"), and the case where the nickel silicide layer (corresponding to the metal silicide layer 41) is formed differently from the present embodiment and by omitting the second heat treatment of step S5 (in FIG. 26, shown in a black circle as "without the second heat treatment"). Further, the graph of FIG. 26 shows the case where a Ni film is formed on the n+ type silicon region and a nickel silicide layer is formed, and the heat treatment temperature $T_2$ of the second heat treatment is set 550° C. The horizontal axis of the graph of FIG. 26 corresponds to the leakage current value (arbitrary unit: optional unit), and the vertical axis of the graph of FIG. 26 corresponds to the probability distribution (cumulative frequency).

When the second heat treatment of step S5 is omitted differently from the present embodiment, it is thought that the nickel silicide layer (metal silicide layer 41) becomes unstable NiSi(MSi) phase, and as shown in the graph of FIG. 26, it becomes very likely that leakage currents increase. The increase of such a leakage current is more apparent in the case when a Ni film is formed on the n+ type silicon region and the nickel silicide layer is formed, than in the case when a Ni film is formed on the p+ type silicon region and the nickel silicide layer is formed, and this is thought because, as seen from the above FIG. 23, the temperature at which the NiSi layer is formed is higher in the n+ type silicon region than in the p+ type silicon region, and the formed NiSi layer easily becomes unstable.

In contrast, when the second heat treatment of step S5 is carried out as in the present embodiment, the composition in the nickel silicide layer (metal silicide layer 41) is made uniform, and the composition ratio of Ni (metal element M) and Si in the nickel silicide layer (metal silicide layer 41) becomes close to the stoichiometry ratio of 1:1, and the nickel silicide layer (metal silicide layer 41) can be stabilized. By stabilizing the nickel silicide layer (metal silicide layer 41) by the second heat treatment of step S5, as shown in the graph of FIG. 26, it is possible to prevent leakage currents from increasing. Therefore, it is possible to prevent property fluctuation per every MISFET, and improve the performance of the semiconductor device.

Figure 27:
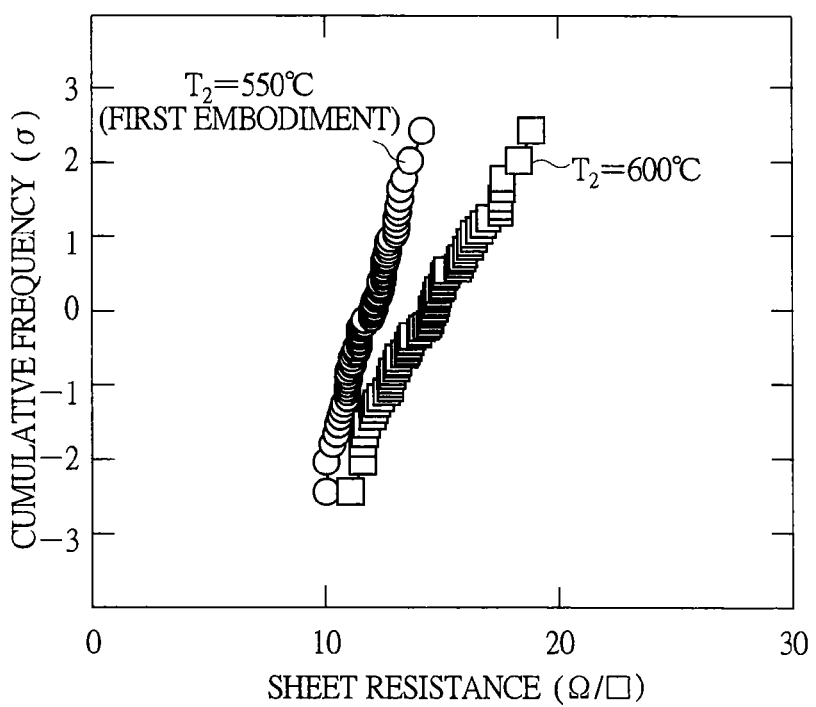
FIG. 27 is a graph showing a distribution of sheet resistance of the nickel silicide layer.

FIG. 27 is a graph showing the distribution (unevenness) of the sheet resistance of the nickel silicide layer formed according to steps S1-S5 of the present embodiment (corresponding to the metal silicide layer 41). Further, the graph of FIG. 27 shows the case where a Ni film is formed on the p+ type silicon region to form and a nickel silicide layer. The horizontal axis of the graph of FIG. 27 corresponds to sheet resistance value, and the vertical axis of the graph of FIG. 27 corresponds to probability distribution (cumulative frequency). Further, in the graph of FIG. 27, the case where the heat treatment temperature $T_2$ of the second heat treatment of step S5 is set at 550° C. (shown in a circle in the graph of FIG. 27), and the case where it is set at 600° C. (shown in a square in the graph of FIG. 27) are shown.

As mentioned above, the temperature $T_4$ at which the lattice size of $NiSi_2$ becomes same as that of single crystal silicon (Si) is about 590° C. ($T_4$=590° C.). Therefore, the case where the heat treatment temperature $T_2$ of the second heat treatment of step S5 shown in the graph of FIG. 27 is set at 550° C. corresponds to the case where the heat treatment temperature $T_2$ of the second heat treatment of the step S5 is made lower than the temperature $T_4$ ($T_3$) at which the lattice size of $NiSi_2$ ($MSi_2$) and that of the semiconductor substrate 1 become same like the present embodiment ($T_2 < T_4$, that is, $T_2 < T_3$) (the case where the heat treatment temperature $T_2$ of the second heat treatment of step S5 is made slightly lower than the $T_7$). On the other hand, the case where the heat treatment temperature $T_2$ of the second heat treatment of step S5 shown in the graph of FIG. 27 is set at 600° C., different from the present embodiment, corresponds to the case where the heat treatment temperature $T_2$ of the second heat treatment of step S5 is made higher than the temperature $T_4$ ($T_3$) at which the lattice size of $NiSi_2$ ($MSi_2$) and that of the semiconductor substrate 1 become same ($T_2 > T_4$, that is, $T_2 > T_3$).

As is seen from the graph of FIG. 27, the unevenness of the sheet resistance value of the nickel silicide layer is smaller in the case when the heat treatment temperature $T_2$ of the second heat treatment of step S5 is set at 550° C., than in the case it is set at 600° C. In other words, the ratio of the nickel silicide layer becoming high resistant (high seat resistant) is higher in the case when the heat treatment temperature $T_2$ of the second heat treatment of step S5 is set 550° C., than in the case it is set at 600° C.

This reason is thought as follows. That is, in the case when the heat treatment temperature $T_2$ of the second heat treatment of step S5 is set 600° C., the heat treatment temperature $T_2$ of the second heat treatment of step S5 becomes higher than the temperature $T_4$ ($T_3$) at which the lattice size of NiSi$_2$ (MSi$_2$) becomes same as that of the semiconductor substrate 1, and the possibility is high that high resistant NuSi$_2$ part occurs in the nickel silicide layer (corresponding to the metal silicide layer 41) during the second heat treatment of step S5, and the sheet resistance becomes high. In contrast, it is thought that in the case when the heat treatment temperature $T_2$ of the second heat treatment of step S5 is set at 550° C., the heat treatment temperature $T_2$ of the second heat treatment of step S5 becomes lower than the temperature $T_4$ ($T_3$) at which the lattice size of NiSi$_2$ (MSi$_2$) becomes same as that of the semiconductor substrate 1, even if the second heat treatment of step S5 is carried out, the formation of high resistant NiSi$_2$ part is suppressed or prevented in the nickel silicide layer (corresponding to the metal silicide layer 41).

In the present embodiment, the heat treatment temperature $T_2$ of the second heat treatment of step S5 is made lower than the temperature $T_3$ ($T_4$) at which the lattice size of MSi$_2$ (NiSi$_2$) becomes same as that of the semiconductor substrate 1 ($T_2<T_3$), and thereby it is possible to suppress or prevent MSi$_2$ part (NiSi$_2$ part) from occurring in the metal silicide layer 41. Therefore, it is possible not only to make the resistance of the metal silicide layer 41 the resistance value of the low resistant MSi phase, but also to reduce the unevenness of the resistance of each metal silicide layer 41. Therefore, when a plurality of MISFETs are formed in the semiconductor substrate 1, and the metal silicide layer 41 is formed in each MISFET, it is possible to equalize the resistance of the metal silicide layer 41 of each MISFET, and prevent the changes of the characteristics of the MISFET. Therefore, it is possible to improve the performance of the semiconductor device.

Thus, in the present embodiment, the heat treatment temperature $T_2$ of the second heat treatment of step S5 is made lower than the temperature $T_3$ at which the lattice size of MSi$_2$ and the lattice size of semiconductor substrate 1 becomes same (i.e., the above mismatch α becomes 0%) ($T_2<T_3$), and preferably, lower than the temperature $T_6$ at which the above mismatch α becomes 0.01% ($T_2 \leq T_6$), and further preferably, lower than the temperature $T_7$ at which the above mismatch α becomes 0.02% ($T_2 \leq T_7$). Thereby, it is possible to suppress or prevent the abnormal growth of MSi$_2$ such as NiSi$_2$ abnormal growth region 141c shown in the above FIG. 22, which has been confirmed by the experiments (the cross-sectional observation of the semiconductor device and the composition analysis of the cross section) of the present inventors. Further, it is possible to suppress or prevent the increase of the leakage current between the source/drain of a MISFET caused by the abnormal growth of MSi$_2$ and increase of the diffusion resistance of the source/drain region. Further, in the present embodiment, by performing the second heat treatment of step S5, it is possible to stabilize the metal silicide layer 41, to prevent the property fluctuation (property fluctuation per every MISFET) of the MISFET. Therefore, it is possible to improve the performance of the semiconductor device.

Further, in the present embodiment, the first heat treatment of step S3 is performed in the state where the barrier film 13 is formed, and the metal film 12 is reacted with substrate regions and the like, and the metal silicide layer 41 of the MSi phase is formed, but, as mentioned above, it is preferable that the barrier film 13 is a film to cause tensile stress to the semiconductor substrate. In other words, as the film stress (stress of film itself), the compression stress (the compression stress, for example, about 2 GPa (Giga Pascal) in the case of the titanium nitride film which is formed by sputtering method) works, and the barrier film 13 causes tensile stress to the semiconductor substrate 1 (active region forming a MISFET) by action/reaction. It is a titanium nitride (TiN) film or a titanium (Ti) film that is preferable as a film (herein, the barrier film 13) that causes such tensile stress to the semiconductor substrate 1.

The direction and size of the stress that the barrier film 13 causes to the semiconductor substrate 1 depend on not only the materials of the film but also the film formation method. In the case when the barrier film 13 is a titanium nitride (TiN) film, if it is formed by plasma CVD method, there is a possibility that the barrier film 13 causes compression stress to the semiconductor substrate 1, but by forming the same by sputtering method (PVD method: Physical Vapor Deposition), it is possible to make the barrier film 13 a film to cause tensile stress to the semiconductor substrate 1. On the other hand, in the case when the barrier film 13 is a titanium (Ti) film, if it is formed by sputtering method, there is a possibility that the barrier film 13 causes compression stress to the semiconductor substrate 1, but by forming the same by plasma CVD method, it is possible to make the barrier film 13 a film to cause tensile stress to the semiconductor substrate 1. Therefore, it is preferable that, in the case when the barrier film 13 is a titanium nitride (TiN) film, the same is formed by the sputtering method (PVD method), and in the case when the barrier film 13 is a titanium (Ti) film, the same is formed by the plasma CVD method.

Furthermore, the direction and size of the stress that barrier film 13 causes to the semiconductor substrate 1 depend on the film formation temperature, too. In the case when the barrier film 13 is a titanium nitride (TiN) film which is formed by use of the sputtering method (PVD method), as the film formation temperature is low, so the tensile stress that the barrier film 13 causes to the semiconductor substrate 1 becomes large, and on the contrary, when the film formation temperature is too high, there is a possibility that the barrier film 13 causes compression stress to the semiconductor substrate 1. Therefore, it is preferable that, in the case when the barrier film 13 is a titanium nitride (TiN) film that is formed by use of the sputtering method (PVD method), the film formation temperature (substrate temperature) of the barrier film 13 is 300° C. or lower, and thereby, it is possible to make the barrier film 13 a film that causes tensile stress to the semiconductor substrate 1 properly or precisely. Further, the film formation temperature (substrate temperature) may be made less than room temperature by arranging a cooling system to a film-deposition apparatus.

On the other hand, in the case when the barrier film 13 is a titanium (Ti) film that is formed by use of the plasma CVD method, as the film formation temperature is low, so the tensile stress that the barrier film 13 causes to the semiconductor substrate 1 becomes large, and on the contrary, when the film formation temperature is too high, there is a possibility that the barrier film 13 causes compression stress to the semiconductor substrate 1. Further, when the film formation temperature is too high, there is a possibility that the metal film 12 and (silicon forming) the gate electrodes 8a, 8b, the n$^+$ type semiconductor regions 9b and the p$^+$ type semiconductor regions 10b react excessively, in formation of the barrier film 13. Therefore, in the case when barrier film 13 is a titanium (Ti) film which is formed by use of the plasma CVD method, it is preferable that the film formation temperature (substrate temperature) of the barrier film 13 is 450° C. or lower.

Thereby, it is possible to make the barrier film 13 a film that causes tensile stress to the semiconductor substrate 1 properly or precisely, and also it is possible to suppress or prevent the metal film 12 and (silicon forming) the gate electrodes 8a, 8b, the n+ type semiconductor regions 9b and the p+ type semiconductor regions 10b from reacting excessively.

Further, it is possible to make a tantalum nitride (TaN) film or a tantalum (Ta) film a film that causes tensile stress to the semiconductor substrate 1, and to use the same as the barrier film 13. But when a tantalum nitride (TaN) film or a tantalum (Ta) film is used, there is a need to use hydrofluoric acid (HF) in the wet cleaning process of step S4, and there is a possibility that other portions than the barrier film 13 and the metal film 12 may be etched at the moment of wet cleaning. Therefore, it is preferable to use a titanium nitride (TiN) film a titanium (Ti) film that can be removed in the wet cleaning process of step S4 more easily than a tantalum nitride (TaN) film and a tantalum (Ta) film, as the barrier film 13.

Furthermore, it is preferable that the barrier film 13 is a film which hardly reacts with the metal film 12, and a film which does not react with the metal film 12 even if the first heat treatment of step S3 is carried out. When the barrier film 13 reacts with the metal film 12 in the first heat treatment of step S3, there is a possibility that the formation of the metal silicide layer 41 is obstructed, and the composition of the metal silicide layer 41 may change. In the present embodiment, by making the barrier film 13 a film that hardly reacts with the metal film 12, it is possible to prevent the metal film 12 and the barrier film 13 from reacting in the first heat treatment of step S3, and it is possible to form the metal silicide layer 41 in the first heat treatment of step S3 properly or precisely. As such a barrier film 13 as hardly reacts with the metal film 12, a titanium nitride (TiN) film and a titanium (Ti) film are preferable.

Moreover, when the thickness of the formed metal silicide layer 41 is too large, it may cause the increase of the leakage current, and, further, it becomes disadvantageous to the scaling of the MISFET. Therefore, in the present embodiment, it is preferable that the film thickness of the metal film 12 is not made too large. In other words, in the present embodiment, it is preferable that the film thickness (the deposition film thickness, the thickness perpendicular to the main surface of the semiconductor substrate 1) of the metal film 12 to be formed at step S1 is 15 nm or smaller. Further, when the metal film 12 is too small, the thickness of the metal silicide layer 41 becomes too thin, and the diffusion resistance increases. Therefore, the film thickness (the deposition film thickness, the thickness perpendicular to the main surface of the semiconductor substrate 1) of the metal film 12 to be formed at step S1 is preferably is 3 to 15 nm, and further preferably 6 to 12 nm, and it may be, for example, 9 nm.

Further, in the case when the metal film 12 is formed in the state where there is a natural oxide film on the surface of the semiconductor substrate 1 (the surface of gate electrodes 8a, 8b, n+ type semiconductor region 9b and surface of p+ type semiconductor region 10b), this natural oxide film obstructs the reaction of the metal film 12 and the silicon (silicon of gate electrodes 8a, 8b, n+ type semiconductor region 9b and p+ type semiconductor region 10b). Therefore, in the case when the metal film 12 is formed in the state where there is a natural oxide film on the surface of the semiconductor substrate 1, it is necessary to form the metal film 12 thick so that the metal element M of metal film 12 should easily diffuse in the silicon region (gate electrodes 8a, 8b, n+ type semiconductor region 9b and p+ type semiconductor region 10b), but, in the present embodiment, it is better not to make the metal film 12 too thick as mentioned above. Therefore, in the present embodiment, it is preferable to form the metal film 12 in a state where there is not a natural oxide film on the semiconductor substrate 1 surface (gate electrodes 8a, 8b, n+ type semiconductor region 9b and appearance of p+ type semiconductor region 10b). Therefore, dry cleaning process (corresponding to the step P2 in the above FIG. 11) is carried out on the surface of the gate electrodes 8a, 8b, the n+ type semiconductor region 9b and the p+ type semiconductor region 10b of the main surface of semiconductor substrate 1, the natural oxide film is removed from their surface, and thereafter, it is preferable to perform the step S1(deposition process of the metal film 12) and the step S2 (deposition process of the barrier film 13) without exposing the semiconductor substrate 1 to the atmosphere (oxygen containing atmosphere). Thereby, it is possible to form the metal film 12 in a state without a natural oxide film, and even if the metal film 12 is not thick, it is possible to form the metal silicide layer 41 comprising MSi properly or precisely. Therefore, it is possible to prevent the thickness of the metal silicide layer 41 from becoming too large and prevent leakage currents from increasing. Further, it is advantageous to the scaling of the MISFET.

Further, in the present embodiment, as mentioned above, heat treatment at 150 to 400° C. aimed at removing a product generated in the dry cleaning processing (treatment) (process P3 in FIG. 11) is carried out on the semiconductor substrate 1, between the process of the dry cleaning process (process P2 of FIG. 11) and the process to deposit the metal film 12 on the main surface of the semiconductor substrate 1 (step S1 in FIG. 9, that is, process P2 in FIG. 11). Therefore, self-alignment reaction of the metal film 12 deposited on the main surface of the semiconductor substrate 1 (reaction of M+Si→MSi by the first heat treatment of step S3) is not obstructed by the above product, and takes place on the surface of the gate electrodes 8a, 8b, the n+ type semiconductor region 9b and the p+ type semiconductor region 10b uniformly, it is possible to obtain the metal silicide layer 41 of little unevenness of the electrical resistance.

Furthermore, heat treatment aimed at removing a product generated at the moment of dry cleaning processing (process P3 in FIG. 11) is carried out between the dry cleaning processing process (process P2 in the above FIG. 11) and the metal film 12 deposition process(step S1 in FIG. 9, process P5 in FIG. 11), and accordingly, self-alignment reaction of the metal film 12 is not obstructed by the above product, and even if the metal film 12 is not thick, it is possible to form the metal silicide layer 41 comprising MSi properly or precisely. Therefore, it is possible to prevent the thickness of the metal silicide layer 41 from becoming too large and prevent leakage currents from increasing. Further, it is advantageous to the scaling of the MISFET.

In the present embodiment, in the process forming the metal silicide layer 41 on the surface of the gate electrodes 8a, 8b, the n+ type semiconductor region 9b, the p+ type semiconductor region 10b, by the dry cleaning processing (treatment), the product remaining on the main surface of the semiconductor substrate 1 is removed by heat treatment of the temperature that is higher than 150° C. Therefore, self-alignment reaction of the silicon (single crystal silicon forming the semiconductor substrate 1 on which the n-type polycrystalline silicon forming the gate electrode 8a, the p-type polycrystalline silicon forming the gate electrode 8b, the n+ type semiconductor region 9b, the p+ type semiconductor region 10b) and the metal film 12 takes place uniformly without being obstructed by the product, and it is possible to obtain the metal silicide layer 41 of little unevenness of the electrical resistance.

Further, in the present embodiment, the metal silicide layer 41 is remained in MSi (metal monosilicide) phase to the production end of the semiconductor device (for example, to the stage to make the semiconductor substrate 1 into unit pieces by dicing or the like to form semiconductor chips). This is because, in a produced semiconductor device, by making the metal silicide layer 41 the MSi phase of the lower resistivity than $MSi_2$ phase and $M_2Si$ phase, and thereby it is possible to make the metal silicide layer 41 low resistant, and reduce the contact resistance and the diffusion resistance of the source/drain, and improve the performance of a semiconductor device on which a MISFET is formed. Therefore, the present embodiment has an advantageous effect when applied to the case where the metal silicide layer 41 is formed by, as the first condition, the metal silicide where MSi (metal monosilicide) phase is lower resistivity than $MSi_2$ (metal disilicide) phase and $M_2Si$ (dimetal silicide) phase.

Furthermore, in the present embodiment, it is possible to form the metal silicide layer 41 of the MSi phase while suppressing or preventing the abnormal growth of $MSi_2$, and accordingly the present embodiment has an advantageous effect when applied to the case where the metal silicide layer 41 is formed by, as the second condition, the silicide where there can be a $MSi_2$ (metal disilicide) phase.

Moreover, in the present embodiment, it is possible to form the metal silicide layer 41 of the MSi phase while suppressing or preventing unnecessary (excessive) diffusion (movement) of metal element M by the heat treatment process and suppressing or preventing the abnormal growth of $MSi_2$, and accordingly the present embodiment has an advantageous effect when applied to the case where not Si (silicon) but metal element M becomes diffusion species in the metal silicide formation.

In condition of these first through third conditions, when the present embodiment is applied to the case where the metal film 12 is a Ni film or a Ni alloy film, especially a Ni (nickel) film, a Ni—Pt (nickel platinum) alloy film, a Ni—Pd (nickel-paradium) alloy film, a Ni—Y (nickel-yttrium) alloy film, a Ni—Yb (nickel-ytterbium) alloy film, or a Ni—Er (nickel-erbium) alloy film, its effect is large. If the metal film 12 is a Ni film, a Ni—Pt alloy film, a Ni—Pd alloy film, a N—Y alloy film, a Ni—Yb alloy film, a Ni—Er alloy film, or a Ni-lanthanoid alloy film, not Si (silicon) but metal element M becomes diffusion species at the moment of the metal silicide formation, and there is a $MSi_2$ phase, and a MSi phase becomes lower resistivity than the $MSi_2$ phase and the $M_2Si$ phase. But, the problem of the abnormal growth of $MSi_2$ from the metal silicide layer to the channel part and the problem of increase of resistance unevenness by formation of $MSi_2$ part in the metal silicide layer also take place in the case where the metal film 12 is any of a Ni film, a Ni—Pt alloy film, a Ni—Pd alloy film, a Ni—Y alloy film, a Ni—Yb alloy film, a Ni—Er alloy film, or a Ni-lanthanoid alloy film, but the problems take place most conspicuously in the case when the metal film 12 is a Ni (nickel) film. Therefore, when the present embodiment is applied to the case when the metal film 12 is a Ni (nickel) film, its effect is largest. This is same to the following embodiments, too.

Further, the $NiSi_2$ (nickel disilicide) abnormal growth region 141c from the NiSi layer 141b to the channel part as shown in the above FIG. 22 is formed more in an n-channel type MISFET than a p-channel type MISFET. As seen from the above FIG. 23, the reaction of Ni and the Si advances at lower temperature, in the p-type silicon region than the n-type silicon region, and it is thought that Ni diffuses more easily in the p-type silicon region than in the n-type silicon region. Therefore, the $NiSi_2$ abnormal growth region 141c is easy to occur in the p-type well 5 where Ni is easy to scatter than in the n-type well 6. Therefore, the effect to prevent the abnormal growth of $MSi_2$ from metal silicide layer 41 to the channel part, when the present embodiment is applied, becomes larger in n-channel type MISFET Qn than p-channel type MISFET Qp. This is same to the following embodiments, too.

Furthermore, as already explained in conjunction with the above FIG. 27, the sheet resistance of the nickel silicide layer easily fluctuates more in the case where a Ni film is formed on a p-type silicon region and a nickel silicide film is formed by heat treatment, than in the case where a Ni film is formed on an n-type silicon region and a nickel silicide film is formed by heat treatment. This is also thought because Ni diffuses more easily in a p-type region than in an n-type region, and the reaction of Ni and the Si is easy to advance, a $NiSi_2$ part of high resistance easily takes place in the nickel silicide layer of a formed NiSi phase. Therefore, when the present embodiment is applied, the effect to reduce unevenness of the resistance of the metal silicide layer 41 becomes larger in p-channel type MISFET Qp than in n-channel type MISFET Qn. This is same to the following embodiments, too.

Moreover, in the present embodiment, the case where the metal silicide layer 41 is formed on semiconductor regions (9b, 10b) for source or drain and on the gate electrodes (8a, 8b) has been explained, but as another embodiment, the metal silicide layer 41 may not be formed on the gate electrodes 8a, 8b, but the metal silicide layer 41 may be formed on the semiconductor regions for source or drain (herein, on the $n^+$ type semiconductor region 9b, and $p^+$ type semiconductor region 10b). This is same to the following embodiments, too.

Further, in the present embodiment, as a most preferred embodiment, the case where the metal silicide layer 41 is formed on semiconductor regions for source or drain (herein, the $n^+$ type semiconductor region 9b, and the $p^+$ type semiconductor region 10b) formed on the semiconductor substrate 1 has been explained, but as other embodiment, the metal silicide layer 41 may be formed on other semiconductor regions than source or drain formed on the semiconductor substrate 1 in the same manner as in the present embodiment. In that case too, by using the metal silicide layer 41 formation method according to the present invention, it is possible to prevent $MSi_2$ part from being formed in the formed metal silicide layer, and reduce the unevenness of the resistance of metal silicide layer. But as the present invention, in the case where the metal silicide layer 41 is formed on semiconductor regions for source or drain (herein, the $n^+$ type semiconductor region 9b, and the $p^+$ type semiconductor region 10b) formed on the semiconductor substrate 1, it is possible to prevent $MSi_2$ part from being formed in the formed metal silicide layer 41, and reduce the unevenness of the resistance of metal silicide layer 41, and further it is possible to prevent the abnormal growth of $MSi_2$ part to the channel part, therefore, the effect is extremely large.

Furthermore, in the present embodiment, the metal element M forming the metal film 12 (for example, Ni) diffuses to the semiconductor regions for source or drain (herein, the $n^+$ type semiconductor region 9b, and the $p^+$ type semiconductor region 10b) and forms the metal silicide layer 41 comprising MSi. Therefore, it is preferable that the semiconductor substrate 1 is structured of silicon (Si) containing material, and for example, it may be made of single crystal silicon, silicon doped with impurities, polycrystalline silicon, amorphous silicon, silicon germanium ($Si_xGe_{1-x}$, herein $0<x<1$) or carbon doped silicon ($Si_xC_{1-x}$, herein $0.5<x<1$), but it is most preferable if it is made of single crystal silicon. Further, one where a silicon (Si) containing material layer is formed on an insulation substrate, like a SOI (Silicon On Insulator) substrate, may be used as the semiconductor substrate 1. This is same to the following embodiments, too.

Moreover, the present embodiment brings about a large effect when applied to the case where the device isolation region 4 causes compression stress to the semiconductor substrate 1 (the active region prescribed by the device isolation region 4, and the active region, where a MISFET is formed). This is same to the following embodiments, too. The reason is as follows.

When the device isolation region 4 causes compression stress to the semiconductor substrate 1, this compression stress lowers the lattice size of the semiconductor substrate 1 (active region), and acts to make the same close to the lattice size of $MSi_2$. Therefore, when the heat treatment is performed in the state where compression stress caused by the device isolation region 4 occurs in the semiconductor substrate 1, the lattice size of the semiconductor substrate 1 shrinks due to the compression stress and the heat treatment is carried out in the state where the lattice size is close to the lattice size of $MSi_2$, and the metal element M easily diffuses (moves) during the heat treatment, thereby the abnormal growth of $MSi_2$ from the metal silicide layer 41 to the channel part is likely to occur.

In contrast, in the present embodiment, the barrier film 13 which is the film to cause tensile stress to the semiconductor substrate 1 is formed on the metal film 12, and the first heat treatment of step S3 is carried out, and the metal film 12 and the silicon region (the gate electrodes 8a, 8b, the $n^+$ type semiconductor region 9b and the $p^+$ type semiconductor region 10b) are reacted to form the metal silicide layer 41 of the MSi phase is formed. Therefore, the barrier film 13 works to offset the compression stress (the compression stress that the device isolation region 4 acts on the active region forming a MISFET) caused by the device isolation region 4. By tensile stress of barrier film 13, it is possible to suppress or prevent the compression stress to be caused by the device isolation region 4 from lowering the lattice size of the semiconductor substrate 1, and accordingly, it is possible to suppress or prevent the abnormal growth of $MSi_2$ from the metal silicide layer 41 to the channel part at the moment of the first heat treatment of step S3.

Furthermore, in the present embodiment, the heat treatment temperature $T_2$ of the second heat treatment of step S5 is set at the temperature less than the temperature $T_3$ at which the lattice size of the semiconductor substrate 1 becomes same as that of $MSi_2$ (i.e., the above mismatch α becomes 0%) ($T_2 < T_3$), preferably lower than the temperature $T_6$ at which the above mismatch α becomes 0.01% ($T_2 \leq T_6$), and further preferably lower than the temperature $T_7$ at which the above mismatch α becomes 0.02% ($T_2 \leq T_7$). Therefore, even if the compression stress caused by the device isolation region 4 works to reduce the lattice size of the semiconductor substrate 1 (active region), by controlling the heat treatment temperature $T_2$ of the second heat treatment of step S5 at the above temperature, it is possible to suppress or prevent $MSi_2$ (metal disilicide) from growing up abnormally from the metal silicide layer 41 to the channel part during the second heat treatment of step S5.

Further, when the trench 4a formed in the semiconductor substrate 1 is buried by insulator materials (insulating films 4b, 4c) to form the device isolation region 4 is formed as in the present embodiment, in other words, when the device isolation region 4 is formed by STI method, in comparison with the case when device isolation is formed by LOCOS method, the compression stress to act on the active region between the device isolation regions 4 becomes large. This is because the compression stress that sidewalls of the trench 4a formed in the semiconductor substrate 1 push the active region side act on the active region between the device isolation regions 4. Further, in the case where the insulator material (herein, insulating film 4c) for the device isolation region 4 to fill the trench 4a is an insulating film (for example, a silicon oxide film) that is formed by CVD method (especially, HDP-CVD method), in comparison with the case of $O_3$-TEOS oxide film (insulating film formed by heat CVD method), there is little shrinkage in annealing, the compression stress to work by the device isolation region 4 to the active region forming a MISFET becomes large. Thus, if the present embodiment is applied to the case when the compression stress to act on the active region forming a MISFET by the device isolation region 4 is large, the effect thereof is large, and this is also same to the following embodiments.

Furthermore, the compression stress which the device isolation region 4 formed by STI method acts onto the semiconductor substrate 1 (the region that is near to the device isolation region 4 of active regions) is about –0.035 GPa according to the measurement using CBED (Convergent Beam Electron Diffraction) method. Therefore, it is preferable that the tensile stress that the barrier film 13 causes to the semiconductor substrate 1 is 0.035 GPa (Giga Pascal) or more, and thereby, it is possible to prevent the influences of the compression stress caused by the device isolation region 4 (abnormal growth of $MSi_2$ and the like) in the first heat treatment of step S3 properly or precisely. Moreover, it is further preferable that the tensile stress that the barrier film 13 causes to the semiconductor substrate 1 is 2.5 GPa (Giga Pascal) or lower, and the film formation of the barrier film 13 becomes easier. Therefore, it is furthermore preferable that the tensile stress that the barrier film 13 causes to the semiconductor substrate 1 is 0.035 to 2.5 GPa (Giga Pascal). But, the above numerical values of the tensile stress that the barrier film 13 causes to the semiconductor substrate 1 (above described 0.035 GPa to 2.5 GPa) are the values calculated from the quantity of warpage (quantity of warpage at the room temperature) of the entire of the semiconductor substrate 1 and the barrier film 13 when the barrier film 13 is formed on a single entire main surface of the semiconductor substrate 1 unit (semiconductor substrate on which structures such as gate electrodes and impurity diffusion layer are not formed). Further, when the semiconductor substrate 1 warps upward convexly with the 13 barrier film formation surface upward, tensile stress acts onto the semiconductor substrate 1.

Furthermore, when the insulator buried in the trench 4a for device isolation is mainly formed by plasma CVD method (in particular, HDP-CVD method) (i.e., when the insulating film 4c is formed of plasma CVD method (in particular, HDP-CVD method)), a minute film is formed at the stage of film formation, and there is little shrinkage in annealing after the film formation. Therefore, the compression stress that the device isolation region 4 acts on the semiconductor substrate 1 (the active region prescribed by the device isolation region 4) becomes large, and this compression stress is likely to have an influence at the moment of the metal silicide layer formation. In the present embodiment, even if the compression stress that the device isolation region 4 acts to the semiconductor substrate 1 is large, it is possible to prevent bad influences (for example, abnormal growth of $MSi_2$) at the moment of the metal silicide layer 41 formation. Therefore, when the present embodiment is applied to the case where the insulator (insulator comprising the device isolation region 4, herein, insulating films 4b, 4c) which buried in trench 4a for device isolation is an insulating film (herein, the insulating film 4c) mainly formed by plasma CVD method (in particular, HDP-CVD method), the effect is extremely large. This is same to the following embodiments, too.

Next, the relation between the abnormal growth of MSi$_2$ (metal disilicide) and the crystal structure is explained.

When the semiconductor substrate 1 is silicon (single crystal silicon), the crystal structure of the silicon is of a diamond structure, and the crystal system is a cubic system, and the space group is Fd3m (227), and the length of the unit lattice of this crystal structure corresponds to the lattice constant, that is, the lattice size.

Figure 28:
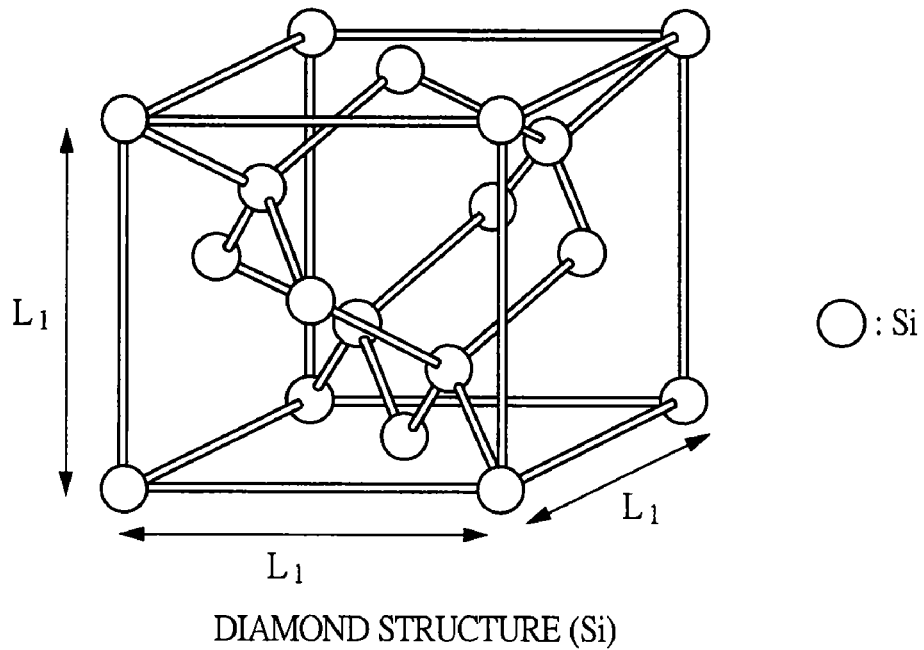
FIG. 28 is an illustrative diagram showing a diamond structure which is a crystal structure of silicon.

FIG. 28 is an explanatory figure (perspective view) showing the diamond structure that is the crystal structure of the silicon (Si). A cube shown in FIG. 28 becomes the unit crystal of the silicon (Si), and the length $L_1$ of one side (unit lattice) of this cube becomes the lattice constant of the silicon (Si), namely, the lattice size of the silicon (Si). Therefore, this length $L_1$ corresponds to the above $L_S$ in case when the semiconductor substrate 1 is silicon (single crystal silicon) ($L_1=L_S$). In FIG. 28, Si atoms are arranged in the positions where balls are posted.

On the other hand, in the case when MSi$_2$ (metal disilicide) is NiSi$_2$ (nickel disilicide), the crystal structure of NiSi$_2$ (nickel disilicide) is of a fluorite structure (CaF$_2$ type structure), the crystal system is a cubic system, and the space group is Fm3m (225), and the length of the unit lattice of this crystal structure corresponds to the lattice constant, namely, the lattice size.

Figure 29:
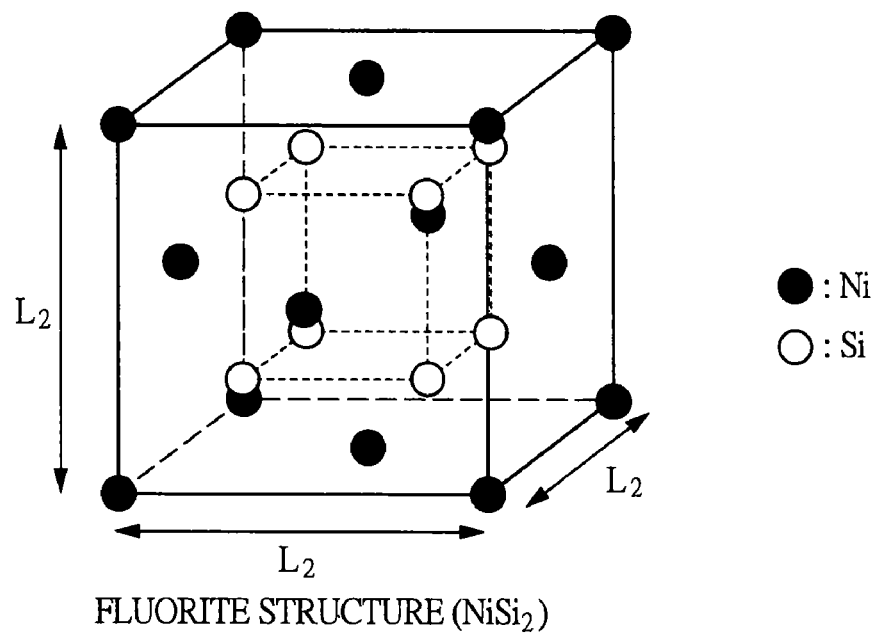
FIG. 29 is an illustrative diagram showing a fluorite structure which is a crystal structure of $NiSi_2$.

FIG. 29 is an explanatory figure (perspective view) showing the fluorite structure that is the crystal structure of NiSi$_2$ (nickel disilicide). A cube shown in FIG. 29 becomes the unit crystal of NiSi$_2$ (nickel disilicide), and the length $L_2$ of one side (unit lattice) of this cube becomes the lattice constant of NiSi$_2$ (nickel disilicide), namely, the lattice size of NiSi$_2$ (nickel disilicide). Therefore, this length $L_2$ corresponds to the above $L_M$ in case when the above MSi$_2$ is NiSi$_2$ ($L_2=L_M$). In FIG. 29, Ni atoms or Si atoms are arranged at the positions where balls are posted.

The fluorite structure shown in FIG. 29 is the structure of the compounds that has a composition of AB$_2$ (A and B are different elements), and NiSi$_2$ corresponds to A=Ni, B=Si in the above AB$_2$. This fluorite structure becomes a combination of a phase disposition structure (structure of FIG. 30A) of the element A (Ni in the case of NiSi$_2$), and a simple cube structure (structure of FIG. 30B) of the element B (Si in the case of NiSi$_2$) FIG. 30A shows the crystal structure of the element A (Ni in the case of NiSi$_2$) in the fluorite structure with the composition of AB$_2$, and FIG. 30B is an explanatory figure (perspective view) showing the crystal structure of the element B (Si in the case of NiSi$_2$) in the fluorite structure to have the composition of AB$_2$.

In the cube shown in FIG. 30A, Ni elements are arranged at the positions of the balls. In other words, FIG. 30A shows the phase disposition structure in which Ni elements are arranged in each top of the cube and the center of each surface of the cube. The length of one side (unit lattice) of the phase disposition structure of FIG. 30A is same as the above $L_2$, and becomes same as the lattice constant of NiSi$_2$ (nickel disilicide), namely, the lattice size of NiSi$_2$ (nickel disilicide).

Furthermore, in the cube shown in FIG. 30B, Si elements are arranged at the positions of the balls. In other words, FIG. 30B shows the simple cube structure in which Si elements are arranged in each top of the cube. The length $L_3$ of one side (unit lattice) of the simple cube structure of FIG. 30B is half of the length $L_2$ mentioned above, and a relation of $L_2=2L_3$ is established.

The structure of FIG. 30A (phase disposition structure) and the structure of FIG. 30B (simple cube structure) are interlaced so that each center of gravity matches, and thereby the fluorite structure of FIG. 29 is structured.

The state in which the lattice size of single crystal Si (silicon) forming the semiconductor substrate 1 and the lattice size of NiSi$_2$ (nickel disilicide) are same corresponds to the state in which the above length $L_1$ which is the lattice constant of the silicon (Si) and the above length $L_2$ which is the lattice constant of NiSi$_2$ (nickel disilicide) are equal (i.e., $L_1=L_2$). Further, the above temperature $T_4$ at which the lattice size of the single crystal silicon (Si) forming the semiconductor substrate 1 and the lattice size of NiSi$_2$ (nickel disilicide) become same corresponds to the temperature at which the above length $L_1$ which is the lattice constant of the silicon (Si) and the above length $L_2$ which is the lattice constant of NiSi$_2$ (nickel disilicide) becomes same (equal, i.e., $L_1=L_2$).

The diamond structure of FIG. 28 and the fluorite structure of FIG. 29 have many similarities. In other words, if, in the fluorite structure of FIG. 29, Si is arranged in the place of Ni at the site of Ni of the phase disposition structure, and, Si is arranged at the four sites (four sites shown by mark 61 in FIG. 30B) among sites of eight Si of the simplicity cube structure, but Si is not arranged at the four remaining sites (four sites shown by mark 62 in FIG. 30B), then the structure becomes same as the diamond structure of FIG. 28.

Further, when attention is paid to the placement of the Si in the diamond structure of the silicon of FIG. 28 and the placement of the Si in the fluorite structure of NiSi$_2$ of FIG. 29, in the diamond structure of the silicon of FIG. 28, the distance between two Si atoms in the direction [110] positioned in {400}, {200}, {100} surfaces becomes $(½)^{0.5} \times L_1$. On the other hand, in the fluorite structure of NiSi$_2$, the distance of the diagonal of each phase of the simple cube structure of the Si of FIG. 30B (i.e., the distance between Si atoms in the direction [110]) becomes $(2)^{0.5} \times L_3 = (½)^{0.5} \times L_2$. In the case of $L_1=L_2$, both distances are same (both become equal).

Si and Ni diffuse mutually by giving heat treatment. If the second heat treatment temperature $T_2$ of step S5 is close to the above temperature $T_4$ at which the lattice size of the single crystal silicon (Si) forming the semiconductor substrate 1 and the lattice size of NiSi$_2$ become same, at the second heat treatment of step S5, Si of the diamond structure takes the placement similar to Si in the fluorite structure of NiSi$_2$ by high similarity between the diamond structure and the fluorite structure (in particular, Si of {400} surface). Therefore, it is thought that substitution is easy to come to occur between the lattices of Ni and Si in the second heat treatment of step S5, and a NiSi$_2$ part is likely to be generated.

Thereby, when the similarity between the crystal structure of the semiconductor substrate 1 and that of MSi$_2$ (metal disilicide) is high, and in particular, when the crystal structure of the semiconductor substrate 1 takes the diamond structure and the crystal structure of MSi$_2$ (metal disilicide) takes the fluorite structure, as mentioned above, the problem of the abnormal growth of MSi$_2$ from the metal silicide layer to the channel part, and the problem of the resistance unevenness increase by the formation of MSi$_2$ part of the metal silicide layer occur conspicuously.

Therefore, when the present embodiment is applied to the case when the similarity between the crystal structure of the semiconductor substrate 1 and the crystal structure of MSi$_2$ (metal disilicide) is high, and in particular, when the crystal structure of the semiconductor substrate 1 takes the diamond structure and the crystal structure of MSi$_2$ (metal disilicide) takes the fluorite structure, the effect is particularly large. Therefore, it is most preferable that single crystal silicon is used as the semiconductor substrate 1, but beside single crystal silicon, what has a crystal structure of the diamond structure type similar to that of single crystal silicon may be preferably used as the semiconductor substrate 1. This is same to the following embodiments, too.

Further, if a Ni film is used as the metal film 12, the above $MSi_2$ which can be formed becomes $NiSi_2$ of the fluorite structure, and the effect to apply the present embodiment is large, but besides the Ni film, the present embodiment is effective when a metal or an alloy in which $MSi_2$ that can be formed a Ni film takes the crystal structure of the fluorite structure type is used as the metal film 12. For example, when the metal film 12 is a nickel alloy film, in particular, a Ni—Pt (nickel-platinum) alloy film, a Ni—Pd (nickel-paradium) alloy film, a Ni—Y (nickel-yttrium) alloy film, a Ni—Yb (nickel-ytterbium) alloy film, a Ni—Er (nickel-erbium) alloy film, or a Ni-lanthanoid alloy film, the formed $MSi_2$ may become the fluorite structure (but a part of the Ni sites of the phase disposition structure of FIG. 30A is substituted by other metal forming an alloy), and accordingly, the present embodiment may be applied preferably. This is same to the following embodiments, too.

Second Embodiment

Figure 31:
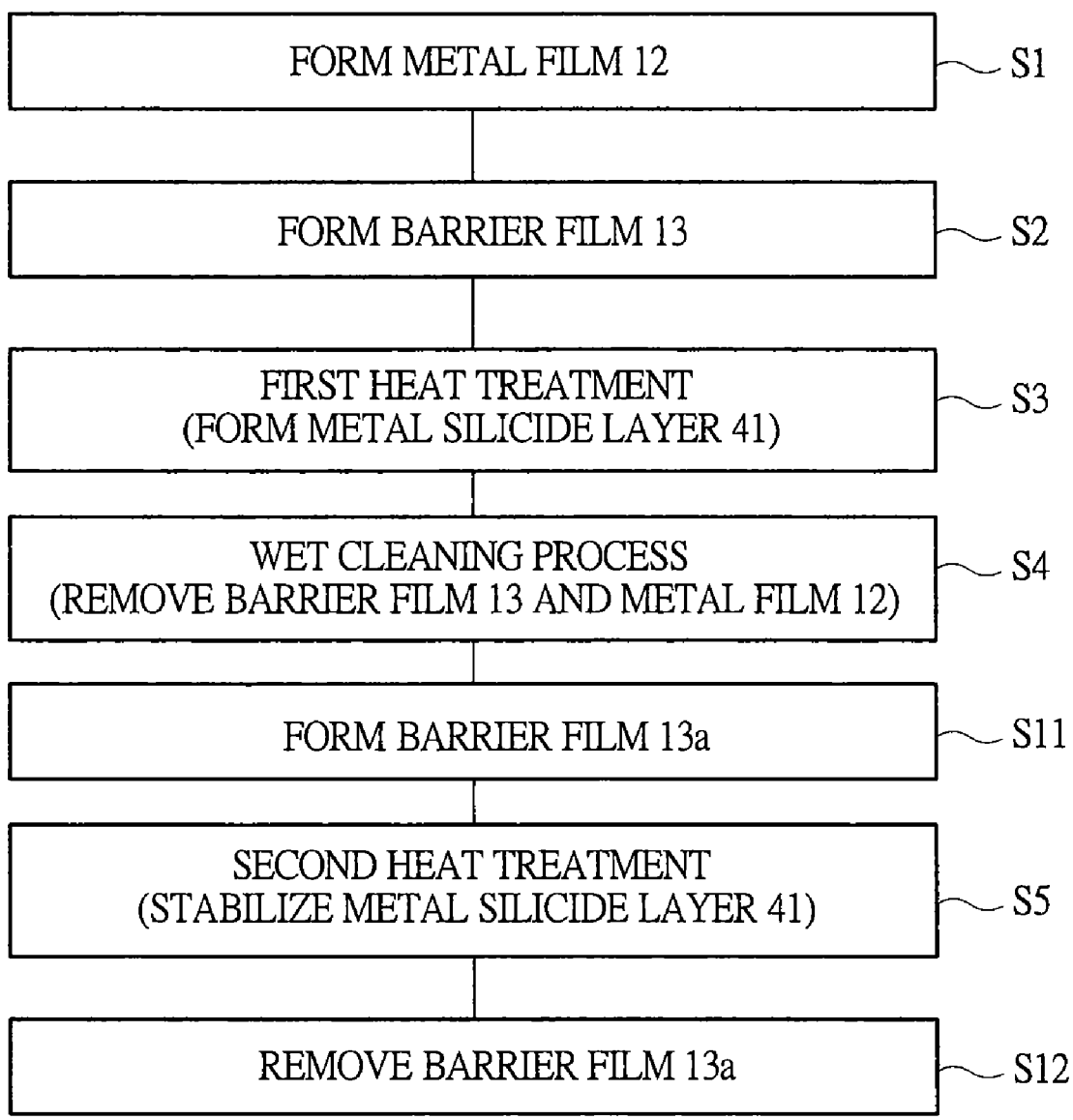
FIG. 31 is a manufacturing process flow chart showing a part of manufacturing steps of a semiconductor device according to a second embodiment of the present invention.

FIG. 31 is a manufacturing process flow showing a part of the process of manufacturing a semiconductor device according to the present embodiment and corresponds to FIG. 9 of the above first embodiment. In FIG. 31, a manufacturing process flow in a process is shown where a metal silicide layer (metal/semiconductor reaction layer) is formed on the surface of gate electrodes 8a, 8b, $n^+$ type semiconductor region 9b and $p^+$ type semiconductor region 10b by salicide process after the structure of above FIG. 7 is obtained. FIG. 32 to FIG. 35 are cross-sectional views of main parts of the semiconductor device in the manufacturing process of the present embodiment.

The process of manufacturing the semiconductor device according to the present embodiment is same to the process of the above first embodiment until the process in which wet cleaning is carried out in the above step S4, and thereby the barrier film 13 and the unreacted metal film 12 are removed. Therefore, the explanations are omitted herein, and processes following the above step S4 are explained hereinafter.

Figure 32:
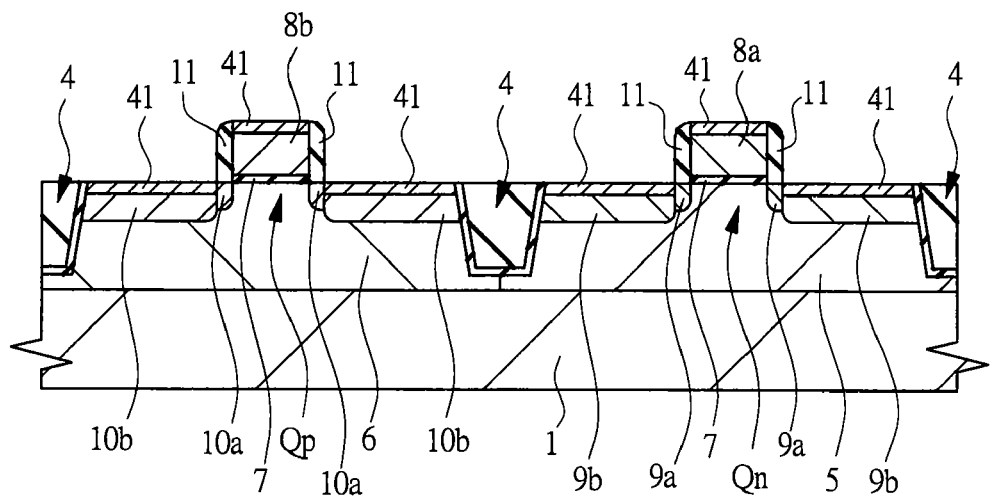
FIG. 32 is a cross-sectional view of main parts of the semiconductor device in a manufacturing step according to the second embodiment.
Figure 33:
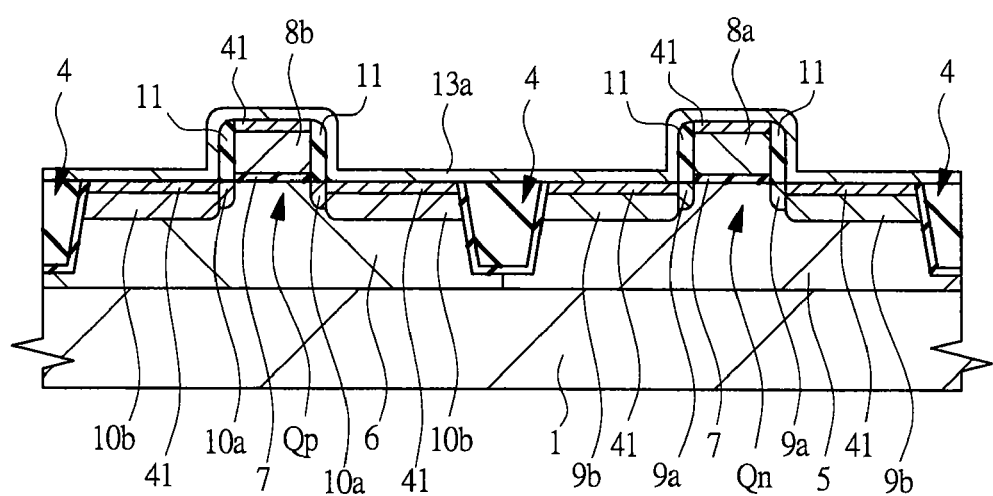
FIG. 33 is a cross-sectional view of main parts of the semiconductor device in a manufacturing step continued from FIG. 32.

The processes to the above step S4 are carried out in the same manner as in the first embodiment, and the structure shown in FIG. 32 substantially equivalent to above FIG. 14 is obtained, then as shown in FIG. 33, a barrier film (second barrier film, stress control film, cap film) 13a is formed (deposited) on the main surface (entire surface) of the semiconductor substrate 1 including the metal silicide layer 41 (step S11 of FIG. 31).

Next, the same second heat treatment of step S5 as in the first embodiment is performed. In the present embodiment, the second heat treatment of step S5 is performed in the state where the barrier film 13a is formed, but conditions and roles of the second heat treatment of step S5 are same as those of the first embodiment.

Therefore, in the same manner as in the first embodiment, in the present embodiment too, the second heat treatment of step S5 is stabilization anneal which is performed, not for phase changes of the metal silicide layer 41 (phase change from $M_2Si$ phase to MSi phase), but for stabilization of the metal silicide layer 41. Since the heat treatment temperature $T_2$ of the second heat treatment of step S5 in the present embodiment is same as the heat treatment temperature $T_2$ of the second heat treatment of step S5 in the first embodiment, the explanations thereof are omitted herein. Further, the atmosphere at the moment of the second heat treatment of step S5 of the present embodiment is same as that in the above first embodiment, too. Further, in the same manner as in the first embodiment, in the present embodiment too, after the second heat treatment of step S5, to the end of the manufacture of a semiconductor device (for example, to cutting semiconductor substrate 1 and making it into pieces of semiconductor chips), the semiconductor substrate 1 is kept so as not to become the temperature that is higher than the heat treatment temperature $T_2$ of the second heat treatment of step S5.

Figure 34:
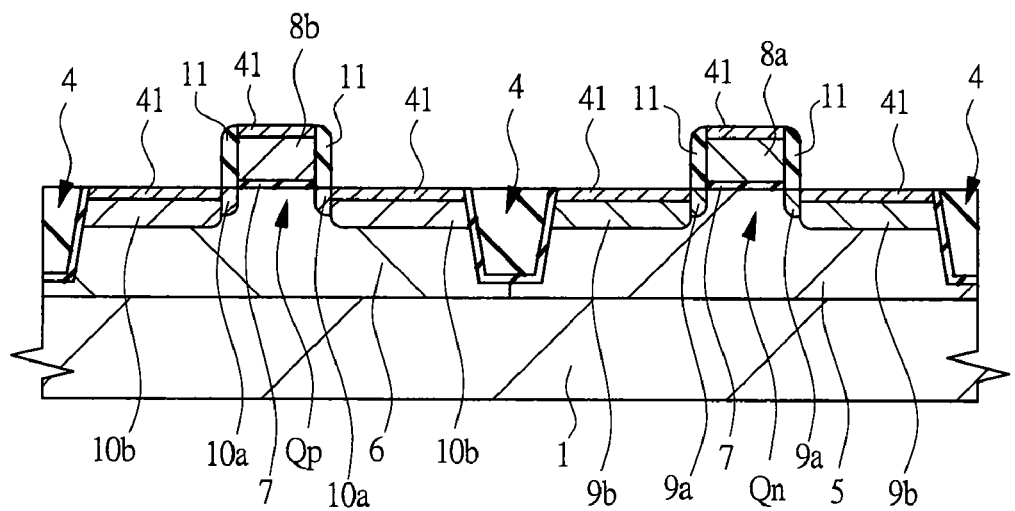
FIG. 34 is a cross-sectional view of main parts of the semiconductor device in a manufacturing step continued from FIG. 33.

After the second heat treatment of step S5, as shown in FIG. 34, the barrier film 13a is removed by performing wet cleaning process (step S12 of FIG. 31). At this moment, the metal silicide layer 41 is left on the surface of the gate electrodes 8a, 8b, the $n^+$ type semiconductor region 9b and the $p^+$ type semiconductor region 10b. The wet cleaning process of step S12 may be performed by the wet cleaning using sulfuric acid, or the wet cleaning using sulfuric acid and oxygenated water.

Figure 35:
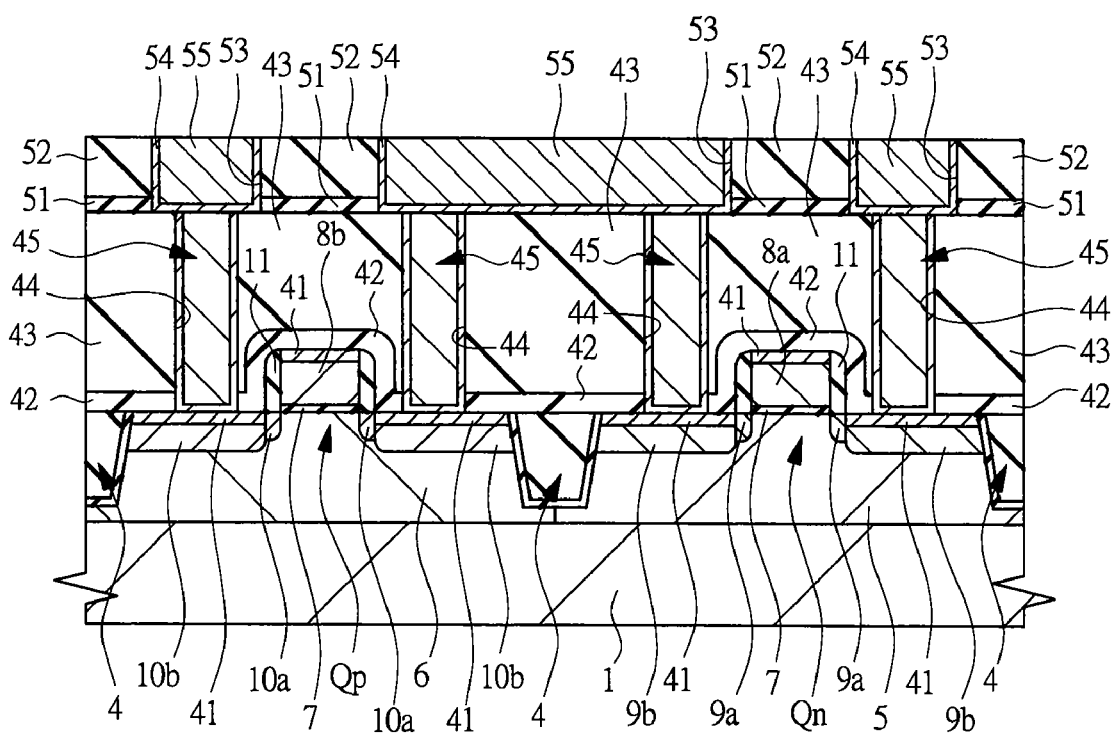
FIG. 35 is a cross-sectional view of main parts of the semiconductor device in a manufacturing step continued from FIG. 34.

The processes after that are same to those in the above first embodiment. In other words, in the same manner as in the first embodiment, as shown in FIG. 35, the insulating film 42 and the insulating film 43 are formed, and contact holes 44 are formed in the insulating films 43, 42 and the plugs 45 are formed in contact holes 44, and the stopper insulating film 51 and the insulating film 52 are formed on the insulating film 43 in which the plug 45 is buried, and the wiring trench 53 is formed, and the barrier conductive film 54 and a copper film are buried in the wiring trench 53 and the wiring 55 is formed.

The barrier film 13a is a film to cause tensile stress to the semiconductor substrate 1 like the barrier film 13. Therefore, the same film as the barrier film 13 may be used as the barrier film 13a, and preferably, a titanium nitride (TiN) film or a titanium (Ti) film may be used. In the present embodiment, in order to offset the compression stress that device isolation region 4 causes in the active region of the semiconductor substrate 1, the barrier film 13a to cause tensile stress to the semiconductor substrate 1 is formed, therefore, the barrier film 13a may be considered as a stress control film (a film to control the stress of the active region of the semiconductor substrate 1).

Further, as described about the barrier film 13a in the above first embodiment, the direction and size of the stress to be caused to the semiconductor substrate 1 depend on the film formation method as well as the materials of the film. Therefore, for the same reason as that of the barrier film 13, it is preferable that, in the case where the barrier film 13a is a titanium nitride (TiN) film, the same is formed by sputtering (PVD method), and in the case where the barrier film 13a is a titanium (Ti) film, the same is formed by a plasma CVD method. Further, for the same reason described as that of the barrier film 13, it is preferable that, in the case when the barrier film 13a is a titanium nitride (TiN) film that is formed by sputtering (PVD method), the film formation temperature (substrate temperature) of the barrier film 13a is 300° C. or lower. And, in the case where the barrier film 13a is a titanium (Ti) film which is formed by plasma CVD method, it is preferable that the film formation temperature (substrate temperature) of the barrier film 13a is 450° C. or lower.

Furthermore, since it is possible to make a tantalum nitride (TaN) film or a tantalum (Ta) film as a film that causes tensile stress to the semiconductor substrate 1, the same can be used as the barrier film 13a. But when a tantalum nitride (TaN) film or a tantalum (Ta) film is used, there is a need to use hydrofluoric acid (HF) in the wet cleaning process of step S12, and thus there is a possibility that other portions than the barrier film 13a may be etched at the time of wet cleaning. Therefore, as the barrier film 13a, it is preferable to use a titanium nitride (TiN) film and a titanium (Ti) film that can be removed in the wet cleaning process of step S12 more easily than a tantalum nitride (TaN) film and a tantalum (Ta) film. Further, a preferable range of the tensile stress of barrier film 13a is also same as that of the barrier film 13.

Moreover, in the same manner as the barrier film 13, the barrier film 13a is a film which does not transmit (difficult to transmit) oxygen (O), i.e., the barrier film 13a is a film having no oxygen transmission. Since the barrier film 13a prevents transmission of oxygen (O), at the moment of the second heat treatment of step S5, it is possible to prevent oxygen (O) from being supplied to the metal silicide layer 41. In this manner, it is possible to suppress or prevent generation of defects caused by oxygen, and thus the metal element M is suppressed or prevented from diffusing through defects caused by oxygen, thereby suppressing or preventing the abnormal growth of $MSi_2$ from the metal silicide layer 41 to the channel part at the time of the second heat treatment of step S5 more properly or precisely. As such a barrier film 13a that does not transmit oxygen (O), a titanium nitride (TiN) film and a titanium (Ti) film are preferable.

Finally, the barrier film 13a is a film which is difficult to react with the metal silicide layer 41, and also a film which does not react with the metal silicide layer 41 even if the second heat treatment of step S5 is carried out. When the barrier film 13a reacts with the metal silicide layer 41 in the second heat treatment of step S5, the composition of the metal silicide layer 41 may change, but in the present embodiment, by making the barrier film 13a as a film which is difficult to react with the metal silicide layer 41, it is possible to prevent the barrier film 13a from reacting with the metal silicide layer 41 in the second heat treatment of step S5, and to form the metal silicide layer 41 properly or precisely. As such a barrier film 13a that is difficult to react with the metal silicide layer 41, a titanium nitride (TiN) film and a titanium (Ti) film are preferable.

In the first embodiment described above, by controlling heat treatment temperature $T_2$ of the second heat treatment of step S5, $MSi_2$ (metal disilicide) is suppressed or prevented from abnormal growth from the metal silicide layer 41 to the channel part during the second heat treatment of step S5. However, in consideration of a further high performance and high reliability of the semiconductor device, it is preferable to reduce the abnormal growth of $MSi_2$ from the metal silicide layer 41 to the channel part as much as possible. Therefore, in the present embodiment, the barrier film 13 and the metal film 12 are removed and the surface of the metal silicide layer 41 is exposed, and the barrier film 13a is formed on the main surface (entire surface) of the semiconductor substrate 1 including the metal silicide layer 41 as step S11, and then the second heat treatment of step S5 is performed in the state where the metal silicide layer 41 is covered with the barrier film 13a. The barrier film 13a is a film to cause tensile stress to the semiconductor substrate 1 similarly to the barrier film 13.

According to the present embodiment, the second heat treatment of step S5 is performed in the state where the barrier film 13a to cause tensile stress to the semiconductor substrate 1 is formed, it is possible to make the lattice size of semiconductor substrate 1 larger than the case without the barrier film 13a by the tensile stress posed by the barrier film 13a, and thus the difference between the lattice size of the conductor substrate 1 and the lattice size of $MSi_2$ is made large, thereby preventing the abnormal diffusion of the metal element M more properly or precisely. In this manner, it is possible to prevent $MSi_2$ from abnormal growth from the metal silicide layer 41 into the channel part during the second heat treatment of step S5 more properly or precisely.

Further, in the present embodiment, not only the heat treatment temperature $T_2$ of the second heat treatment of step S5 is controlled at the temperature described in the first embodiment, but also the second heat treatment of step S5 is performed in the state where the barrier film 13a to cause tensile stress to the semiconductor substrate 1 is formed. Accordingly, the barrier film 13a offsets the compression stress caused by the device isolation region 4. Even if the device isolation region 4 acts on the semiconductor substrate 1 (active region) to generate tensile stress, since the compression stress to be caused by the device isolation region 4 to make the lattice size of the semiconductor substrate 1 small is suppressed or prevented by tensile stress of the barrier film 13a. Accordingly, it is possible to prevent the abnormal growth of $MSi_2$ from the metal silicide layer 41 into the channel part during the second heat treatment of step S5 further precisely.

In this manner, according to the present embodiment, in addition to obtain the effects of the first embodiment, it is possible to prevent the abnormal growth of $MSi_2$ from metal silicide layer 41 to the channel part during the second heat treatment of step S5 more precisely. Further, it is possible to more precisely prevent a $NiSi_2$ part having a high resistance from occurring in the metal silicide layer 41, and to reduce the uneven resistance of the metal silicide layer 41 further precisely. Therefore, it is possible to improve the performance and reliability of the semiconductor device further more.

Third Embodiment

In a further study on the process of the comparative example of above described FIG. 18 to FIG. 21, the inventors have found that, in the source/drain of a p-channel type MISFET, the increase of the junction leakage current and the unevenness of the junction leakage current (the change of the junction leakage current in every transistor) are more likely to occur than in an n-channel type MISFET.

To reduce the above junction leakage current, it is effective to thin the thickness of Ni film 112 to be deposited on the semiconductor substrate 1 so that the thickness of nickel silicide layer 141b is thinned. However, the nickel silicide layer 141b is arranged for lowering resistance. Therefore, if the thickness of the nickel silicide layer 141b is made thin in both of the n-channel type MISFET and the p-channel type MISFET, the effect of lowering resistance by the nickel silicide layer 141b is weakened even in the n-channel type MISFET in which influence is hardly occurred to the junction leakage current.

Accordingly, in the present embodiment, the above problem is solved by forming the metal silicide layer by the following process.

Figure 36:
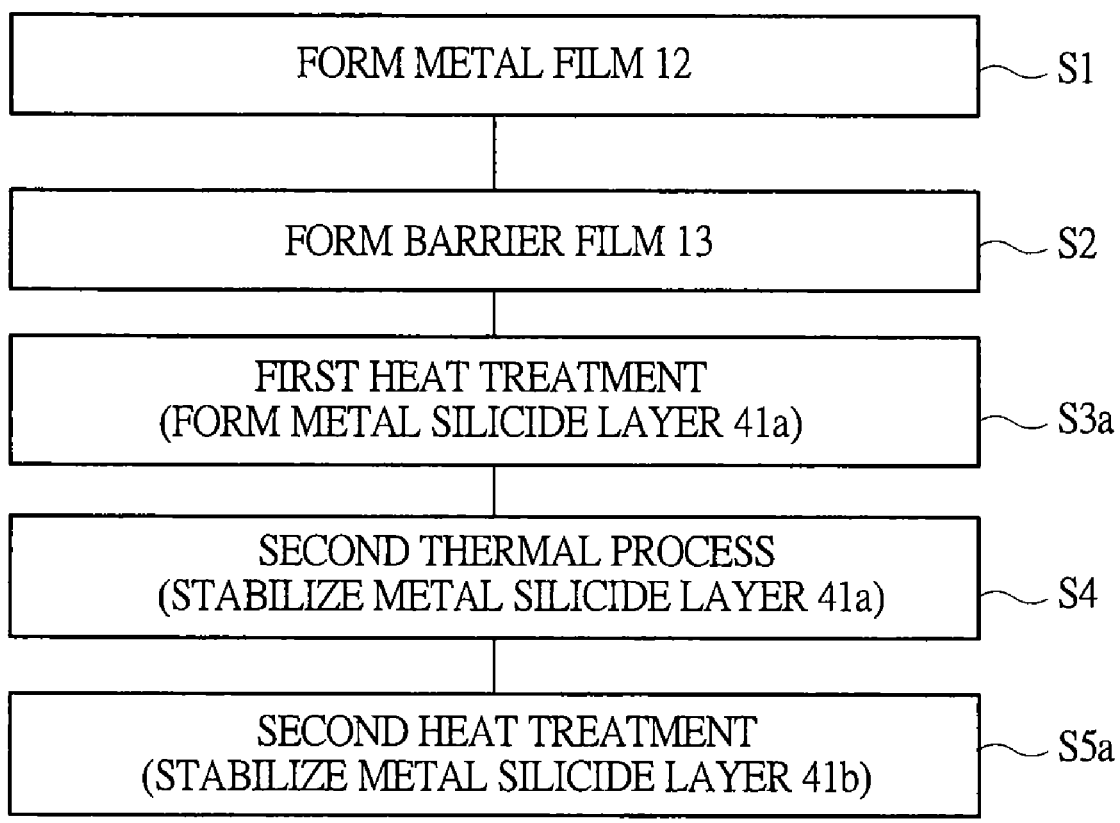
FIG. 36 is a manufacturing process flow chart showing a part of manufacturing steps of a semiconductor device according to a third embodiment of the present invention.
Figure 37:
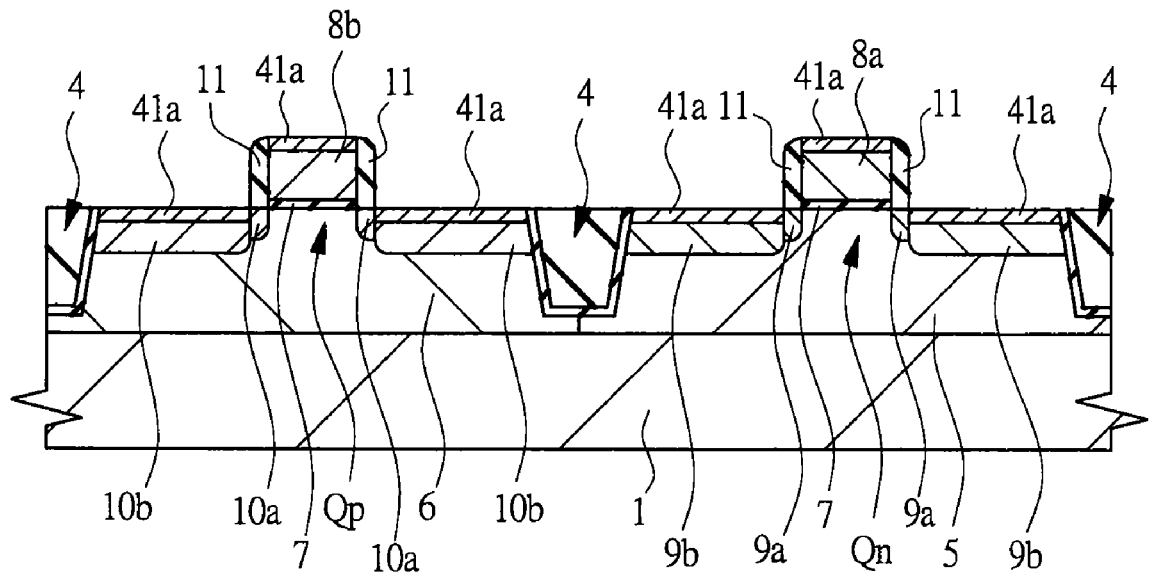
FIG. 37 is a cross-sectional view of main parts of the semiconductor device in a manufacturing step according to the third embodiment.
Figure 38:
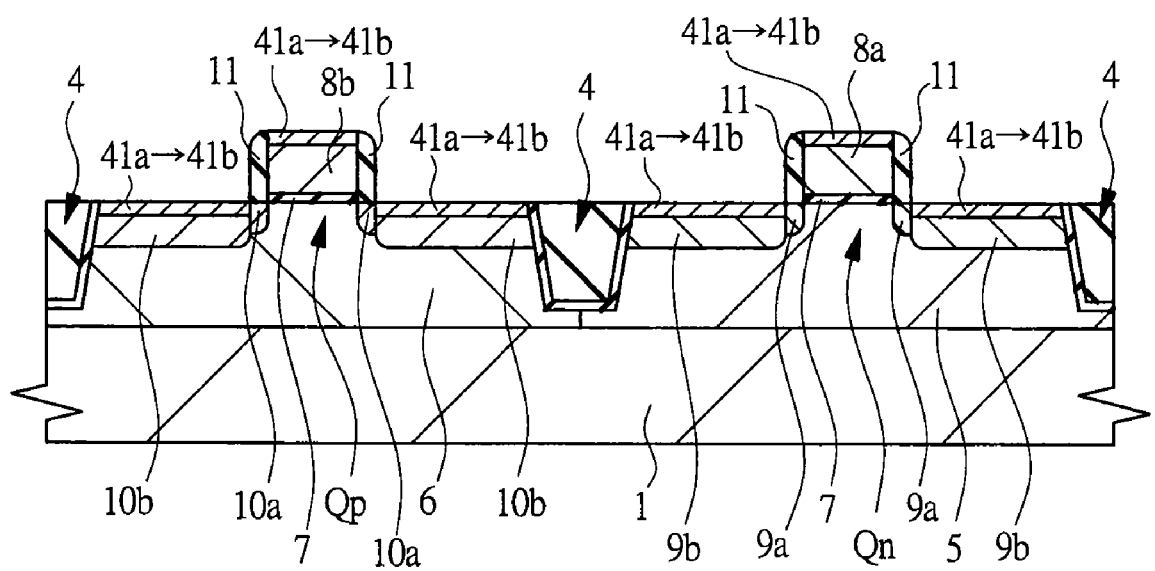
FIG. 38 is a cross-sectional view of main parts of the semiconductor device in a manufacturing step continued from FIG. 37.

FIG. 36 is a manufacturing process flow chart showing a part of the process of manufacturing the semiconductor device of the present embodiment and corresponds to FIG. 9 of the first embodiment described above. FIG. 36 shows a manufacturing process flow in a process of forming a metal silicide layer (metal/semiconductor reaction layer) on the surfaces of the gate electrodes 8a, 8b, n⁺ type semiconductor region 9b and p⁺ type semiconductor region 10b by salicide process after the structure of abovedescribed FIG. 7 is obtained. FIG. 37 and FIG. 38 are cross-sectional views of main parts of the semiconductor device in the manufacturing process according to the present embodiment and correspond to the above FIG. 14.

The process of manufacturing the semiconductor device of the present embodiment is same as that in the first embodiment until the first heat treatment process of above step S3, that is, until the process to form the metal film 12 and the barrier film 13 in the above steps S1 and S2, and therefore, the descriptions thereof are omitted herein, and the first heat treatment process at a step S3a corresponding to the above step S3 and steps following the above step S3a will be described hereinafter.

In the same manner as in the above first embodiment, the process until the above steps S1, S2 (until the process P8 in FIG. 11) is carried out, and after the structure of the above FIG. 8 is obtained (that is, after the metal film 12 and the barrier film 13 are formed), a first heat treatment (anneal processing) is performed (step S3a of, FIG. 36). In the same manner as in the first heat treatment of the above step S3, it is preferable that the first heat treatment of the step S3a is carried out under ordinary pressure as filled with an inert gas (for example, argon (Ar) gas or helium (He) gas) or a nitrogen ($N_2$) gas atmosphere.

By the first heat treatment of step S3a, as shown in FIG. 37, the polycrystalline silicon film forming the gate electrodes 8a, 8b and the metal film 12 and single crystal silicon (single crystal Si) forming the $n^+$ type semiconductor region 9b and the $p^+$ type semiconductor region 10b are reacted selectively with the metal film 12, thereby forming a metal silicide layer 41a that is a metal/semiconductor reaction layer. Each upper part (upper layer portions) of the gate electrodes 8a, 8b, the $n^+$ type semiconductor region 9b and the $p^+$ type semiconductor region 10b react with the metal film 12, thereby forming the metal silicide layer 41a, and accordingly, the metal silicide layer 41a is formed on the surfaces (upper layer portions) of the gate electrodes 8a, 8b, the $n^+$ type semiconductor region 9b and the $p^+$ type semiconductor region 10b.

In the third embodiment, the first heat treatment of step S3a is carried out in a temperature range at which a reaction rate of the metal film 12 when the metal element M forming the metal film 12 and the Si forming the $p^+$ type semiconductor region 10b are reacted becomes lower than a reaction rate of the metal film 12 when the metal element M forming the metal film 12 and the Si forming the $n^+$ type semiconductor region 9b are reacted.

In other words, in the reaction of the metal element M forming the metal film 12 and the Si forming the $n^+$ type semiconductor region 9b in the stage of the first heat treatment of step S3a, the metal element M is entirely consumed, thereby forming the metal silicide layer 41a on the surface of the $n^+$ type semiconductor region 9b (the upper layer portion of the $n^+$ type semiconductor region 9b), or, the metal element M is not entirely consumed and unreacted metal element M is left on the surface of the $n^+$ type semiconductor region 9b (the upper layer portion of the $n^+$ type semiconductor region 9b), thereby forming the metal silicide layer 41a. In contrast, in the reaction of the metal element M forming the metal film 12 and the Si forming the $p^+$ type semiconductor region 10b in the stage of the first heat treatment of step S3a, the metal element M is not entirely consumed and unreacted metal element M is left on the surface of the $p^+$ type semiconductor region 10b (the upper layer portion of the $p^+$ type semiconductor region 10b), thereby forming the metal silicide layer 41a. Herein, as mentioned above, the first heat treatment of step S3a is carried out in the temperature range at which the reaction rate of the metal film 12 when the metal element M forming the metal film 12 and the Si forming the $p^+$ type semiconductor region 10b are reacted becomes lower than the reaction rate of the metal film 12 when the metal element M forming the metal film 12 and the Si forming the $n^+$ type semiconductor region 9b are reacted. In this manner, a metal silicide layer 41a having a first thickness is formed on the surface of the $n^+$ type semiconductor region 9b (the upper layer portion of the $n^+$ type semiconductor region 9b) at the stage of the first heat treatment of step S3a, and a metal silicide layer 41a having a second thickness that is thinner than the thickness of the above first thickness is formed on the surface of the $p^+$ type semiconductor region 10b (the upper layer portion of the $p^+$ type semiconductor region 10b) at the stage of the first heat treatment of step S3a.

Further, in the present embodiment, by the first heat treatment of step S3a, the metal silicide layer 41a comprising a dimetal silicide (that is, $M_2Si$) of the metal element M forming the metal film 12 is formed.

More particularly, by the first heat treatment of step S3a, the metal element M forming the metal film 12 and the Si of a polycrystalline silicon film forming the gate electrodes 8a, 8b are reacted, thereby forming the metal silicide layer 41a comprising $M_2Si$ on the surfaces of the gate electrodes 8a, 8b (the upper layer portions of the gate electrodes 8a, 8b). Further, by the first heat treatment of step S3a, the metal element M forming the metal film 12 and the Si of the $n^+$ type semiconductor region 9b are reacted, thereby forming the metal silicide layer 41a comprising $M_2Si$ on the surface of the $n^+$ type semiconductor region 9b (the upper layer portion of the $n^+$ type semiconductor region 9b). Further, by the first heat treatment of step S3a, the metal element M forming the metal film 12 and the Si of the $p^+$ type semiconductor region 10b are reacted, thereby forming the metal silicide layer 41a comprising $M_2Si$ on the surface of the $p^+$ type semiconductor region 10b (the upper layer portion of the $p^+$ type semiconductor region 10b).

Furthermore, it is preferable that the barrier film 13 is a film which is difficult to react with the metal film 12, and a film which does not react with the metal film 12 even if the first heat treatment of step S3a is carried out. When the barrier film 13 reacts with the metal film 12 in the first heat treatment of step S3a, there is a possibility that the formation of the metal silicide layer 41 is obstructed, and the composition of the metal silicide layer 41a may be changed. In the present embodiment, by making the barrier film 13 as a film that is difficult to react with the metal film 12, it is possible to prevent the metal film 12 and the barrier film 13 from reacting in the first heat treatment of step S3a, and it is possible to form the metal silicide layer 41a in the first heat treatment of step S3 precisely. As such a barrier film 13 which is difficult to react with the metal film 12, a titanium nitride (TiN) film and a titanium (Ti) film are preferable.

Further, the barrier film 13 is a film which is difficult to react with the metal silicide layer 12, and it is desired a film which does not react with the metal silicide layer 12 even if the first heat treatment of step s3a is carried out. When the barrier film 13 reacts with the metal silicide layer 12 in the first heat treatment of step S3a, the formation of the metal silicide layer 41a may be prevented, and the composition of the metal silicide layer 41a may be changed. As same with the first embodiment, also in the present embodiment, by making the barrier film a film which is difficult to react with the metal film 12, it is possible to prevent the metal film 12 from reacting with the barrier film 13 in the first heat treatment of step S3a, and to form the metal silicide layer 41a in the first heat treatment of step S3a. As such a barrier film 13 that is difficult to react with the metal film 12, a titanium nitride (TiN) film and a titanium (Ti) film are preferable.

For example, in the case where the metal film 12 is a Ni film, it is considered that a temperature range of, for example, 260° C. or higher and lower than 320° C. is proper for the first heat treatment of step S3a (it is needless to say that it is not limited to this temperature range depending on other conditions). Further, it is considered that a temperature range from 270 to 310° C. centering 290° C. as a central value is most suitable. In the following, with reference to FIG. 39 to FIG. 41, the reason why the heat treatment temperature of the first heat treatment of step S3a according to the third embodiment is set to 260° C. or more and lower than 320° C. in the case where the metal film 12 is a Ni film will be described in detail.

Figure 39:
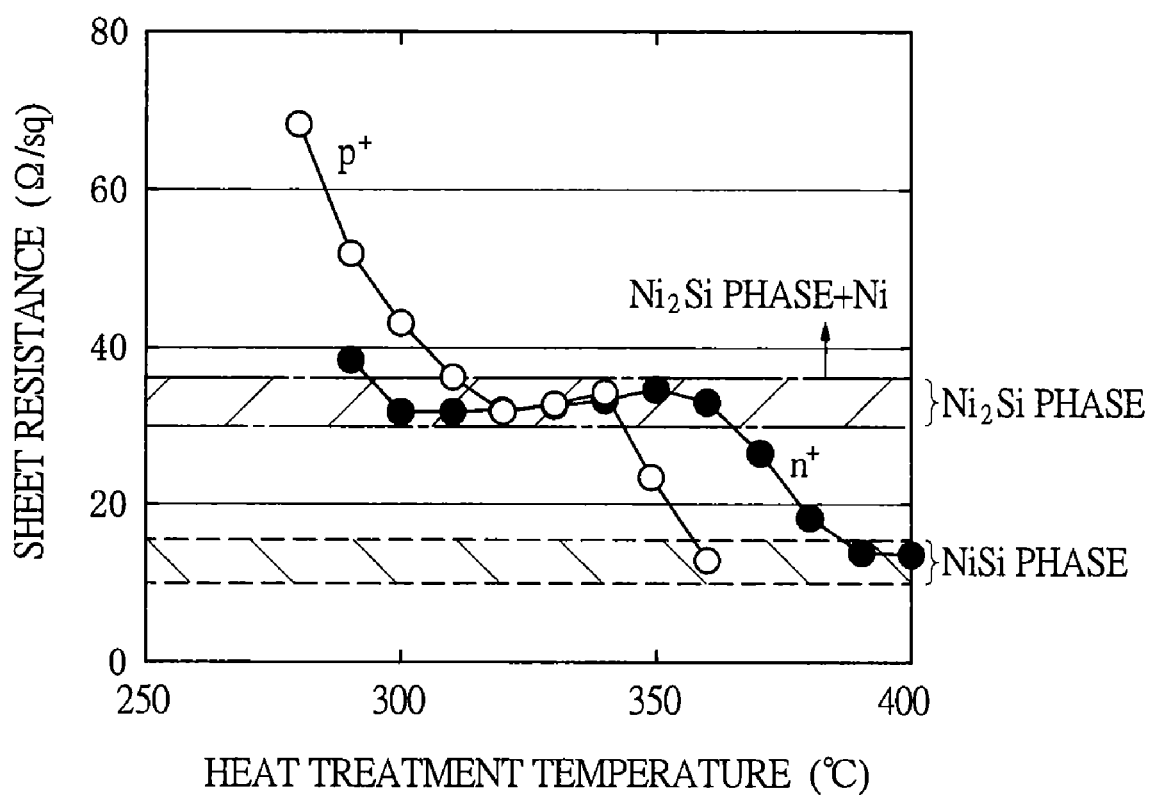
FIG. 39 is a graph showing a heat treatment temperature dependency of a sheet resistance of a nickel silicide layer according to the third embodiment of the present invention.

FIG. 39 is a graph showing a heat treatment temperature dependence of a sheet resistance of the formed nickel silicide layer in the case where a $p^+$ type silicon region and an $n^+$ type silicon region are formed on a semiconductor substrate, and a Ni film is formed about 10 nm and a TiN film is formed about 15 nm, and then the Ni film and the $p^+$ type silicon region or the Ni film and the $n^+$ type silicon region are reacted by heat treatment, so that the nickel silicide layer is formed, and the unreacted Ni film and TiN film are removed. The horizontal axis of the graph of FIG. 39 corresponds to the heat treatment temperature to react the Ni film and the $p^+$ type silicon region, or the Ni film and the $n^+$ type silicon region by heat treatment, and the vertical axis of the graph of FIG. 39 corresponds to the sheet resistance value of the nickel silicide layer formed by the heat treatment. The heat treatment in the case of FIG. 39 is performed for about 30 seconds by RTA. Further, in the graph of FIG. 39, a sheet resistance value of the nickel silicide layer that is formed by reacting the Ni film and the $p^+$ type silicon region by heat treatment is shown by a white circle, and a sheet resistance value of the nickel silicide layer that is formed by reacting the Ni film and the $n^+$ type silicon region by heat treatment is shown by a black circle. Meanwhile, FIG. 39 corresponds to the above FIG. 23 shown in a wider temperature range.

As shown in FIG. 39, when the heat temperature is low, the nickel silicide layer formed has a high resistant $Ni_2Si$ phase (about 30Ω/□ in $Ni_2Si$ phase), while when the heat treatment is high, the nickel silicide layer formed has a low resistant NiSi phase (about 10Ω/□ in NiSi phase). However, the temperature at which $Ni_2Si$ phase is changed into a NiSi phase is different respectively in the case of reacting the Ni film and the $n^+$ type silicon region and in the case of reacting the Ni film and the $p^+$ type silicon region. For example, in the case of reacting the Ni film and the $n^+$ type silicon region, the Ni film is not entirely consumed by the heat treatment of a temperature range lower than 300° C., and the unreacted Ni film is left, thereby forming the nickel silicide layer of $Ni_2Si$ phase. And, a nickel silicide layer of $Ni_2Si$ phase in which the Ni film is entirely consumed is formed by the heat treatment of a temperature range of 300° C. or higher to 360° C. or lower. And further, a nickel silicide layer of NiSi phase is formed by the heat treatment of a temperature range of 390° C. or higher. On the other hand, in the case of reacting the Ni film and the $p^+$ type silicon region, the Ni film is not entirely consumed by the heat treatment of the temperature range lower than 320° C. and the unreacted Ni film is left, thereby forming the nickel silicide layer of $Ni_2Si$ phase. And, a nickel silicide layer of $Ni_2Si$ phase in which the Ni film is entirely consumed is formed by the heat treatment of a temperature range of 320° C. or higher to 340° C. or lower, and further, a nickel silicide layer of NiSi phase is formed by the heat treatment of a temperature range of 360° C. or higher.

Figure 40:
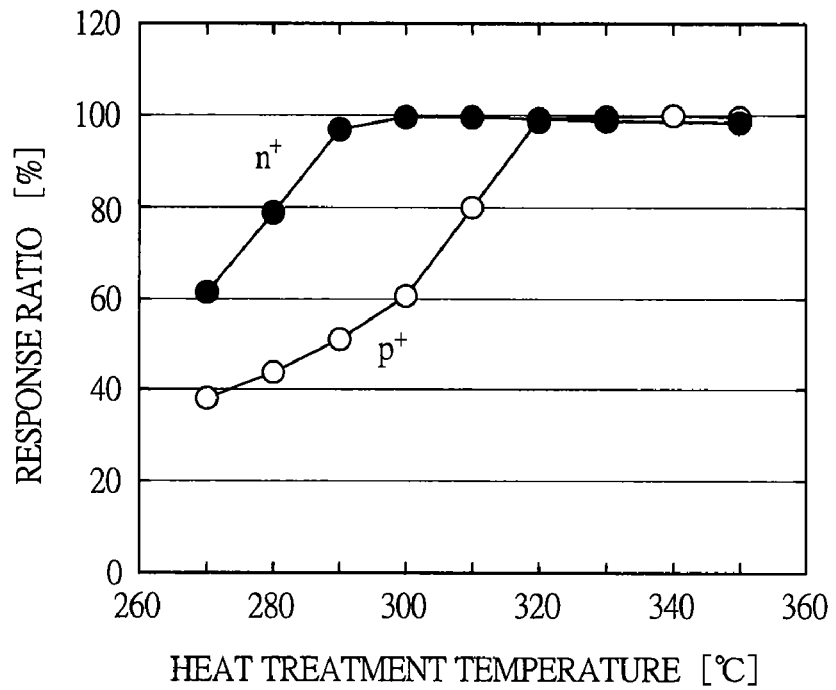
FIG. 40 is a graph showing a heat treatment temperature dependency of a reaction rate of a $n^+$ type silicon region and a Ni film, and that of a reaction rate of a $p^+$ type silicon region and a Ni film according to the third embodiment of the present invention.

FIG. 40 is a graph showing the reaction rate of the Ni film in the case where a $p^+$ type silicon region and an $n^+$ type silicon region are formed on a semiconductor substrate, a Ni film is formed about 10 nm and a TiN (titanium nitride) film is formed about 15 nm, and then the Ni film and the $p^+$ type silicon region, or the Ni film and the $n^+$ type silicon region are reacted by heat treatment. The horizontal axis of the graph of FIG. 40 corresponds to the heat treatment temperature to react the Ni film and the $p^+$ type silicon region, or the Ni film and the $n^+$ type silicon region by heat treatment, and the vertical axis of the graph of FIG. 40 corresponds to the reaction rate of the Ni film. The heat treatment in the case of FIG. 40 is performed for about 30 seconds by RTA. Further, in the graph of FIG. 40, the reaction rate of the Ni film when the Ni film and the $p^+$ type silicon region are reacted by heat treatment is shown by a white circle, and the reaction rate of the Ni film when the Ni film and the $n^+$ type silicon region are reacted by heat treatment is shown by a black circle.

As shown in FIG. 40, when the heat treatment temperature is 320° C. or higher, the reaction rate of the Ni film in the reaction of the Ni film and the $p^+$ type silicon region, and the reaction rate of the Ni film in the reaction of the Ni film and the $n^+$ type silicon region become almost same 100%, and it is understood that Ni is consumed entirely. Further, since the Ni is consumed entirely, it is considered that thickness of the nickel silicide layer ($Ni_2Si$ phase) formed on the surface of the $p^+$ type silicon region (the upper layer of the $p^+$ type silicon region), and the thickness of the nickel silicide layer ($Ni_2Si$ phase) formed on the surface of the $n^+$ type silicon region (the upper layer of the $n^+$ type silicon region) are same when the heat treatment temperature is 320° C. or more.

On the contrary, when the heat treatment temperature is lower than 320° C., the reaction rate of the Ni film in the reaction of the Ni film and the $p^+$ type silicon region, and the reaction rate of the Ni film in the reaction of the Ni film and the $n^+$ type silicon region are different. The reaction rate of the Ni film in the reaction of the Ni film and the $n^+$ type silicon region is almost 100% when the heat treatment temperature is in the range of 300° C. or higher and 320° C. or lower and Ni is consumed entirely, thereby forming a nickel silicide layer ($Ni_2Si$ phase) on the surface of the $n^+$ type silicon region (the upper layer portion of the $n^+$ type silicon region). When the heat treatment temperature is in the range lower than 300° C., the lower the heat treatment temperature becomes, the lower the reaction rate of the Ni film in the reaction of the Ni film and the $n^+$ type silicon region is, and for example, it becomes about 98% when the heat treatment temperature is 290° C., and it becomes about 60% when the heat treatment temperature is 270° C. That is, in this heat treatment temperature range (lower than 300° C.), Ni is not consumed entirely and unreacted Ni is left, thereby forming a nickel silicide layer ($Ni_2Si$ phase) on the surface of the $n^+$ type silicon region (on the upper layer portion of the $n^+$ type silicon region), and the thickness thereof becomes thinner as the heat treatment temperature is lowered.

On the other hand, the reaction rate of the Ni film in the reaction of the Ni film and the $p^+$ type silicon region decreases as the heat treatment temperature lowers in the range of lower than 320° C., and, for example, it becomes about 80%, when the heat treatment temperature is 310° C., and it becomes about 40%, when the heat treatment temperature is 270° C. In other words, in this heat treatment temperature range (lower than 320° C.), Ni is not consumed entirely, and unreacted Ni is left and a nickel silicide layer ($Ni_2Si$ phase) is formed on the surface of the $p^+$ type silicon region (on the upper layer portion of the $p^+$ type silicon region), and the thickness thereof becomes thin as the heat treatment temperature lowers.

Furthermore, when the heat treatment temperature is lower than 320° C., the reaction rate of the Ni film in the reaction of the Ni film and the $p^+$ type silicon region becomes lower than the reaction rate of the Ni film in the reaction of the Ni film and the $n^+$ type silicon region. From the difference between the reaction rate of the Ni film in the reaction of the Ni film and the $p^+$ type silicon region and the reaction rate of the Ni film in the reaction of the Ni film and the $n^+$ type silicon region, it is understood that the thickness of the nickel silicide layer that is formed on the surface of the p+ type silicon region (the upper layer portion of the p+ type silicon region) in the reaction of the Ni film and the p+ type silicon region becomes thinner than the thickness of the nickel silicide layer that is formed on the surface of the n+ type silicon region (the upper layer portion of the n+ type silicon region) in the reaction of the Ni film and the n+ type silicon region.

Figure 41:
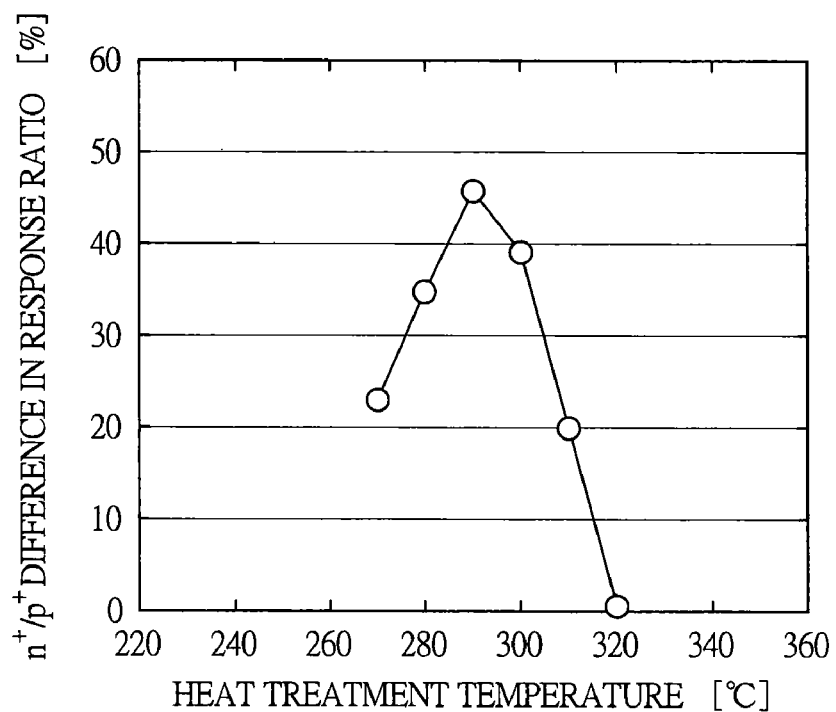
FIG. 41 is a graph showing a heat treatment temperature dependency of a difference between a reaction rate of a $n^+$ type silicon region and a Ni film and a reaction rate of a $p^+$ type silicon region and a Ni film according to the third embodiment of the present invention.

FIG. 41 is a graphical diagram showing the difference between the reaction rate of the Ni film in the reaction of the Ni film and the n+ type silicon region by the heat treatment shown in above FIG. 40, and the reaction rate of the Ni film in the reaction of the Ni film and the p+ type silicon region by the heat treatment.

The difference between the reaction rate of the Ni film in the reaction of the Ni film and the n+ type silicon region by the heat treatment, and the reaction rate of the Ni film in the reaction of the Ni film and the p+ type silicon region by the heat treatment becomes largest, about 45% at the heat treatment temperature 290° C. In the temperature range where the heat treatment temperature is higher than 290° C., as the heat treatment temperature becomes higher, so the difference of the reaction rates decreases, but when the heat treatment temperature is 310° C., there is a difference of about 20% in the reaction rates. Further, in the temperature range where the heat treatment temperature is lower than 290° C., as the heat treatment temperature lowers, the difference of the reaction rate decreases, but when the heat treatment temperature is 270° C., there is a difference of about 22% in the reaction rates.

From data shown in FIG. 39 to FIG. 41, it is thought that when the Ni film and the n+ type silicon region and the Ni film and a p+ type silicon region are reacted by the heat treatment at the temperature range 260° C. or more, and lower than 320° C., the nickel silicide layer of the $Ni_2Si$ phase that is thinner than the nickel silicide layer of the $Ni_2Si$ phase is formed on the surface of the n+ type silicon region (the upper layer portion of the n+ type silicon region), is formed on the surface of the p+ type silicon region (the upper layer portion of the p+ type silicon region).

For example, a p+ type silicon region and an n+ type silicon region are formed on a semiconductor substrate, and a Ni film is formed about 10 nm and a TiN film is formed about 15 nm thereon, and by heat treatment of heat treatment temperature 310° C., heat treatment time 30 seconds, the Ni film is reacted with the p+ type silicon region and the n+ type silicon region. In this case, a nickel silicide layer of $Ni_2S$ phase of thickness 15 nm (reaction rate at 100%) is formed on the surface of the n+ type silicon region (on the upper layer portion of the n+ type silicon region), and a nickel silicide layer of $Ni_2Si$ phase of thickness 12 nm (reaction rate at 80%) is formed on the surface of the p+ type silicon region (on the upper layer portion of the p+ type silicon region). Herein, when reaction rate in the first heat treatment is 100%, the thickness of the $Ni_2Si$ film becomes about 1.5 times of the thickness of the Ni film.

Thus, in the present embodiment, the first heat treatment of step S3a is performed at the temperature at which the reaction rate of metal film 12 in the reaction of the metal element M forming the metal film 12 and Si of the p+ type semiconductor region 10b becomes lower than the reaction rate of the metal film in the reaction of the metal element M forming the metal film 12 and Si of the n+ type semiconductor region 9b (260° C. or more, and lower than 320° C. in the case when the metal film 12 is a Ni film). Thereby, it is possible to make the thickness (the second thickness mentioned above) of the metal silicide layer ($M_2Si$) 41a formed on the surface of the p+ type semiconductor region 10b (on the upper layer portion of the p+ type semiconductor region 10b) in the stage of the first heat treatment of step S3a thinner than the thickness (the first thickness mentioned above) of the metal silicide layer ($M_2Si$) 41a formed on the surface of the n+ type semiconductor region 9b (on the upper layer portion of the n+ type semiconductor region 9b) in the stage of the first heat treatment of step S3a.

Next, by performing wet cleaning process, the barrier film 13 and the metal element M forming the unreacted metal film 12 (that is, the metal element M forming the metal film 12 that did not react with the gate electrodes 8a, 8b, the n+ type semiconductor regions 9b or the p+ type semiconductor regions 10b) are removed (step S4 of FIG. 36). At this moment, the metal silicide layer 41a is left on the surfaces of the gate electrodes 8a, 8b, the n+ type semiconductor regions 9b and p+ type semiconductor regions 10b. The wet cleaning process of the step S4 (process to remove the barrier film 13 and the unreacted metal film 12) can be performed, in the same manner as in the above first embodiment, by the wet cleaning using sulfuric acid or the wet cleaning using sulfuric acid and oxygenated water.

Next, a second heat treatment is performed on the semiconductor substrate 1 (step S5a of FIG. 36). In the same manner as in the second heat treatment of the step S5, it is preferable to perform the second heat treatment of the step S5a under ordinary pressure filled with inert gas (for example, Ar (Ar) gas or helium (He) gas) or a nitrogen ($N_2$) gas atmosphere. Further, the second heat treatment of the step S5a is performed at the heat treatment temperature that is higher than the heat treatment temperature of the first heat treatment of the above step S3a. For example, when the metal film 12 is a Ni film, the second heat treatment of step S5a is carried out about 550° C. For example, the second heat treatment of step S5a is performed by use of RTA method to the semiconductor substrate 1 under ordinary pressure filled with inert gas (for example, Ar gas or He gas) or a $N_2$ gas atmosphere, and the heat treatment is made at temperature about 550° C. for about 30 seconds. By the second heat treatment of step S5a, as shown in FIG. 38, the metal silicide layer 41a of an $M_2Si$ phase formed by the first heat treatment of step S3a changes into MSi phase (the metal silicide 41b of MSi phase), and a metal silicide layer 41b in which the composition ratio of the metal element M and the Si is close to the stoichiometry ratio at 1:1 is formed. Further, the MSi phase is low specific resistant than a $M_2Si$ phase and a $MSi_2$ phase, and the metal silicide layer 41b is maintained as a MSi phase of the low resistance after step S5a (until the end of production of the semiconductor device), and, in the produced semiconductor device (in the state where, for example, the semiconductor substrate 1 is divided into unit pieces to be semiconductor chips), the metal silicide layer 41b is in a MSi phase of the low resistance.

Further, by the second heat treatment of step S5a, when the metal silicide layer 41a of the $M_2Si$ phase changes into the metal silicide layer 41b of the MSi phase, the film thickness increases. However, the increase rate of the film thickness when the metal silicide layer ($M_2Si$ phase) 41a formed on the surface of the n+ type semiconductor region 9b (on the upper layer of the n+ type semiconductor region 9b) changes into the metal silicide layer (MSi phase) 41b, and the increase rate of the film thickness when the metal silicide layer ($M_2Si$ phase) 41a formed on the surface of the p+ type semiconductor region 10b (on the upper layer of the p+ type semiconductor region 10b) changes into the metal silicide layer (MSi phase) 41b are same. Therefore, the ratio of the thickness of the metal silicide layer ($M_2Si$ phase) 41a formed on the surface of the n+ type semiconductor region 9b (on the upper layer of the n+ type semiconductor region 9b) in the stage of the first heat treatment of step S3a, and the thickness of metal silicide layer (M₂Si phase) 41a formed on the surface of the p+ type semiconductor region 10b (on the upper layer of the p+ type semiconductor region 10b) in the stage of the first heat treatment of step S3 is maintained, and a metal silicide layer 41b is formed on the surface of the p+ type semiconductor region 10b (on the upper layer of the p+ type semiconductor region 10b) and on the surface of the n+ type semiconductor region 9b (on the upper layer of the n+ type semiconductor region 9b) by the second heat treatment of step S5a.

For example, a p+ type silicon region and an n+ type silicon region are formed on a semiconductor substrate, and a Ni film is formed about 10 nm and a TiN film is formed about 15 nm thereon, and as step S3a, by a first heat treatment of heat treatment temperature 310° C., heat treatment time 30 seconds, the Ni film is reacted with the p+ type silicon region and the n+ type silicon region. In this case, a nickel silicide layer of Ni₂Si phase of thickness 15 nm (reaction rate at 100%) is formed on the surface of the n+ type silicon region (on the upper layer portion of the n+ type silicon region), and a nickel silicide layer of Ni₂Si phase of thickness 12 nm (reaction rate at 80%) is formed on the surface of the p+ type silicon region (on the upper layer portion of the p+ type silicon region). Then, after removing the TiN film and unreacted Ni by performing wet cleaning process, as step S5a, a second heat treatment of temperature at 550° C., heat treatment time for 30 seconds is carried out. Thereby, a nickel silicide layer of the NiSi phase of thickness 21 nm (when the reaction rate in the first heat treatment is 100%, the thickness of the NiSi film becomes about 2.1 times of the thickness of the Ni film) is formed on the surface of the n+ type silicon region (on the upper layer portion of the n+ type silicon region), and a nickel silicide layer of the NiSi phase of thickness 16.8 nm is formed on the surface of the p+ type silicon region(on the upper layer portion of the p+ type silicon region).

Figure 42:
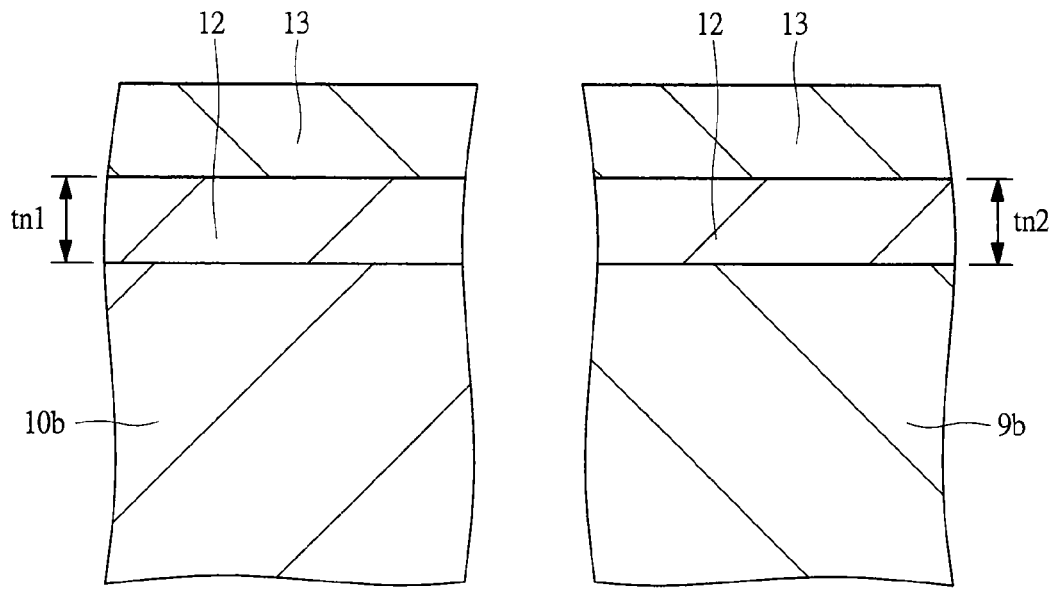
FIG. 42 is a cross-sectional view of main parts of the semiconductor device in a manufacturing step (at the stage after a metal film and a barrier film are formed) according to the third embodiment of the present invention.
Figure 43:
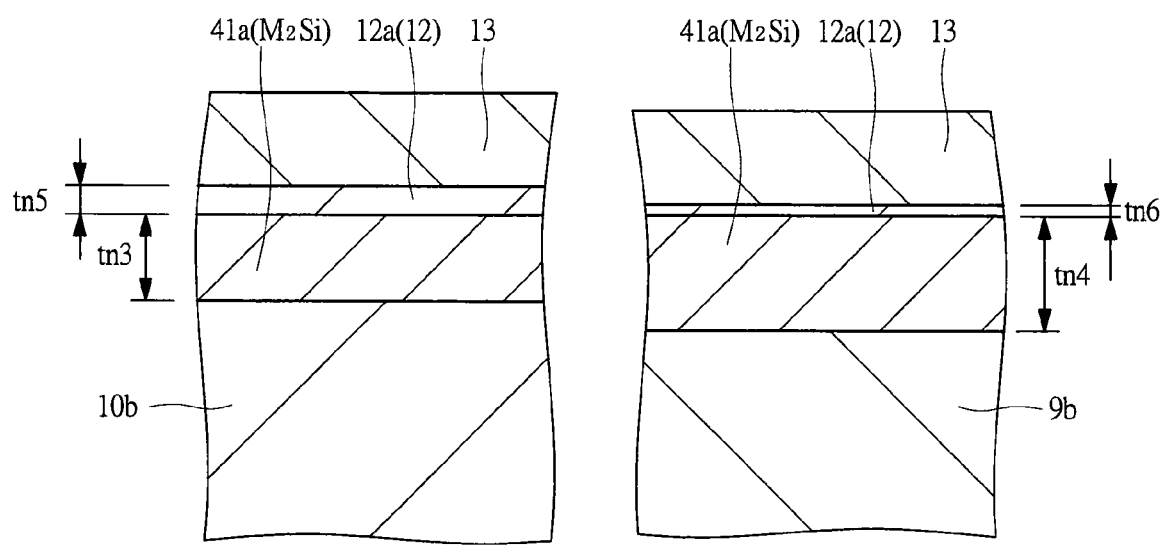
FIG. 43 is a cross-sectional view of main parts of the semiconductor device in a manufacturing step (at the stage after a first heat treatment is performed) according to the third embodiment of the present invention.
Figure 44:
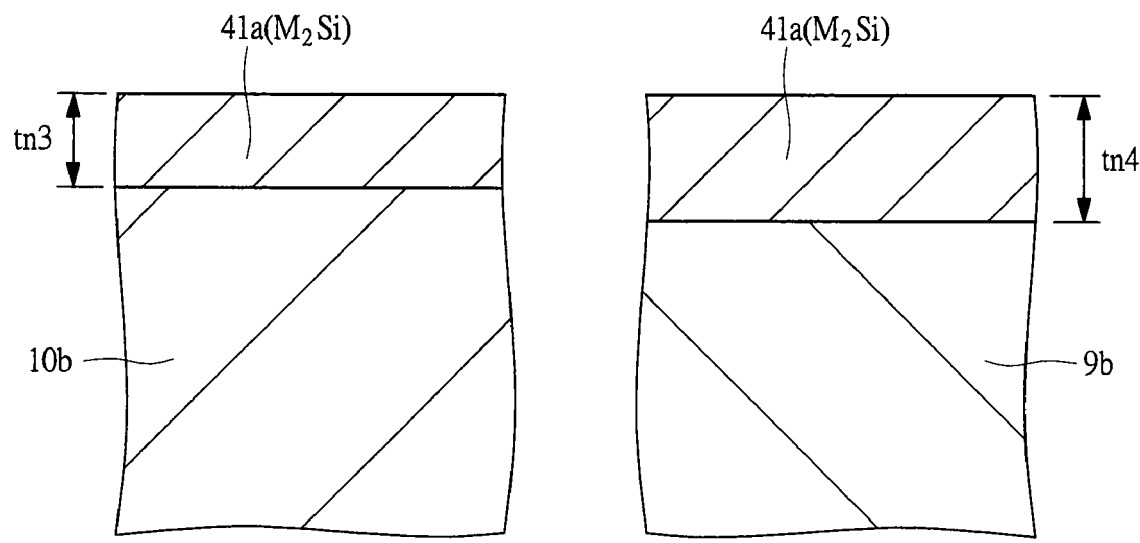
FIG. 44 is a cross-sectional view of main parts of the semiconductor device in a manufacturing step (at the stage after a step of removing the barrier film and the unreacted metal film is performed) according to the third embodiment of the present invention.
Figure 45:
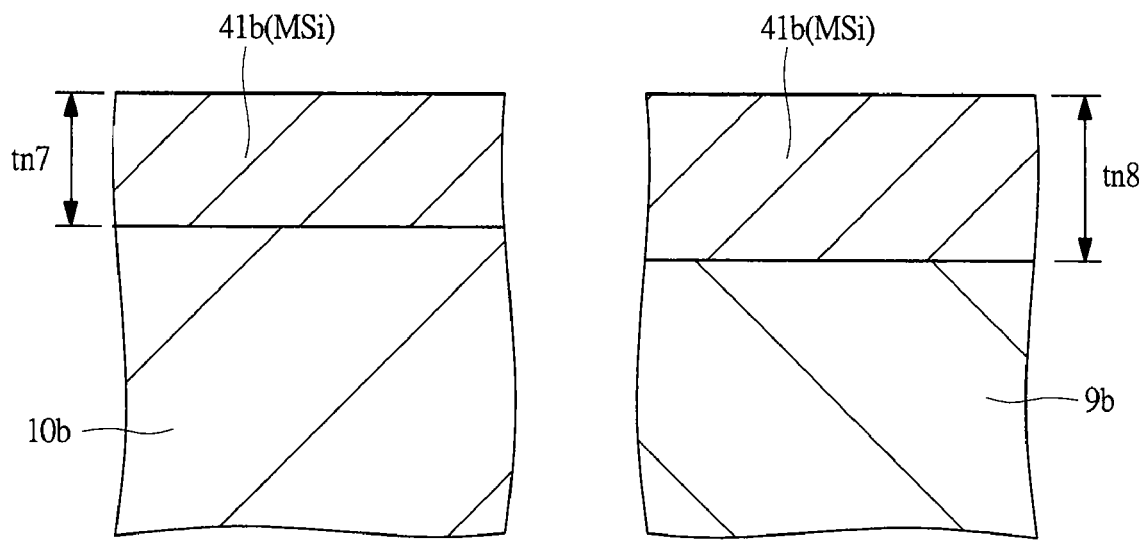
FIG. 45 is a cross-sectional view of main parts of the semiconductor device in a manufacturing step (at the stage after a second heat treatment is performed) according to the third embodiment of the present invention.

The relations mentioned above are summarized as follows. FIG. 42 to FIG. 46 are cross-sectional views of main parts of the semiconductor device in the manufacturing steps in stages of step S2, S3a, S4, S5, and an upper part around region of p+ type semiconductor region 10b and an upper part around region of n+ type semiconductor region 9b are shown. FIG. 42 shows a stage (a stage before the first heat treatment of step S3a) where the metal film 12 and the barrier film 13 are formed by performing steps S1, S2. FIG. 43 shows a stage where the first heat treatment of step S3a is carried out (stage before performing a removal process of the metal film 12 and the barrier film 13 of step S4). FIG. 44 shows a stage where the removal process of the metal film 12 and the barrier film 13 of the step S4 is carried out (stage before the second heat treatment of step S5a). FIG. 45 shows a stage where the second heat treatment of step S5a is carried out (stage before forming the insulating film 42).

As shown in FIG. 42, since the common metal film 12 is formed on the p+ type semiconductor region 10b and the n+ type semiconductor region 9b, at the stage before performs the first heat treatment of step S3a, the thickness (film thickness) tn1 of the metal film 12 on the p+ type semiconductor region 10b is the same as the film thickness tn2 of the metal film 12 on the n+ type semiconductor region 9b (i.e., tn1=tn2). And by performing the first heat treatment of step S3a, as shown in FIG. 43, the p+ type semiconductor region 10b and the n+ type semiconductor region 9b react with the metal film 12, and a metal silicide layer 41a is formed on the surface of the p+ type semiconductor region 10b and the n+ type semiconductor region 9b. The metal silicide layer 41a is equivalent to the metal silicide layer 41 of the above first embodiment, but, although the metal silicide layer 41a of the MSi phase is formed by the first heat treatment of step S3 in the above first embodiment, in the present embodiment, the metal silicide layer 41a of the M₂Si phase is formed by the first heat treatment of step S3a.

As mentioned above, the first heat treatment of step S3a is carried out at the temperature range in which the reaction rate of the p+ type semiconductor region 10b of the p-channel type MISFET Qp and the metal film 12 becomes lower than the reaction rate of the n+ type semiconductor region 9b of the n-channel type MISFET Qp and the metal film 12. Herein, the reaction rate of the p+ type semiconductor region 10b and the metal film 12 corresponds to the rate of the portion where the metal silicide layer 41a is formed by reaction with the p+ type semiconductor region 10b by the first heat treatment of step S3a among the metal film 12 positioned on the p+ type semiconductor region 10b. In the same manner, the reaction rate of the n+ type semiconductor region 9b and the metal film 12 corresponds to the rate of the portion where the metal silicide layer 41a is formed by reaction with the n+ type semiconductor region 9b by the first heat treatment of step S3a among the metal film 12 positioned on the n+ type semiconductor region 9b. Therefore, in the first heat treatment of step S3a, the ratio (thickness) of the portion to react with the p+ type semiconductor region 10b among the metal film 12 positioned on the p+ type semiconductor region 10b becomes smaller than the ratio (thickness) of the portion to react with the n+ type semiconductor region 9b among the metal film 12 positioned on the n+ type semiconductor region 9b. In other words, in the first heat treatment of step S3a, it may be said that the ratio (thickness) of the unreacted portion (portion which did not react with the p+ type semiconductor region 10b) among the metal film 12 positioned on the p+ type semiconductor region 10b is larger than the ratio (thickness) of the unreacted portion (portion which did not react with the n+ type semiconductor region 9b) among the metal film 12 positioned on the n+ type semiconductor region 9b.

Therefore, at the stage when the metal silicide layer 41a is formed by the first heat treatment of step S3a, as shown in FIG. 43, the thickness tn3 of metal silicide layer 41a formed on the surface of the p+ type semiconductor region 10b becomes thinner than the thickness tn4 of the metal silicide layer 41a formed on the surface of the n+ type semiconductor region 9b (i.e., tn3<tn4).

Furthermore, in the first heat treatment of step S3a, the reaction rate of the metal film 12 to be positioned on the p+ type semiconductor region 10b is lower than that of metal film 12 to be positioned on the n+ type semiconductor region 9b. Therefore, not all of the metal film 12 positioned on the p+ type semiconductor region 10b before the first heat treatment reacts with the p+ type semiconductor region 10b by the first heat treatment, and the part thereof reacts with the p+ type semiconductor region 10b. In other words, in the first heat treatment process of step S3a, in the reaction of the metal film 12 and the p+ type semiconductor region 10b, not all of the metal film 12 is consumed (reacted), but the metal element M forming the unreacted metal film 12 remains on the metal silicide layer 41a formed on the surface of the p+ type semiconductor region 10b. Therefore, after the first heat treatment of step S3a, the unreacted part 12a of the metal film 12 remains on the metal silicide layer 41a in the p+ type semiconductor region 10b, in the thickness (remaining thickness) tn5 that is thinner than the initial thickness (film thickness tn1) (i.e., tn5<tn1).

On the other hand, the reaction rate of the metal film 12 to be positioned on the n+ type semiconductor region 9b is higher than that of metal film 12 to be positioned on the p+ type semiconductor region 10b. Therefore, after the first heat treatment of step S3a, the thickness (remaining thickness) tn6 of the unreacted part 12a of the metal film 12 remaining on the metal silicide layer 41a on the n+ type semiconductor region 9b becomes thinner than the thickness (remaining thickness) tn5 of the unreacted part 12a of the metal film 12 remaining on the metal silicide layer 41a in the p+ type semiconductor region 10b (i.e., tn6<tn5). Further, even if, in the first heat treatment back of step S3a, all of the metal film 12 positioned on the n+ type semiconductor region 9b may react with the n+ type semiconductor region 9b, or not all but part thereof may react with the n+ type semiconductor region 9b. When all of the metal film 12 positioned on the n+ type semiconductor region 9b reacts with the n+ type semiconductor region 9b, after the first heat treatment of step S3a, the unreacted part 12a of the metal film 12 does not remain on the metal silicide layer 41a on the n+ type semiconductor region 9b, and the above thickness (remaining thickness) tn6 becomes 0 (tn6=0). On the other hand, when the part of the metal film 12 positioned on the n+ type semiconductor region 9b reacts with the n+ type semiconductor region 9b, after the first heat treatment of step S3a, the unreacted part 12a of the metal film 12 remains (tn6>0) on the metal silicide layer 41a on the n+ type semiconductor region 9b, and the thickness tn6 is thinner than the above thickness tn5 (tn6<tn5). Further, in FIG. 43, the case when the unreacted part 12a of the metal film 12 remains on the metal silicide layer 41a on n+ type semiconductor region 9b is shown, but the unreacted part 12a of the metal film 12 may not remain on the metal silicide layer 41a on the n+ type semiconductor region 9b.

After the first heat treatment of step S3, at the step S4, as shown in FIG. 44, the barrier film 13 and the unreacted part 12a of metal film 12 are removed, and by performing the second heat treatment of step S5a, as shown in FIG. 45, the metal silicide layer 41a of the M₂Si phase is made into the metal silicide layer 41b of the MSi phase. In other words, the metal silicide layer 41a of the M₂Si phase, and silicon (Si) of the gate electrodes 8a, 8b, the n+ type semiconductor region 9b and the p+ type semiconductor region 10b are further reacted by the second heat treatment of step S5a (reaction of M₂Si+Si→2MSi), and thereby the metal silicide layer 41b comprising the MSi phases that is more stable and lower specific resistant than the M₂Si phase is formed on the surface of the gate electrodes 8a, 8b, the n+ type semiconductor region 9b and the p+ type semiconductor region 10b. Therefore, the second heat treatment of step S5a is carried out at the temperature at which the metal silicide layer 41a of the M₂Si phase can be made into the metal silicide layer 41b of the MSi phase.

The thickness tn3 of the metal silicide layer 41a on the surface of the p+ type semiconductor region 10b is thinner than the thickness tn4 of the metal silicide layer 41b on the surface of the n+ type semiconductor region 9b (tn3<tn4), therefore, after the second heat treatment of step S5a, the thickness tn7 of the metal silicide layer 41b on the surface of the p+ type semiconductor region 10b becomes thinner than the thickness tn8 of the metal silicide layer 41b on the surface of the n+ type semiconductor region 9b (i.e., tn7<tn8).

Figure 46:
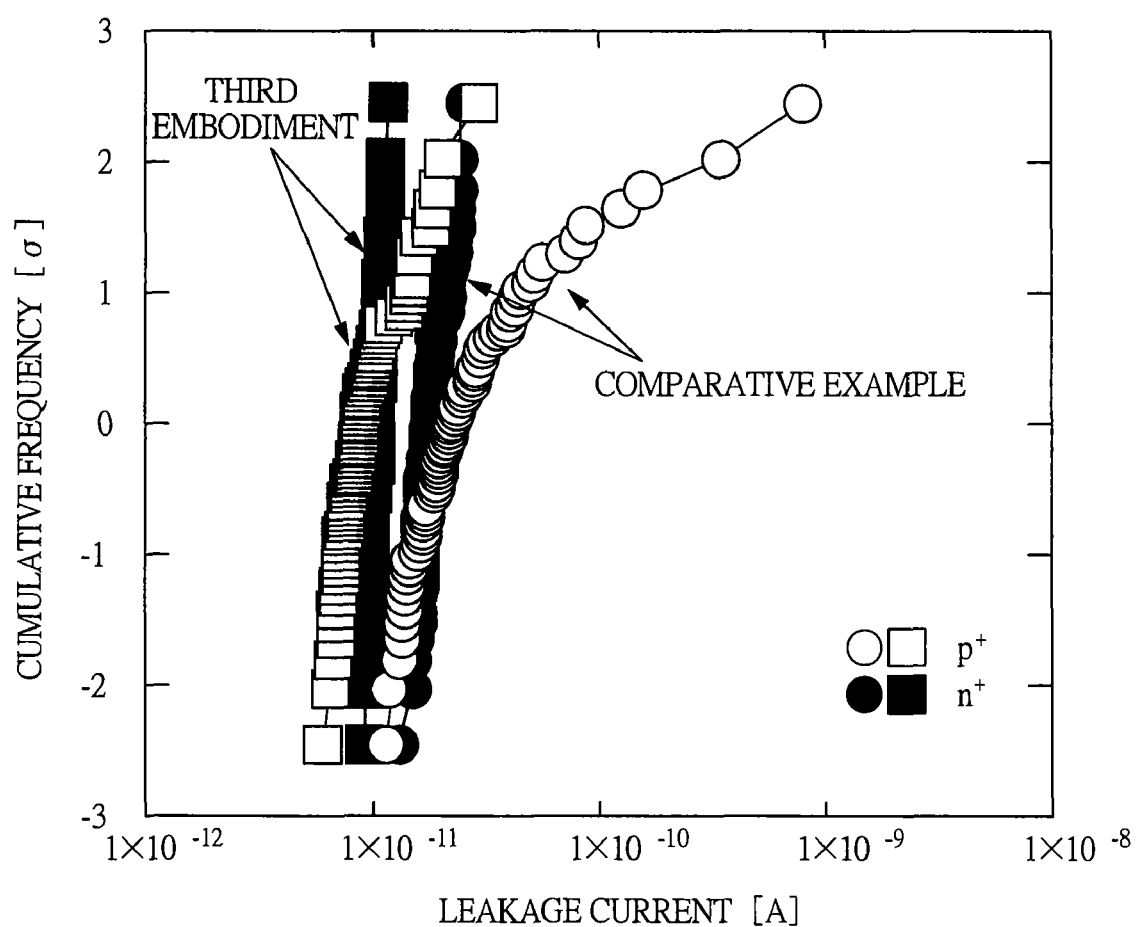
FIG. 46 is a graph showing a leakage current distribution of the nickel silicide layer according to the third embodiment of the present invention.

FIG. 46 is a graph showing the distribution (unevenness) of the leakage currents of the nickel silicide layer formed according to the steps S1 to S5a (S1, S2, S3a, S4, S5a) of the third embodiment (shown as "Third Embodiment" in the graph of FIG. 46) and the nickel silicide layer formed according to the steps of the comparative example (shown as "Comparative Example" in the graph of FIG. 46). The horizontal axis of the graph of FIG. 46 corresponds to the leakage current, and the vertical axis of the graph of FIG. 46 corresponds to the probability distribution (Cumulative Frequency). The steps (processes) of the comparative example in FIG. 46 are ones where the heat treatment temperature of the first heat treatment of step S3a is set at 320° C. among steps Si to S5a of the third embodiment.

As shown in FIG. 46, in comparison with the nickel silicide layer that is formed according to the steps of the above comparative example, in the nickel silicide layer that is formed according to steps S1 to S5a of the third embodiment, the unevenness of the leakage currents of the nickel silicide layer is smaller. The reason for this is thought to be as follows. In the comparative example, the nickel silicide layer of almost same thickness is formed on the surface of the p+ type silicon region (on the upper layer portion of and the p+ type silicon region) and the surface of the n+ type silicon region (on the upper layer portion of the n+ type silicon region). However, Ni is likely to diffuse more in the p+ type silicon region than in the n+ type silicon region, therefore, the nickel silicide layer that is formed on the surface of the p+ type silicon region (on the upper layer portion of and the p+ type silicon region) is likely to grow abnormally. Therefore, unevenness of the junction leakage currents is likely to occur in the p+ type silicon region more than the n+ type silicide region, though the nickel silicide layer of the same thickness is formed.

On the contrary, in the third embodiment, the thickness of the nickel silicide layer that is formed on the surface of the p+ type silicon region (on the upper layer portion of the p+ type silicon region) is formed thinner than the thickness of the nickel silicide layer that is formed on the surface of the n+ type silicon region (on the upper layer portion of the n+ type silicon region), and thereby, it is possible to reduce the unevenness of the junction leakage current in the p+ type silicide region.

In other words, Ni is likely to diffuse more in the p+ type silicon region than in the n+ type silicon region (the reaction of Ni and the Si is easy to advance), and the nickel silicide layer formed on the surface of the p+ type silicon region is easy to grow abnormally more than the nickel silicide layer formed on the surface of the n+ type silicon region. It is thought that the abnormal growth of this nickel silicide layer that is likely to occur to the p+ type silicon region is caused mainly by the part of NiSi₂ growing partially from the nickel silicide layer of NiSi phase to the semiconductor region (p+ type silicon region, n+ type silicon region) under the same. When the part of NiSi₂ grows from the nickel silicide layer to the p+ type silicon region and the n+ type silicon region partially, the abnormal growth region (NiSi₂) approaches or is closed to the junction surface, and the junction leakage of the p+ type silicon region and the n+ type silicon region increases. Further, the abnormal growth of this nickel silicide layer occurs not entirely in the nickel silicide layer but partially, and there are transistors where this occurs and transistors where this does not occur, which leads to unevenness in junction leakage per transistor. Since the nickel silicide layer is easy to grow abnormally in the p+ type silicon region more than in the n+ type silicon region, the increase of junction leakage current and the increase of unevenness of junction leakage current are likely to occur in the p+ type silicon region more than in the n+ type silicon region.

In order to suppress the increase of the junction leakage current of the p+ type silicon region and increase of unevenness of the junction leakage current, it is effective to thin the thickness of the nickel silicide layer to be formed on the surface of the p+ type silicon region. When the thickness of the nickel silicide layer to be formed on the surface of the p+ type silicon region is made thin, the quantity of the nickel silicide layer decreases (thickness becomes thin), and the quantity or volume of Ni supplied to the interface between NiSi/Si caused by the abnormal growth of the part of NiSi$_2$ decreases, and it is possible to suppress the part of NiSi$_2$ from growing abnormally from the nickel silicide layer locally to the p$^+$ type silicon region side. Therefore, it is possible to decrease the occurrence frequency of the transistors in which the nickel silicide layer grows abnormally. Furthermore, when the nickel silicide layer is made thin, the distance from the nickel silicide layer to the junction surface of the p$^+$ type silicon region becomes long and it is possible to decrease the junction leakage current, and even if the nickel silicide layer grows abnormally, it is possible to suppress the influence that it gives to the junction leakage current. Therefore, by thinning the thickness of the nickel silicide layer to be formed on the surface of the p$^+$ type silicon region, it is possible to suppress the increase of the junction leakage current of the p$^+$ type silicon region and the unevenness of the junction leakage current.

However, in the case when the nickel silicide layer of the same thickness is formed on the surface of the p$^+$ type silicon region and on the surface of the n$^+$ type silicon region respectively, if the nickel silicide layer on the surface of the p$^+$ type silicon region is made thin, the nickel silicide layer on the surface of the n$^+$ type silicon region in which the abnormal growth (the partial growth of the NiSi$_2$ part from the nickel silicide layer to the n$^+$ type silicon region) is hard to occur is made thin too. This decreases the effect of the resistance reduction by forming the nickel silicide layer on the surface of the n$^+$ type silicon region.

Therefore, in the third embodiment, the thickness of the metal silicide layer 41$b$ formed on the surface of p$^+$ type semiconductor region 10$b$ is made thinner than the thickness of the metal silicide layer 41$b$ formed on the surface of n$^+$ type semiconductor region 9$b$. Therefore, by thinning the thickness of the metal silicide layer 41$b$ formed on the surface of p$^+$ type semiconductor region 10$b$ in which the abnormal growth (the partial growth of the MSi$_2$ part from the metal silicide layer 41$b$ to p$^+$ type semiconductor region 10$b$) is likely to occur, it is possible to suppress the increase of the junction leakage current of the p$^+$ type semiconductor region 10$b$ and the unevenness of the junction leakage current. Further, by thickening the thickness of the metal silicide layer 41$b$ formed on the surface of the n$^+$ type semiconductor region 9$b$ in which the abnormal growth (the partial growth of the MSi$_2$ part from the metal silicide layer 41$b$ to the n$^+$ type semiconductor region 9$b$) is hard to occur, it is possible to obtain the effect of the resistance reduction by forming the metal silicide layer 41$b$ on the surface of the n$^+$ type semiconductor region 9$b$ properly or precisely.

Thus, in the third embodiment, it is possible to thin the thickness of the metal silicide layer 41$b$ formed on the surface of p$^+$ type semiconductor region 10$b$ while maintaining the thickness of the metal silicide layer 41$b$ formed on the surface of the n$^+$ type semiconductor region 9$b$. Therefore, it is possible to obtain both the effect of the resistance reduction by forming a relatively thick metal silicide layer 41$b$ on the surface of n$^+$ type semiconductor region 9$b$, and the effect of the reduction of the junction leakage current and the unevenness of the junction leakage current in the p$^+$ type semiconductor region 10$b$ by forming a relatively thin metal silicide layer 41$b$ on the surface of the p$^+$ type semiconductor region 10$b$. Accordingly, it is possible to improve the reliability of the semiconductor device. Further, it is possible to improve the performance of the semiconductor device.

Further, by controlling the temperature of the first heat treatment of step S3$a$, and changing the thickness of the metal silicide layer 41$a$ on the n$^+$ type semiconductor region 9$b$ and on the p$^+$ type semiconductor region 10$b$, and thereby, it is possible to make the thickness of the metal silicide layer 41$b$ on the surface of p$^+$ type semiconductor region 10$b$ after the second heat treatment of step S5$a$ thinner than the thickness of the metal silicide layer 41$b$ on the surface of the n$^+$ type semiconductor region 9$b$. Therefore, it is possible to make the thickness of the metal silicide layer 41$b$ in the surface of the p$^+$ type semiconductor region 10$b$ thinner than the thickness of the metal silicide layer 41$b$ on the surface of the n$^+$ type semiconductor region 9$b$, without increasing the number of processes of manufacture of semiconductor devices. Therefore, it is possible to reduce the number of processes of manufacture of the semiconductor device, simplify the process of manufacturing the semiconductor device, and reduce the production cost of the semiconductor device.

Furthermore, as the junction depth of the p$^+$ type semiconductor region 10$b$ and the n$^+$ type semiconductor region 9$b$ is made shallow, the influence to the junction leakage current when the metal silicide layer grows abnormally becomes large. In the present embodiment, by thinning the metal silicide layer 41$b$ that is formed on the surface of p$^+$ type semiconductor region 10$b$ than the metal silicide layer 41$b$ formed on the surface of the n$^+$ type semiconductor region 9$b$, the problem of the junction leakage current caused by the abnormal growth of the metal silicide layer is improved. Therefore, it is possible to make shallow the junction depth of the p$^+$ type semiconductor region 10$b$ and the n$^+$ type semiconductor region 9$b$, to scale the field effect transistor, which becomes advantageous to the miniaturization of the semiconductor device.

Moreover, in Pt (platinum), there are a Pt$_2$Si phase and a PtSi phase, but not a PtSi$_2$ phase. However, by the examinations of the present inventors, it has been found that even when a Pt film is used for the metal film 12, the increase of the junction leakage current and the unevenness of the junction leakage current are likely to occur in the source/drain of the p-channel type MISFET more than in the n-channel type MISFET, and by applying the process of manufacturing the present embodiment, it is possible to improve the problem of the junction leakage current. Therefore, in the present embodiment and a fourth embodiment hereinafter, a Pt film may be used for the metal film 12.

In the case where a Ni film or a Ni alloy film is used for the metal film 12, since M$_2$Si phase has a lower resistivity than that of the MSi phase as described above, MSi phase is used for the metal silicide layer 41$b$ as the device is finished instead of using M$_2$Si phase.

On the other hand, in the case where a Pt film is used for the metal film 12, Pt$_2$Si (diplatinum silicide) phase is used for the metal silicide layer 41$b$ as the device is finished instead of PtSi (platinum monosilicide). Because, PtSi and Pt$_2$Si have a same specific resistance of about 30 μΩ·cm and Pt$_2$Si consumes less silicon than PtSi, and thus the distance from the metal silicide layer to the junction can be made longer when Pt$_2$Si is used for the metal silicide layer 41$b$ than PtSi, thereby reducing leakage current.

Accordingly, the case where a Pt (platinum) film is used for the metal film 12 and the case where a Ni film or a Ni alloy film is used for the metal film 12 have different composition ratios of the metal element M and Si in the metal silicide layer 41$a$, 41$b$. As described above, in the case where a Ni film or a Ni alloy film is used for the metal film 12, the metal silicide layer 41$a$ is in M$_2$Si phase and the metal silicide layer 41$b$ is in MSi phase.

On the other hand, in the case where Pt (platinum) is used for the metal film 12, by the first heat treatment of the above step S3$a$, the Pt film as the metal film 12 is selectively reacted with the gate electrodes 8$a$, 8$b$, the n$^+$ type semiconductor region 9b, and the p+ type semiconductor region 10b, thereby forming the metal silicide layer 41a formed by a silicide of Pt. The metal silicide layer 41a in this case is formed by a silicide which is metal-richer than $Pt_2Si$ (diplatinum silicide) (i.e., a silicide having an atom ratio larger than that of $Pt_2Si$. Thus, a silicide having an atom ratio of Pt larger than ⅔), in particular, $Pt_5Si_2$ (pentaplatinum disilicide). Here, "metal-rich" means that an atom ratio of the metal element is large. After the first heat treatment of step S3a, the unreacted Pt film is removed, and then the metal silicide layer 41a ($Pt_5Si_2$) is made into the metal silicide layer 41b formed by $Pt_2Si$ (diplatinum silicide) to be stabilized by the second heat treatment of the above-described step S5a. $Pt_2Si$ does not change phase being stable when 700° C. or lower, thereby obtaining the metal silicide layer 41b in $Pt_2Si$ phase. In this manner, in the case where Pt is used for the metal film 12, by the first heat treatment of step S3a, the metal silicide layer 41a formed of a silicide (here, $Pt_5Si_2$) metal-richer than dimetal silicide of Pt (that is, $Pt_2Si$) is formed, and by the second heat treatment of step S5a, the metal silicide layer 41a is made into the metal silicide layer 41b formed of a dimetal silicide (that is, $Pt_2Si$) of Pt (metal element forming the metal film 12). However, there is fear that junction leakage current is increased caused by PtSi phase locally occurring (abnormal growth) from the metal silicide layer 41b in $Pt_2Si$ phase and making the distance from the metal silicide layer 41b to the junction shorter. Therefore, also in the case where Pt (platinum) is used for the metal film 12, it is effective when applying the present embodiment and the following fourth embodiment.

Note that, it is more effective when applying the manufacturing process of the present embodiment and the following fourth embodiment in the case where a Ni film or a Ni alloy film (preferable for a Ni alloy film is a Ni—Pt alloy film, Ni—Pd alloy film, a Ni—Y alloy film, a Ni—Yb alloy film, a Ni—Er alloy film, or a Ni-lanthanoid alloy film) is used rather than the case where Pt film is used for the metal film 12.

In the present embodiment, it is preferable that the film thickness of the metal film 12 formed in step S1 (deposition film thickness, the thickness on the direction perpendicular to the main surface of the semiconductor substrate 1) is 4 to 33 nm. When the metal film 12 is too thin, the thickness of the metal silicide layer 41b becomes too thin, and resistance increases. The thickness of the metal silicide layer 41b is obtained from the sheet resistance of metal silicide layer 41b and the ratio resistance of silicide materials demanded by design and, when the metal film 12 is a Ni film, a nickel silicide layer (NiSi phase) of the thickness of 8.4 nm or more is required, and therefore, the lower limit film thickness of the Ni film is 4 nm. Further, when the metal film 12 is too thick, the thickness of the metal silicide layer 41b becomes too thick, and there is a possibility of inviting the increase of the leakage current and, further, it becomes disadvantageous to scaling of the MIS. When the metal film 12 is a Ni film, it is necessary to make the thickness of the nickel silicide layer (NiSi phase) 21 nm or smaller, and, the upper limit film thickness of the Ni film becomes 33 nm because the reaction rate at the lower limit temperature (260° C.) of the first heat treatment of step S3 is 30%.

Figure 47:
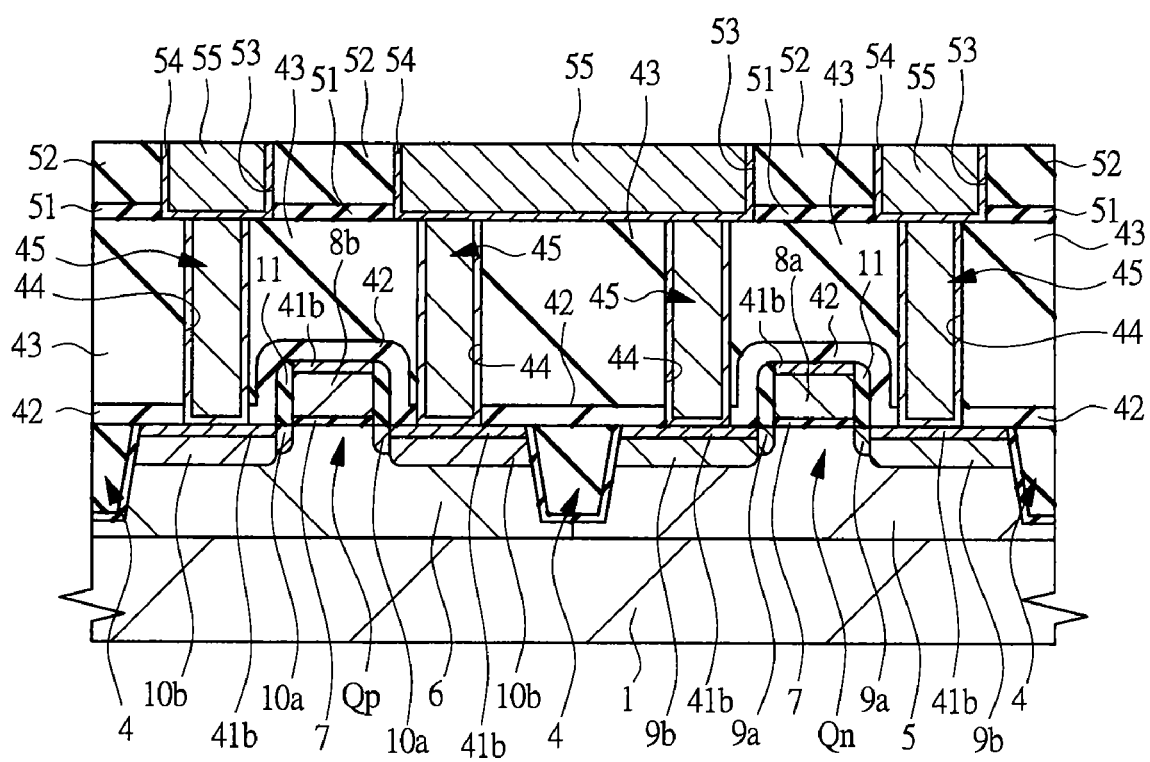
FIG. 47 is a cross-sectional view of main parts of the semiconductor device in a manufacturing step continued from FIG. 37.

By salicide technology, after the metal silicide layer 41b of the low resistance is formed on the surface the gate electrode 8a of n-channel type MISFET Qn and the surface of the source/drain (herein, n+ type semiconductor region 9b) and on the surface of the gate electrode 8b of p-channel type MISFET Qn and the surface of the source/drain (herein, p+ type semiconductor region 10b), wirings are formed in the same manner as in the above first embodiment. FIG. 47 is a cross-sectional view of main parts of the semiconductor device in a manufacturing step continued from FIG. 38.

In other words, in the same manner as in the first embodiment, as shown in FIG. 47, the insulating film 42 and the insulating film 43 are formed, and contact holes 44 are formed in the insulating films 43, 42 and the plugs 45 are formed in contact holes 44, and the stopper insulating film 51 and the insulating film 52 are formed on the insulating film 43 in which the plug 45 is buried, and the wiring trench 53 is formed, and the barrier conductive film 54 and a copper film are buried in the wiring trench 53 and the wiring 55 is formed. The wiring 55 is not limited to the implantation wiring formed by damascene method, but wirings (for example, tungsten wirings or aluminum wirings) formed by a patterned conductive film and the like may be employed, and this is same also to the above first, second and fourth to sixth embodiments to be described later herein.

Also in the present embodiment, in the various heating processes after the second heat treatment of step S5a of FIG. 36 (for example, processes with heating of the semiconductor substrate 1 such as the film formation processes of various kinds of insulating films and conductive films), the temperature of the semiconductor substrate 1 is kept so as not to become higher than the heat treatment temperature of the second heat treatment of step S5a. Thereby, it is possible to prevent the metal element M forming metal silicide layer (MSi phase) 41b from diffusing in the semiconductor substrate (the gate electrodes 8a, 8b, the n+ type semiconductor region 9b and the p+ type semiconductor region 10b) and causing property fluctuation of the n-channel type MISFET Qn and the p-channel type MISFET Qp, by the heat application after step S5a (the film formation process of, for example, various kinds of insulating films and conductive films).

In this manner, according to the third embodiment, it is possible to thin only the thickness of the metal silicide layer 41b formed on the surface of the p+ type semiconductor region 10b for the source/drain use of the p-channel type MISFET Qp, without changing the thickness of the metal silicide layer 41b formed on the surface of the gate electrode 8a of the n-channel type MISFET Qn and the gate electrode 8b of the p-channel type MISFET Qp, and the surface of the n+ type semiconductor region 9b for the source/drain of the n-channel type MISFET Qn. Therefore, it is possible to reduce the unevenness of the junction leakage current of the p+ type semiconductor region 10b for the source/drain of the p-channel type MISFET Qp, without inviting the increase of the resistance value of the gate electrode 8a of the n-channel type MISFET Qn and the gate electrode 8b of the p-channel type MISFET Qp, and the increase of the junction leakage current and the increase of the resistance of the n+ type semiconductor region 9b for the source/drain of the n-channel type MISFET Qn. Therefore, it is possible to prevent the changes of the characteristics of the p-channel type MISFET Qp, and improve the performance of the semiconductor device.

Fourth Embodiment

In the above third embodiment, the second heat treatment of step S5a is carried out in the state where the barrier film is not formed on the metal silicide layer 41a, meanwhile, in the present embodiment, as explained hereinafter, in the process of manufacture according to the above third embodiment, the second heat treatment of step S5a is carried out in the state where the barrier film 13a is formed.

Figure 48:
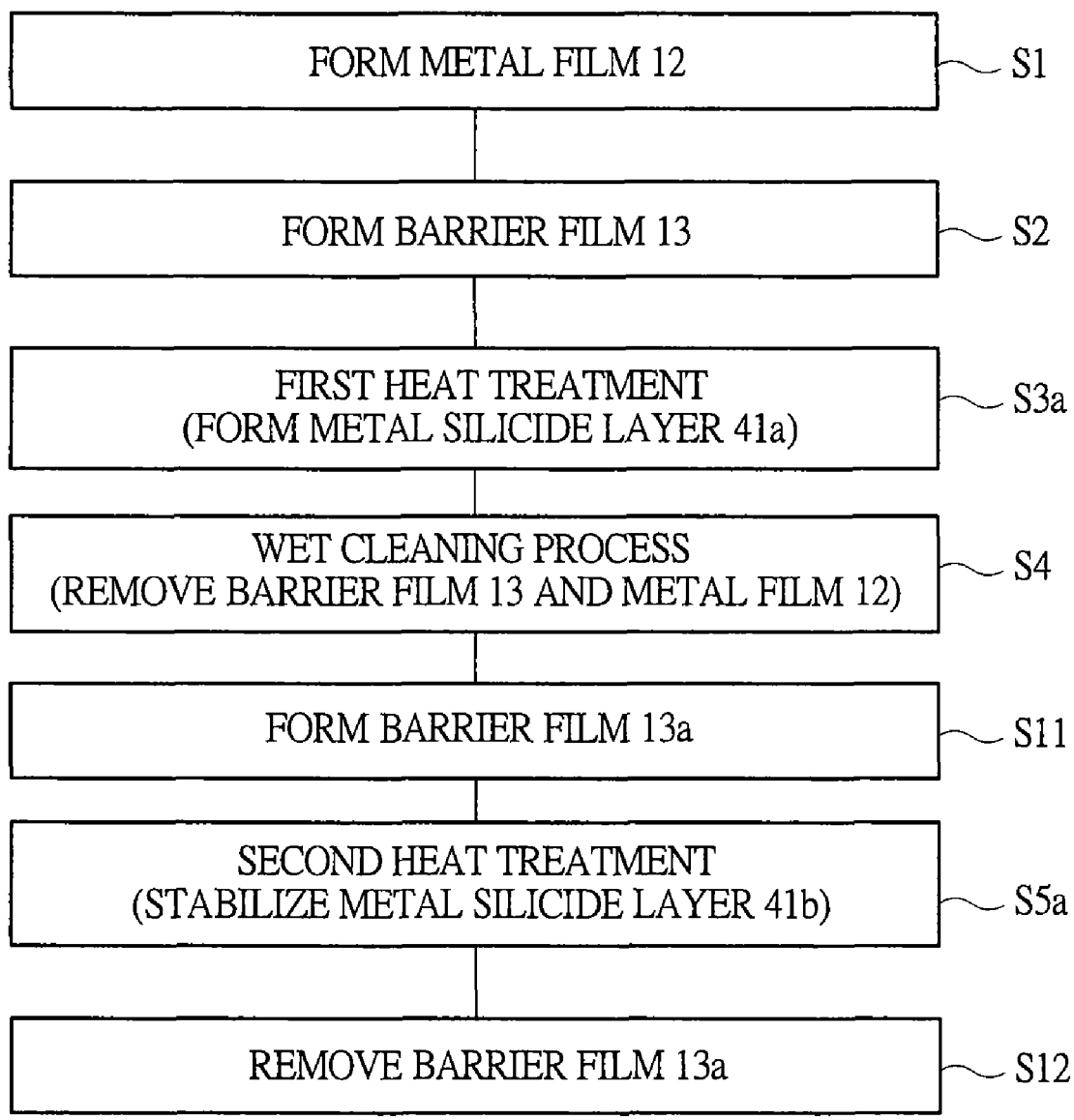
FIG. 48 is a manufacturing process flow chart showing a part of manufacturing steps of a semiconductor device according to a fourth embodiment of the present invention.

FIG. 48 is a manufacturing process flow showing a part of the process of manufacturing a semiconductor device according to the present embodiment and corresponds to FIG. 31 of the above second embodiment and FIG. 36 of the above third embodiment. In FIG. 48, a manufacturing process flow in a process is shown where a metal silicide layer (metal/semiconductor reaction layer) is formed on the surface of gate electrodes 8a, 8b, n$^+$ type semiconductor region 9b and p$^+$ type semiconductor region 10b by salicide process after the structure of above FIG. 7 is obtained. FIG. 49 to FIG. 52 are cross-sectional views of main parts of the semiconductor device in the manufacturing process according to the fourth embodiment.

Since the process of manufacturing the semiconductor device according to the fourth embodiment is same as that in the above third embodiment until the process in which the barrier film 13 and the unreacted metal film 12 are removed by wet cleaning process in above step S4, therefore the explanations thereof are omitted herein, and the processes following the above step S4 will be described.

Figure 49:
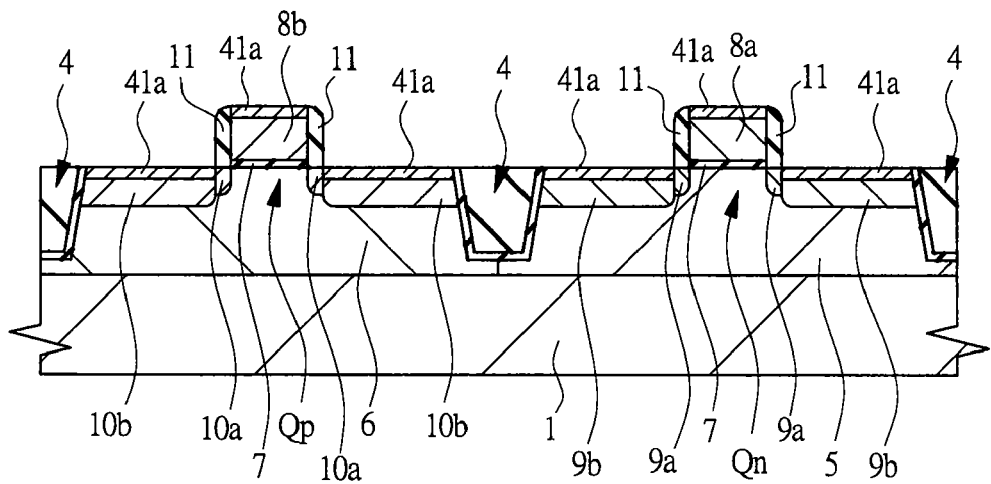
FIG. 49 is a cross-sectional view of main parts of the semiconductor device in a manufacturing step according to the fourth embodiment.
Figure 50:
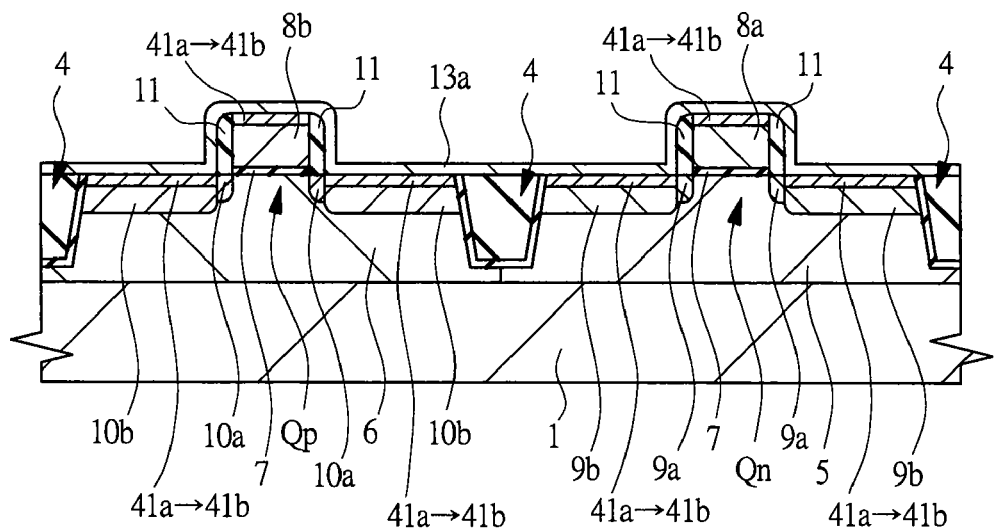
FIG. 50 is a cross-sectional view of main parts of the semiconductor device in a manufacturing step continued from FIG. 49.

The processes to above step S4 are carried out in the same manner as in the above third embodiment, and after the structure of FIG. 49 substantially equivalent to that in the above FIG. 37 is obtained, as shown in FIG. 50, a barrier film (second barrier film, stress control film, cap film) 13a are deposited (formed) on the semiconductor substrate 1 including the metal silicide layer 41a (step S11 of FIG. 48).

The barrier film 13a formation process of this step S11 in the present embodiment is similar to the barrier film 13a formation process of step S11 in the above second embodiment. In other words, the preferable materials, film formation method and stress (the stress that the barrier film 13a causes to the semiconductor substrate 1) of the barrier film 13a in the present embodiment are similar to those in the case of the barrier film 13a in the above second embodiment. Therefore, the barrier film 13a is a film to cause tensile stress to the semiconductor substrate 1.

Next, the second heat treatment of step S5a is carried out in the same manner as in the above third embodiment. In the fourth embodiment, although the second heat treatment of step S5a is performed in the state where the barrier film 13a is formed, the conditions and the roles of the second heat treatment of step S5a are same as those in the above third embodiment.

In the same manner as in the above third embodiment, in the fourth embodiment too, by performing the second heat treatment of the step S5a, the composition of the metal silicide layer 41a of the M$_2$Si phase formed by the first heat treatment of step S3a is changed into the metal silicide layer 41a of the MSi phase, and the composition ratio of the metal element M and Si becomes further close to the stoichiometry ratio 1:1, and the stabilized metal silicide layer 41 can be formed. Further, in the same manner as in the above third embodiment, in the fourth embodiment too, the thickness of the metal silicide layer (MSi) 41b on the surface of p$^+$ type semiconductor region 10b after the second heat treatment of step S5a becomes thinner than the thickness of the metal silicide layer (MSi) 41b on the surface of the n$^+$ type semiconductor region 9b after the second heat treatment of step S5a.

In the same manner as in the above third embodiment, in the fourth embodiment too, the second heat treatment of step S5a is carried out at the heat treatment temperature that is higher than the heat treatment temperature of the first heat treatment of step S3a, and, for example, when the metal film 12 is a Ni film, the heat treatment temperature is about 550° C. Further, in the same manner as in the above third embodiment, in the fourth embodiment too, after the second heat treatment of step S5a, to the production end of the semiconductor device (for example, to cutting semiconductor substrate 1 and making it into pieces of semiconductor chips), the semiconductor substrate 1 is kept from becoming the temperature that is higher than the heat treatment temperature of the second heat treatment of step S5a.

Finally, the barrier film 13a is a film which is difficult to react with the metal silicide layer 41a, 41b, and also a film which does not react with the metal silicide layer 41a, 41b even if the second heat treatment of step S5a is carried out. If the barrier film 13a reacts with the metal silicide layer 41a, 41b in the second heat treatment of step S5a, the composition of the metal silicide layer 41b may be changed. Therefore, as similar to the above-described second embodiment, also in the present embodiment, by making the barrier film 13a as a film which is difficult to react with the metal silicide layer 41, it is possible to prevent the barrier film 13a from reacting with the metal silicide layer 41a, 41b in the second heat treatment of step S5a, and to form the metal silicide layer 41b properly or precisely. As such a barrier film 13a that is difficult to react with the metal silicide layer 41a, 41b, a titanium nitride (TiN) film and a titanium (Ti) film are preferable.

Figure 51:
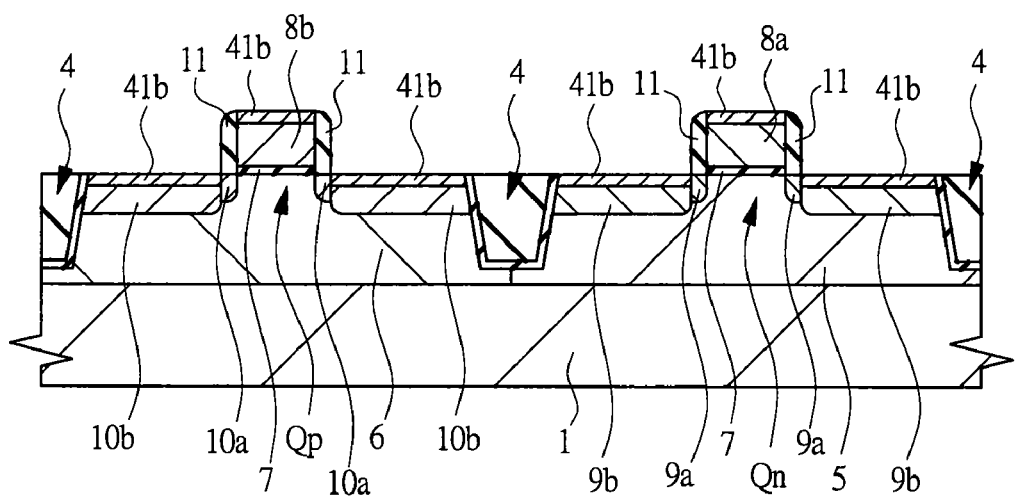
FIG. 51 is a cross-sectional view of main parts of the semiconductor device in a manufacturing step continued from FIG. 50.

After the second heat treatment of step S5a, as shown in FIG. 51, by performing wet cleaning process and the like, the barrier film 13a is removed (step S12 of FIG. 48). At this moment, the metal silicide layer 41b is left on the surface of the gate electrodes 8a, 8b, the n$^+$ type semiconductor region 9b and the p$^+$ type semiconductor region 10b. The wet cleaning process of step S12 may be performed by the wet cleaning using sulfuric acid, or the wet cleaning using sulfuric acid and oxygenated water. The barrier film 13a removal process of this step S12 in the present embodiment is same as the barrier film 13a removal process of step S12 in the above second embodiment.

Figure 52:
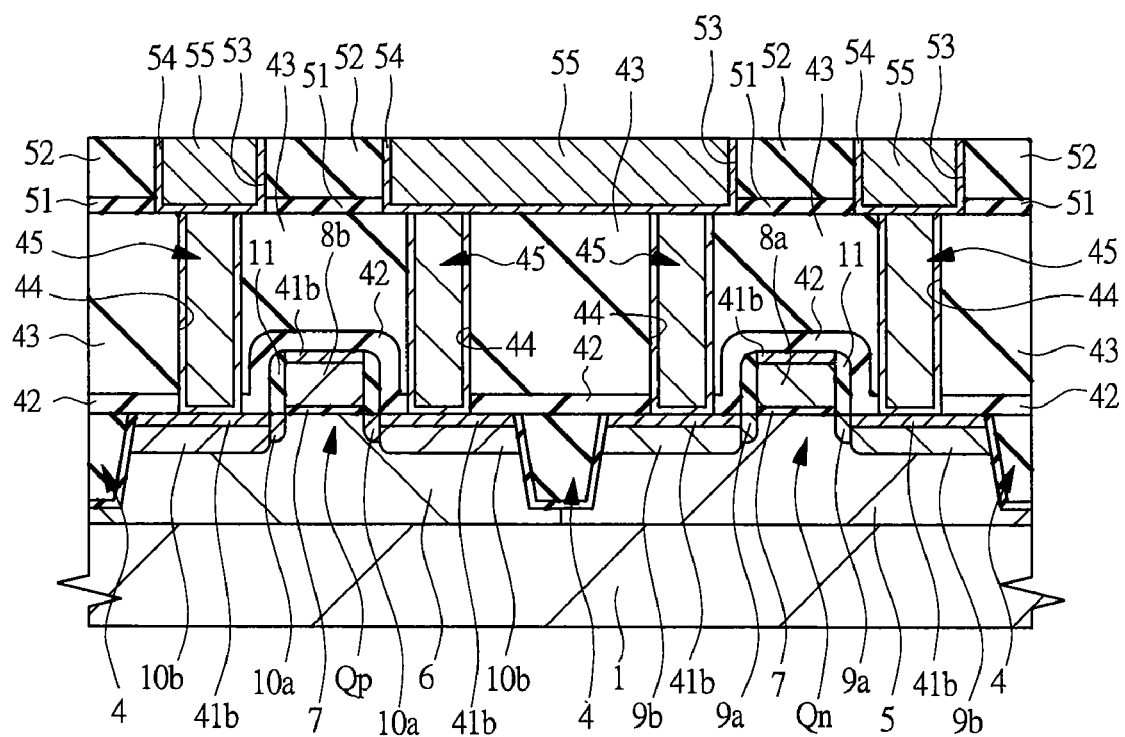
FIG. 52 is a cross-sectional view of main parts of the semiconductor device in a manufacturing step continued from FIG. 51.

The processes after that are same to those in the above third embodiment. In other words, in the same manner as in the first to third embodiments, as shown in FIG. 52, the insulating film 42 and the insulating film 43 are formed, and contact holes 44 are formed in the insulating films 43, 42 and the plugs 45 are formed in contact holes 44, and the stopper insulating film 51 and the insulating film 52 are formed on the insulating film 43 in which the plug 45 is buried, and the wiring trench 53 is formed, and the barrier conductive film 54 and a copper film are buried in the wiring trench 53 and the wiring 55 is formed.

In the present embodiment too, the barrier film 13a functions as a stress control film (a film to control the stress of the active region of the semiconductor substrate) and a film preventing transmission of the oxygen, in the same manner as the barrier film 13, and is arranged onto the metal film 12 for control of the stress to work to the semiconductor substrate 1 and oxidization prevention of the metal film 12 and the like. Therefore, a film like the barrier film 13 may be used as the barrier film 13a and preferably a TiN film or a Ti film may be used.

As explained with reference to above FIG. 18 to FIG. 22, the present inventors have found that NiSi$_2$ is easy to grow abnormally in the channel part of the MISFET from the nickel silicide layer, in the manufacturing process to form the nickel silicide layer by salicide technology. The occurrence of the abnormal growth of such NiSi$_2$ has been confirmed by the experiments (the cross-sectional observation of the semiconductor device and the composition analysis of the cross section) by the present inventors. And, it has been found that when the NiSi$_2$ grows abnormally from the nickel silicide layer into the channel part, the increase of the leakage current between the source/drain of the MISFET and the increase of the diffusion resistance of the source/drain region are brought about.

Therefore, the present inventors have investigated possible causes of the abnormal growth of $NiSi_2$ from the nickel silicide layer into the channel part, and found that there are mainly two causes as below. The first cause is that compression stress acts on the silicon region (the silicon region where Ni can diffuse) at the moment of the formation of the nickel silicide layer. The second cause is that there is oxygen on the surface at the moment of the formation of the nickel silicide layer. Among the first cause and the second cause, the influence of the first cause is larger.

The MISFET is formed in the active region of the semiconductor substrate 1 defined by the device isolation region 4, but like the first cause, in the state where compression stress acts to the active region forming a MISFET, when a heat treatment with the reaction for Ni to diffuse (move) is carried out, compression stress promotes the abnormal diffusion of the Ni and is easy to cause the abnormal growth of $NiSi_2$ from the nickel silicide layer to the channel part. It is thought that when compression stress acts to the semiconductor substrate 1, the lattice size (lattice interval) of the Si which constitutes the semiconductor substrate 1 (active region) becomes small, and approaches the lattice size (lattice interval) of $NiSi_2$ that is smaller than the lattice interval of Si, and it is thought that the reason is because substitution is likely to take place between lattices of Ni and Si. Further, when there is oxygen like the second cause, defects caused by oxygen increase and promote abnormal growth of $NiSi_2$. As the reason of this, it is thought that Ni is easy to diffuse through the caused defects.

As with the first to sixth embodiments, when the trench 4a formed in the semiconductor substrate 1 is buried by insulator materials (insulating films 4b, 4c) to form the device isolation region 4 is formed as in the present embodiment, in other words, when the device isolation region 4 is formed by STI method, in comparison with the case when device isolation region is formed by LOCOS (Local Oxidation of Silicon) method, the compression stress to act on the active region between the device isolation regions 4 becomes large. This is because the compression stress such that sidewalls of the trench 4a formed in the semiconductor substrate 1 push the active region side act on the active region between the device isolation regions 4. Further, in the case where the insulator material (herein, insulating film 4c) for the device isolation region 4 to fill the trench 4a is an insulating film (for example, a silicon oxide film) that is formed by CVD method (especially, HDP-CVD method), in comparison with the case of $O_3$-TEOS oxide film (insulating film formed by heat CVD method), there is little shrinkage in annealing, the compression stress to work by the device isolation region 4 to the active region forming a MISFET becomes large.

In the fourth embodiment, in the state where the compression stress caused by device isolation region 4 (the compression stress that device isolation region 4 acts on the active region forming a MISFET) is offset by the barrier film 13a that causes tensile stress to the semiconductor substrate 1, the second heat treatment of step S5a is performed, and the metal silicide layer 41a of the $M_2Si$ phase is made into the metal silicide layer 41b of the MSi phase that is low resistant and stable. Thereby, it is possible to prevent the compression stress from promoting the abnormal growth of $MSi_2$ from the metal silicide layers 41a and 41b to the channel part during the second heat treatment of step S5a. Therefore, in the fourth embodiment, it is possible not only to obtain the effect of the above third embodiment, but also to prevent the abnormal growth of MS12 from the metal silicide layers 41a and 41b to the channel part during the second heat treatment of step S5a. Therefore, it is possible to further improve the performance and reliability of the semiconductor device.

Further, in the fourth embodiment, the first heat treatment process of step S3a is performed, and then a wet cleaning process of step S4 is performed, and the barrier film 13a is formed on the semiconductor substrate 1 including the metal silicide layer 41a in step S11, but before forming the barrier film 13a, a dry cleaning processing similar to the dry cleaning processing (corresponding to process P2 of FIG. 11) to be performed before the step S1 (metal film 12 formation process) may be performed. When the barrier film 13a is formed in the state where a natural oxide film exists on the surface of the metal silicide layer 41a, and the second heat treatment of step S5a is performed, oxygen contained in the natural oxide film is taken into the metal silicide layers 41a and 41b. If the second heat treatment of step S5a is performed in this state, the resistance value of the metal silicide layer 41b may become high, the unevenness of the second resistance value may increase, and other nonconformities may take place. Therefore, it is preferable to remove the natural oxide film on the surface of the metal silicide layer 41a before forming the barrier film 13a of step S11. Therefore, after performing the wet cleaning process of step S4, a dry cleaning processing (the process to perform dry cleaning of the surface of the metal silicide layer 41a) may be performed, and in the state where the natural oxide film is removed, the barrier film 13a deposition process of step S11 may be performed. This is same also in the above second embodiment, but, in the case of the above second embodiment, the step S3a and the step S5a are read as the step S3 and the step S5, and the metal silicide layer 41a and the metal silicide layer 41b are read as the metal silicide layer 41.

Furthermore, in the deposition process of the barrier film 13a of step S11, a Ti film may be formed in the lower layer of the barrier film 13a. Since the Ti film has the property to easily take in oxygen, even if a natural oxide film is formed on the surface of the metal silicide layer 41a after wet cleaning process of step S4, the Ti film takes in oxygen contained in this natural oxide film, and thereby it is possible to remove the natural oxide film. Therefore, in the deposition process of barrier film 13a of step S11, at first a Ti film (titanium film) is deposited on the semiconductor substrate 1 including the metal silicide layer 41a, and then, this barrier film 13a (in this case, preferably a titanium nitride (TiN) film) may be deposited. Further, the dry cleaning processing mentioned above may be performed between the wet cleaning process of step S4 and the deposition process of barrier film 13a of step S11 mentioned above, and further a titanium film may be deposited under the barrier film 13a. When a Ti film is formed in the lower layer of the barrier film 13, the Ti film may be considered as a part of the barrier film 13a, and accordingly, it may be considered that the barrier film 13a is formed of a stacked film of a titanium (Ti) film in the lower layer and a titanium nitride (TiN) film in the upper layer. Thereby, by the first heat treatment process of step S3a and the wet cleaning process of step S4, it is possible to remove the natural oxide film on the surface of the metal silicide layer 41a formed on the surface of the gate electrodes 8a, 8b, the $n^+$ type semiconductor region 9b, and the $p^+$ type semiconductor region 10b properly or precisely, and it is possible to prevent nonconformities of the increase of the resistance value of the metal silicide layer 41b formed by the second heat treatment of step S5a, the increase of the unevenness of the resistance value and the like. This is same also in the above second embodiment, but, in the case of the above second embodiment, the step S3a and the step S5a are read as the step S3 and the step S5, and the metal silicide layer 41a and the metal silicide layer 41b are read as the metal silicide layer 41.

Fifth Embodiment

The present embodiment, as described below, is one where in the process of manufacture in the third embodiment, the upper limit temperature in the same manner as in the second heat treatment of step S5 of the above first embodiment is set to the heat treatment temperature of the second heat treatment of step S5a in the third embodiment.

Figure 53:
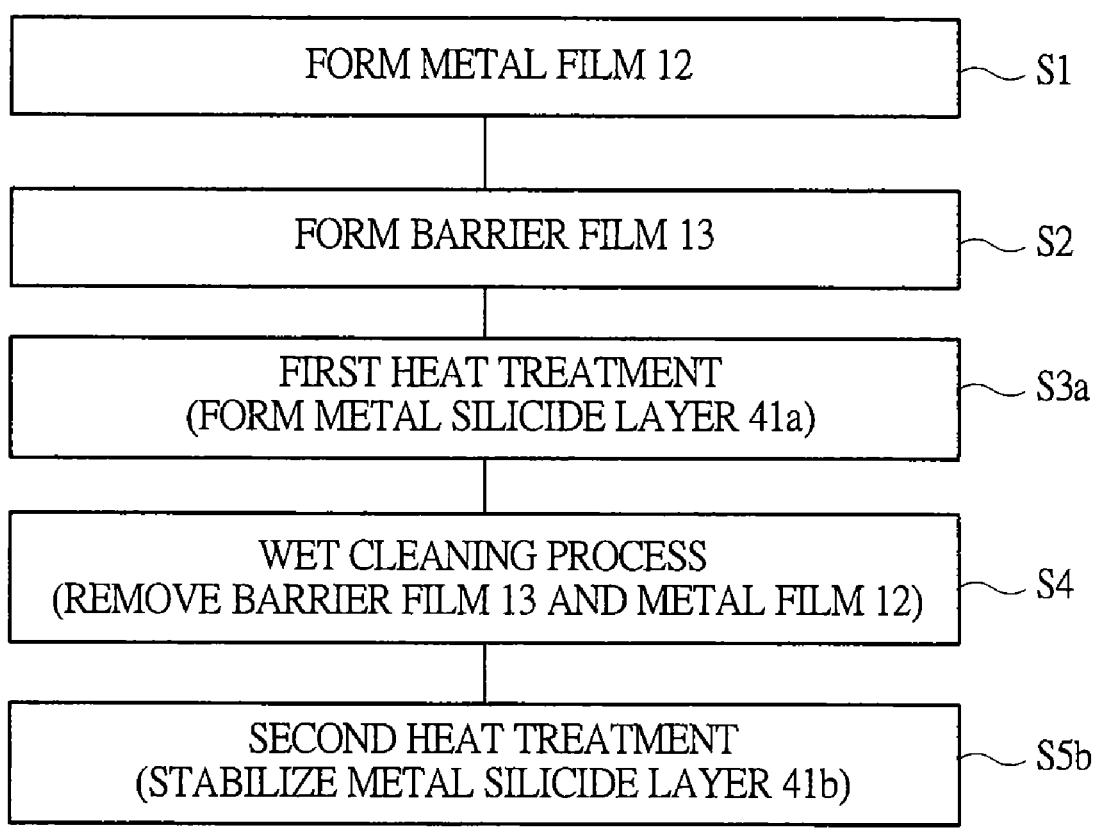
FIG. 53 is a manufacturing process flow chart showing a part of manufacturing steps of a semiconductor device according to a fifth embodiment of the present invention.
Figure 54:
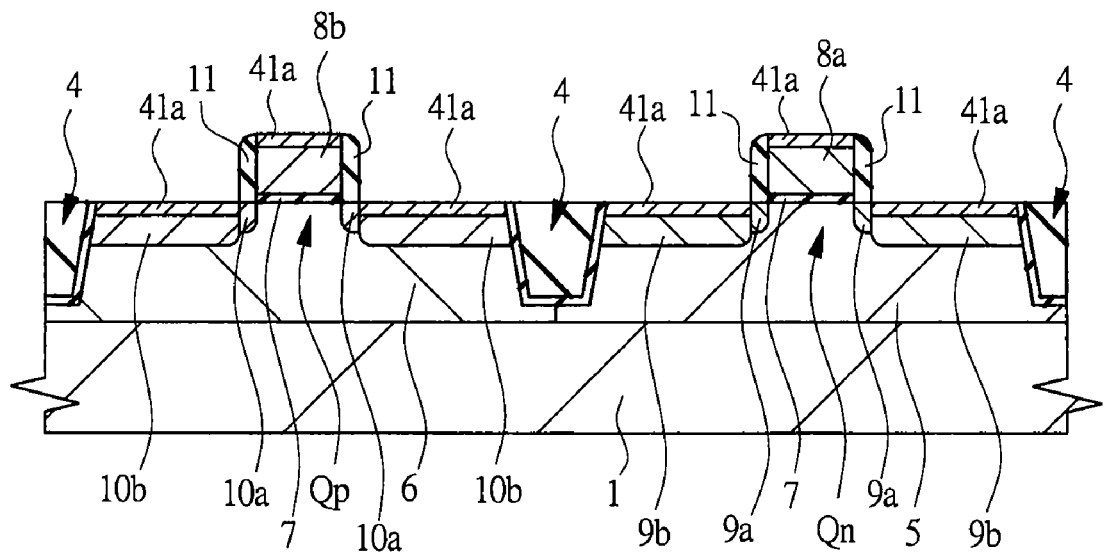
FIG. 54 is a cross-sectional view of main parts of the semiconductor device in a manufacturing step according to the fifth embodiment.
Figure 55:
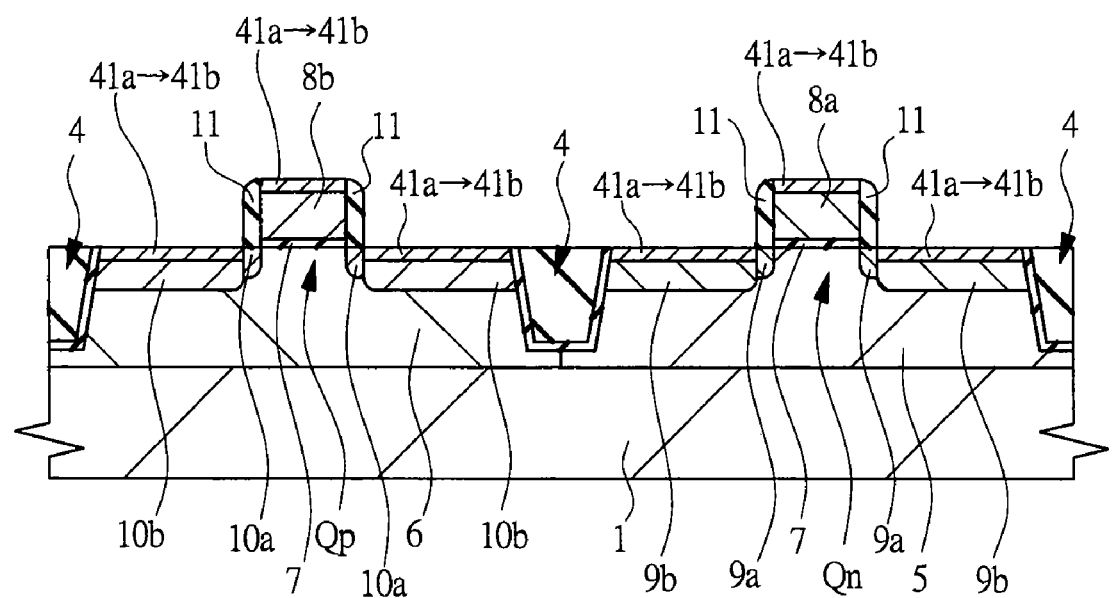
FIG. 55 is a cross-sectional view of main parts of the semiconductor device in a manufacturing step continued from FIG. 54.
Figure 56:
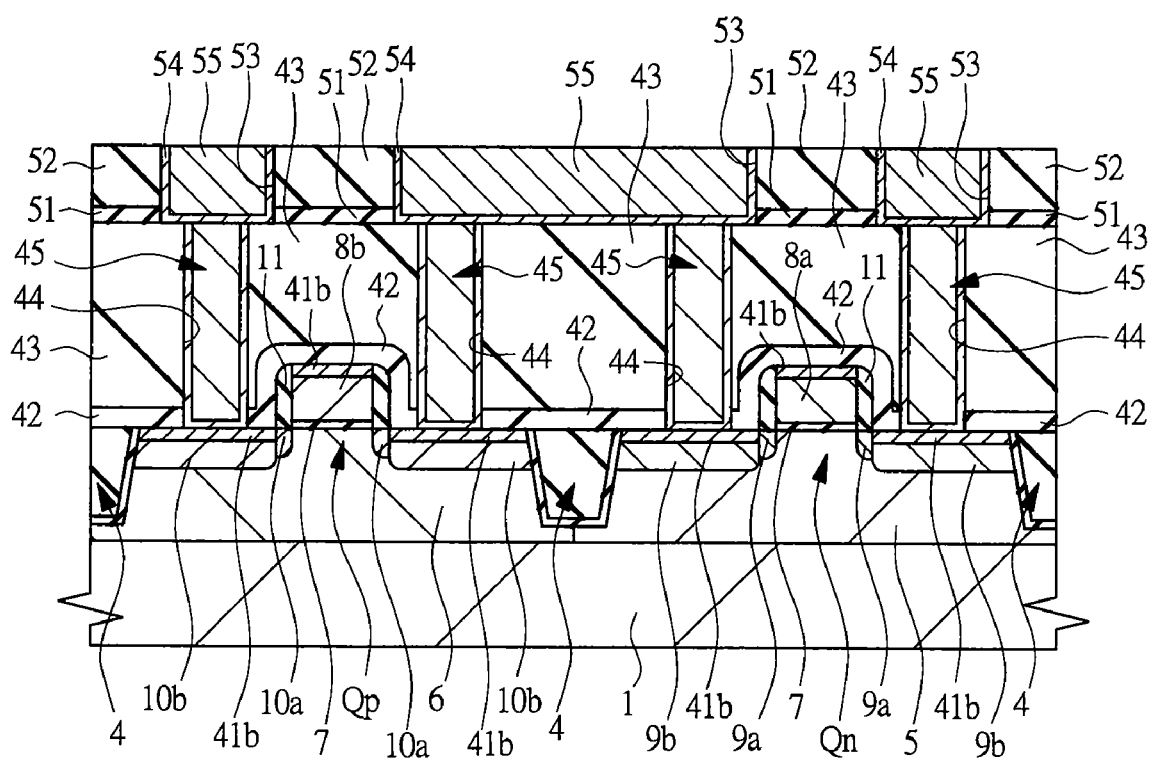
FIG. 56 is a cross-sectional view of main parts of the semiconductor device in a manufacturing step continued from FIG. 55.

FIG. 53 is a manufacturing process flow showing a part of the process of manufacturing a semiconductor device according to the present embodiment and corresponds to FIG. 9 of the above first embodiment and FIG. 36 of the above third embodiment. In FIG. 53, a manufacturing process flow in a process is shown where a metal silicide layer (metal/semiconductor reaction layer) is formed on the surface of gate electrodes 8a, 8b, n⁺ type semiconductor region 9b and p⁺ type semiconductor region 10b by salicide process after the structure of above FIG. 7 is obtained. FIG. 54 to FIG. 56 are cross-sectional views of main parts of the semiconductor device in the manufacturing process according to the present fifth embodiment.

Since the process of manufacturing the semiconductor device according to the present embodiment is same as the above third embodiment to the process in which wet cleaning process is carried out at the above step S4, and the barrier film 13 and the unreacted metal film 12 are removed, the explanations thereof are omitted herein, and processes following the above step S4 are explained.

In the same manner as in the above third embodiment, the processes to the above step S4 (in other words, steps S1, S2, S3a, S4) is carried out, and the structure of FIG. 54 almost equivalent to the above FIG. 37 is obtained. Then, the second heat treatment is performed on the semiconductor substrate 1 (step S5b of FIG. 53). The second heat treatment of step S5b is equivalent to the second heat treatment of step S5a of the above third embodiment, and has the same role as that of the second heat treatment of step S5a of the above third embodiment.

In the same manner as the second heat treatment of above step S5a, it is preferable that the second heat treatment of step S5b is performed under ordinary pressure filled with inert gas (for example, Ar gas or He gas) or a $N_2$ gas atmosphere.

Moreover, the second heat treatment of step S5b is performed at the heat treatment temperature that is higher than the heat treatment temperature of the first heat treatment of above step S3a. By performing the second heat treatment of step S5b, as shown in FIG. 55, the metal silicide layer 41a of $M_2Si$ phase formed in the first heat treatment of step S3a changes into the metal silicide layer 41b of the MSi phase, and the stable metal silicide layer 41b in which the composition ratio with metal element M and the Si is close to the stoichiometry ratio 1:1 is formed. Note that, the MSi phase has a lower specific resistant than the $M_2Si$ phase and the $MSi_2$ phase, and the metal silicide layer 41b is maintained as a MSi phase of the low resistance even after step S5b (to the production end of the semiconductor device), and, in manufactured semiconductor device (for example, in the state where the semiconductor substrate 1 is divided into pieces to become semiconductor chips), the metal silicide layer 41b is in the MSi phase of the low resistance.

In the same manner as the above third embodiment, in the present embodiment, in the metal silicide layer 41a of the $M_2Si$ phase formed by the first heat treatment of step S3a, the thickness of the metal silicide layer 41a formed on the surface of n⁺ type semiconductor region 9b becomes thinner than the thickness of the metal silicide layer 41a formed on the surface of p⁺ type semiconductor region 10b. Therefore, in the same manner as in the above third embodiment, in the present embodiment too, the thickness of the metal silicide layer 41b on the surface of p⁺ type semiconductor region 10b becomes thinner than the thickness of the metal silicide layer 41b on the surface of n⁺ type semiconductor region 9b in the metal silicide layer 41b of the MSi phase formed by the second heat treatment of step S5b.

As explained in the above third embodiment, since the metal element M is likely to diffuse and metal element M and Si are easy to react more in the p⁺ type semiconductor region 10b than in the n⁺ type semiconductor region 9b, the metal silicide layer 41b of the MSi phase formed on the surface of the p⁺ type semiconductor region 10b is more likely to grow abnormally than the metal silicide layer 41b of a MSi phase formed on the surface of n⁺ type semiconductor region 9b, and the $MSi_2$ part is generated and grows abnormally. To cope with this, in the above third embodiment and the present fifth embodiment, the thickness of the metal silicide layer 41b formed on the surface of the p⁺ type semiconductor region 10b is made thinner than the thickness of the metal silicide layer 41b formed on the surface of the n⁺ type semiconductor region 9b.

However, it is further preferable to suppress the abnormal growth of the metal silicide layer 41b (partial growth of the $MSi_2$ part) as much as possible. In the same manner as in the second heat treatment of step S5b of the above first embodiment, in the second heat treatment of step S5 of the present embodiment, if the lattice size of the semiconductor substrate 1 is close to the lattice size of $MSi_2$, substitution between lattices of the metal element M and the Si is likely to take place, and therefore by the second heat treatment, the metal element M is likely to diffuse from the metal silicide layers 41a and 41b, to the semiconductor substrate region (for example, the p⁺ type semiconductor region 10b and the n⁺ type semiconductor region 9b), and the $MSi_2$ part is easy to grow abnormally.

Therefore, in the second heat treatment of step S5b of the present embodiment, by setting the upper limit of the heat treatment temperature in the same manner as the second heat treatment of step S5 in the above first embodiment, the abnormal growth of the metal silicide layer 41b (partial growth of the $MSi_2$ part) is further suppressed.

In other words, in the same manner as in the second heat treatment of step S5 of the above first embodiment, in the present embodiment too, the heat treatment temperature $T_{12}$ of the second heat treatment of step S5b is made lower than the temperature $T_3$ at which the lattice size of the $MSi_2$ and the lattice size of the semiconductor substrate 1 becomes same ($T_{12}<T_3$). Thereby, when the second heat treatment of step S5b is performed, the lattice size of the semiconductor substrate 1 and the lattice size of the $MSi_2$ are made not to become same. Thereby, it is possible to suppress or prevent the abnormal growth of the metal silicide layers 41a and 41b (partial growth of the $MSi_2$ part) by the second heat treatment of step S5 further more properly or precisely, and the reason is substantially similar to the reason why it is possible to prevent the abnormal growth of $MSi_2$ in the second heat treatment of step S5 in the above first embodiment.

Therefore, in the same manner as in the second heat treatment of step S5b in the first present embodiment, also in the present embodiment, for example, when the semiconductor substrate 1 is a single crystal silicon (Si) substrate, and the metal film 12 is a Ni film, the heat treatment temperature $T_{12}$ of the second heat treatment of step S5b is made lower than the above temperature $T_4$ ($T_4$=590° C.) at which the lattice size of single crystal silicon (Si) and the lattice size of $NiSi_2$ become same ($T_{12}<T_4$=590° C.). Further, for example, when the semiconductor substrate 1 is single crystal silicon (Si) substrate and the metal film 12 is a Ni—Pt alloy film, the heat treatment temperature $T_{12}$ is made lower than the above temperature $T_5$ at which the lattice sizes of single crystal silicon (Si) and $Ni_{1-x}Pd_xSi_2$ become same ($T_{12}<T_5$). Further, for example, when the metal film 12 is a $Ni_{1-x}Pd_x$ alloy film, the heat treatment temperature $T_{12}$ of the second heat treatment of step S5b is made lower than the temperature at which the lattice size of $Ni_{1-x}Pd_xSi_2$ and the lattice size of the semiconductor substrate 1 become same. Further, for example, the metal film 12 is a $Ni_{1-x}Yb_x$ alloy film, the heat treatment temperature $T_{12}$ of the second heat treatment of step S5b is made lower than the temperature at which the lattice size of $Ni_{1-x}Yb_xSi_2$ and the lattice size of the semiconductor substrate 1 become same. Further, for example, the metal film 12 is a $Ni_{1-x}Er_x$ alloy film, the heat treatment temperature $T_{12}$ of the second heat treatment of step S5b is made lower than the temperature at which the lattice size of $Ni_{1-x}Er_xSi_2$ and the lattice size of the semiconductor substrate 1 become same. Further, for example, the metal film 12 is a $Ni_{1-x}Y_x$ alloy film, the heat treatment temperature $T_{12}$ of the second heat treatment of step S5b is made lower than the temperature at which the lattice size of $Ni_{1-x}Y_xSi_2$ and the lattice size of the semiconductor substrate 1 become same. Moreover, for example, the metal film 12 is a $Ni_{1-x}Ln_x$ alloy film (here, Ln: lanthanoid element), the heat treatment temperature $T_{12}$ of the second heat treatment of step S5b is made lower than the temperature at which the lattice size of $Ni_{1-x}Ln_xSi_2$ and the lattice size of the semiconductor substrate 1 become same.

As described above, in the present embodiment, at least the heat treatment temperature $T_{12}$ of the second heat treatment of step S5b is made lower than the temperature $T_3$ at which the lattice size of the $MSi_2$ and the lattice size of the semiconductor substrate 1 become same (in other words, the above mismatch α becomes 0%) ($T_{12}<T_3$). And further, in the same manner as the step S5 of the above first embodiment, in the present embodiment too, it is preferable that the difference (modulus) between the lattice size of $MSi_2$ at the heat treatment temperature $T_{12}$ of the second heat treatment of step S5 and the lattice size of the semiconductor substrate 1 is 0.01% or more of the lattice size of the semiconductor substrate 1 (in other words, α>0.01%), and it is further preferable that the difference is 0.02% or more of the lattice size of the semiconductor substrate 1 (in other words, α≧0.02%). Further, in the present embodiment, the definition of the mismatch α is same as in the above first embodiment.

Therefore, in the same manner as in the second heat treatment of step S5 of the above first embodiment, in the present embodiment too, it is desirable that the above mismatch a in the heat treatment temperature $T_{12}$ of the second heat treatment of step S5b is larger than zero % (α≧0%), and it is further preferable α is 0.01% or more (α≧0.01%), and it is furthermore preferable α is 0.02% or more (α≧0.02%). In other words, it is preferable that the heat treatment temperature $T_{12}$ of the second heat treatment of step S5b is lower than the temperature $T_6$ at which the above mismatch α becomes 0.01% ($T_{12}≦T_6$), and it is further preferable that the heat treatment temperature $T_{12}$ of the second heat treatment of step S5b is lower than the temperature $T_7$ at which the above mismatch α becomes 0.02% ($T_{12}≦T_7$). Thereby, in the second heat treatment of step S5b, since the difference between the lattice size of the semiconductor substrate 1 and the lattice size of $MSi_2$ is large to some extent, it is possible to prevent the metal silicide layers 41a and 41b from growing abnormally (the $MSi_2$ part from growing partially) more properly or precisely. Further, when the semiconductor substrate 1 is a single crystal silicon (Si) substrate and the metal film 12 is a nickel (Ni) film, for example, as mentioned above, in other words, when the metal silicide layer 41b is a nickel silicide (NiSi) layer, the temperature $T_6$ at which the above mismatch α becomes 0.01% is about 575° C. ($T_6$=575° C.), and the temperature $T_7$ at which the above mismatch α becomes 0.02% is about 560° C. ($T_7$=560° C.).

The second heat treatment of step S5b is performed, and the metal silicide layer 41b of the MSi phase is formed on the surface of the gate electrode 8a and the source/drain of the n-channel type MISFET Qn (herein, the n⁺ type semiconductor region 9b), and on the surface of the gate electrode 8b and the source/drain of the p-channel type MISFET Qp (herein, the p⁺ type semiconductor region 10b) and then, the process in the same manner as in the first and third embodiments is carried out.

In other words, in the same manner as in the first and third embodiments, as shown in FIG. 56, the insulating film 42 and the insulating film 43 are formed, and contact holes 44 are formed in the insulating films 43, 42 and the plugs 45 are formed in contact holes 44, and the stopper insulating film 51 and the insulating film 52 are formed on the insulating film 43 in which the plug 45 is buried, and the wiring trench 53 is formed, and the barrier conductive film 54 and a copper film are buried in the wiring trench 53 and the wiring 55 is formed.

Also in the present embodiment, in the various heating processes after the second heat treatment of step S5b of FIG. 53 (for example, in the processes with heating of the semiconductor substrate 1 such as the film formation processes of various kinds of insulating films and conductive films), the temperature of the semiconductor substrate 1 is kept so as not to become higher than the heat treatment temperature $T_{12}$ of the second heat treatment of step S5b. Thereby, it is possible to prevent the metal element M forming metal silicide layer (MSi phase) 41b from diffusing in the semiconductor substrate 1 (the gate electrodes 8a, 8b, the n⁺ type semiconductor region 9b and the p⁺ type semiconductor region 10b) that causes property fluctuation of the n-channel type MISFET Qn and the p-channel type MISFET Qp, by the heat application after step S5b (the film formation process of, for example, various kinds of insulating films and conductive films).

In the present embodiment, in addition to obtaining the effect of the above third embodiment, the upper limit of the heat treatment temperature $T_{12}$ of the second heat treatment of step S5b is set same as in the second heat treatment of step S5 in the above first embodiment. In other words, in the present embodiment, the heat treatment temperature $T_{12}$ of the second heat treatment of step S5b is made lower than the temperature $T_3$ at which the lattice size of $MSi_2$ and the lattice size of the semiconductor substrate 1 become same (that is, the above mismatch α becomes 0%) ($T_{12}<T_3$), and preferably it is set lower than the temperature $T_6$ at which the above mismatch α becomes 0.01% ($T_{12}≦T_6$), and further preferably it is set lower than the temperature $T_7$ at which the above mismatch α becomes 0.02% ($T_{12}≦T_7$). Thereby, in addition to obtaining the effect of the above third embodiment, it is possible to prevent the abnormal growth of the metal silicide layer 41b formed on the surfaces of the n⁺ type semiconductor region 9b and the p⁺ type semiconductor region 10b (partial growth of $MSi_2$ part) more properly or precisely, and to reduce the junction leakage currents in the n⁺ type semiconductor region 9b and the p⁺ type semiconductor region 10b further more, and reduce the unevenness of the junction leakage further more. Therefore, it is possible to improve the reliability and performance of the semiconductor device further more.

Sixth Embodiment

The present embodiment, as described below, is one where in the process of manufacture in the fourth embodiment, the upper limit temperature in the same manner as in the second heat treatment of step S5 of the above first embodiment is set to the heat treatment temperature of the second heat treatment of step S5a in the third embodiment.

Figure 57:
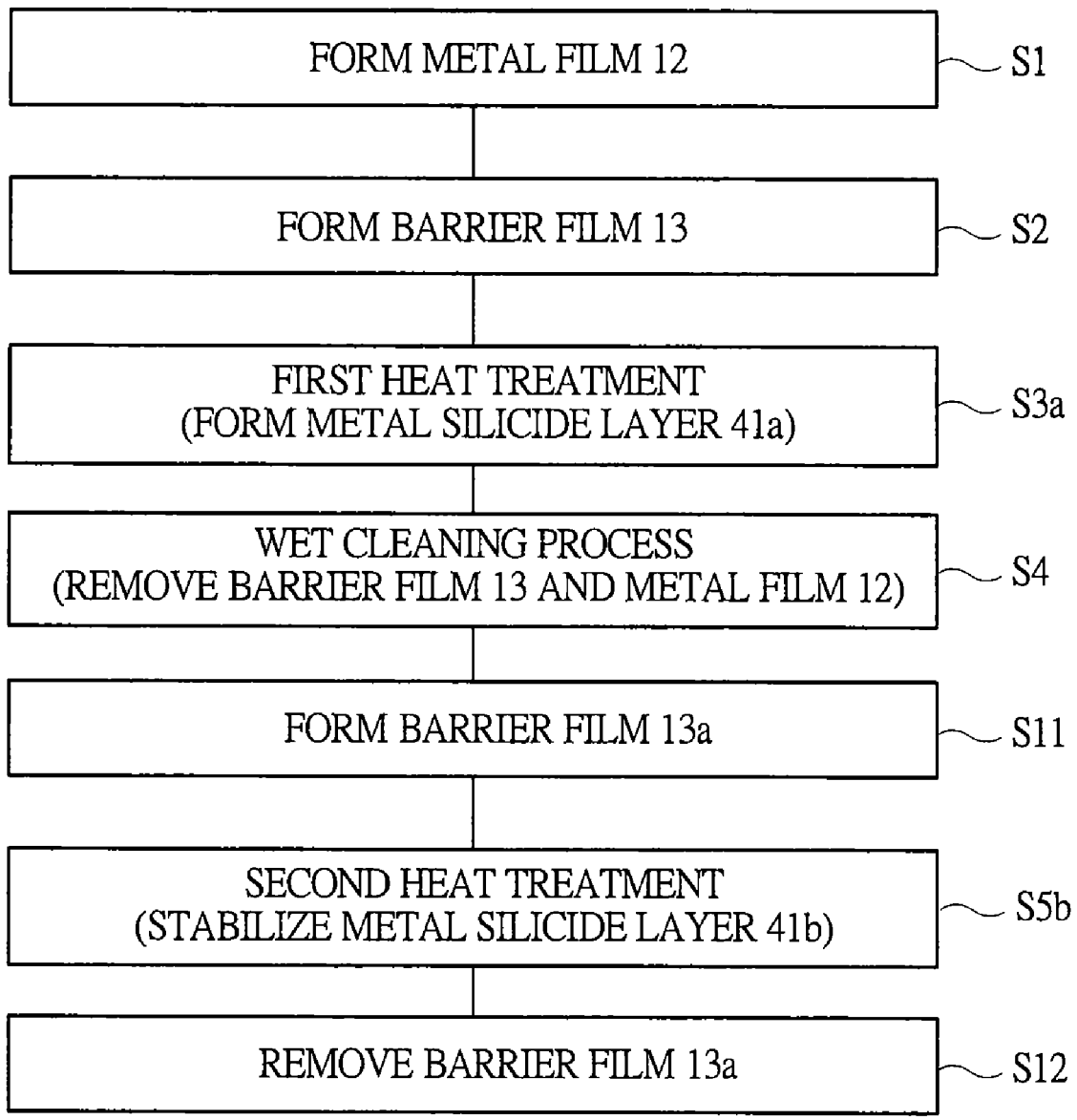
FIG. 57 is a manufacturing process flow chart showing a part of manufacturing steps of a semiconductor device according to a sixth embodiment of the present invention.
Figure 58:
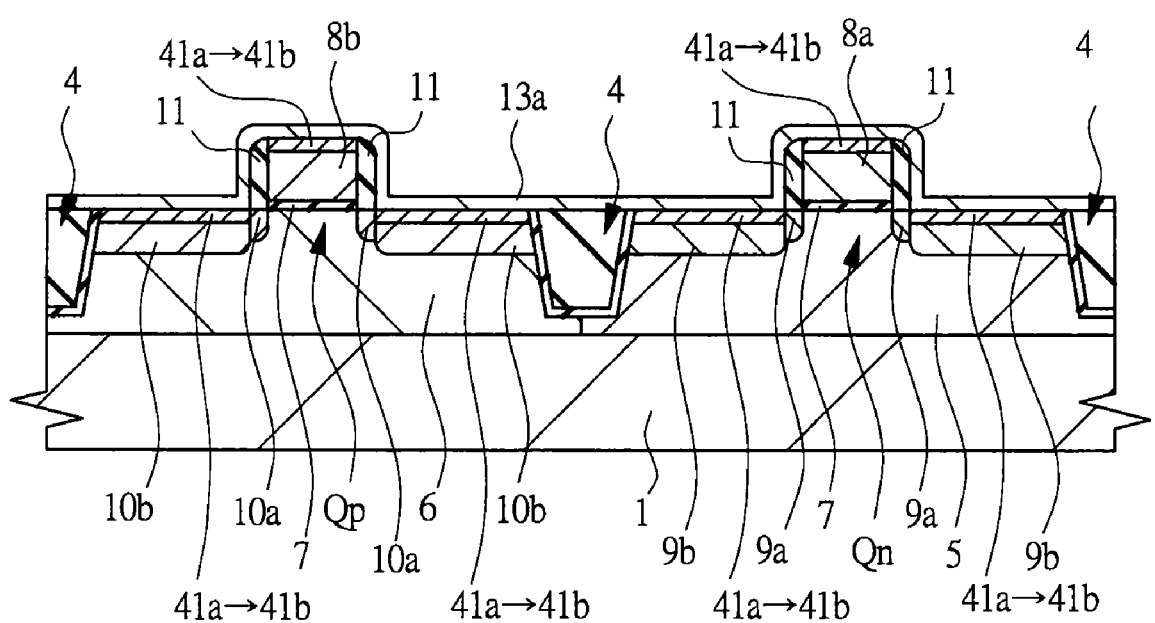
FIG. 58 is a cross-sectional view of main parts of the semiconductor device in a manufacturing step according to the sixth embodiment.
Figure 59:
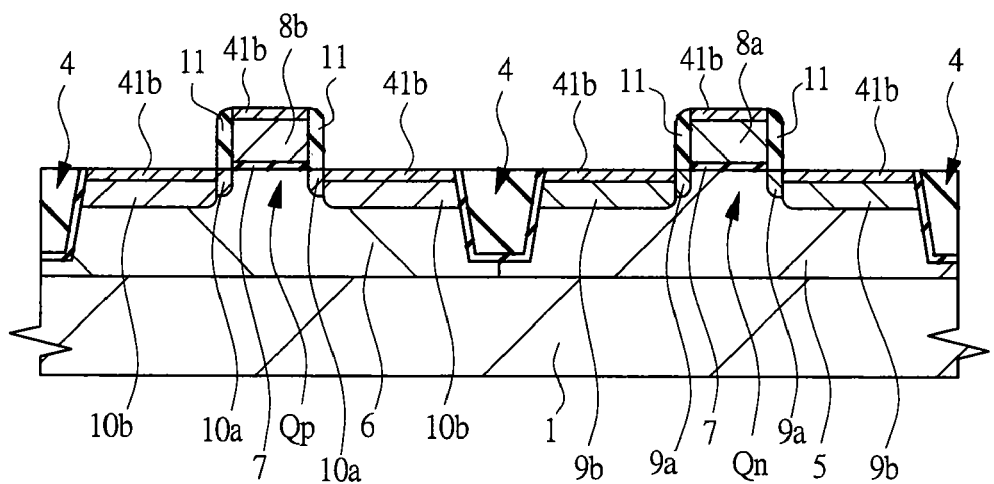
FIG. 59 is a cross-sectional view of main parts of the semiconductor device in a manufacturing step continued from FIG. 58.
Figure 60:
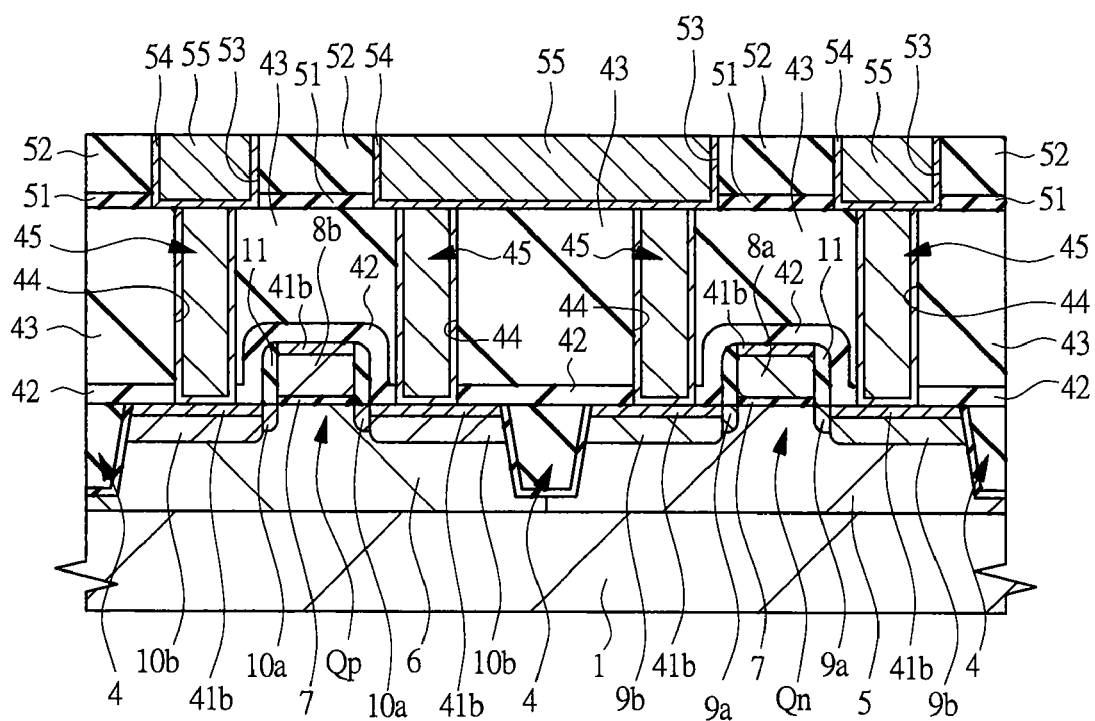
FIG. 60 is a cross-sectional view of main parts of the semiconductor device in a manufacturing step continued from FIG. 59.

FIG. 57 is a manufacturing process flow showing a part of the process of manufacturing a semiconductor device according to the present embodiment and corresponds to FIG. 31 of the above second embodiment and FIG. 48 of the above fifth embodiment. In FIG. 57, a manufacturing process flow in a process is shown where a metal silicide layer (metal/semiconductor reaction layer) is formed on the surface of gate electrodes 8a, 8b, n$^+$ type semiconductor region 9b and p$^+$ type semiconductor region 10b by salicide process after the structure of above FIG. 7 is obtained. FIG. 58 to FIG. 60 are cross-sectional views of main parts of the semiconductor device in the manufacturing process of the present sixth embodiment.

Since the process of manufacturing the semiconductor device according to the present embodiment is same as that in the above fourth embodiment until the process in which the barrier film 13a is formed at above step S11, therefore the explanations thereof are omitted herein, and the processes following the above step S11 are explained.

In the same manner as in the above fourth embodiment, the processes to the above step S11 (in other words, steps S1, S2, S3a, S4, S11) are carried out, and the structure of FIG. 58 almost equivalent to one in the above FIG. 50 is obtained. Then, the second heat treatment like the second heat treatment of step S5b of the above fifth embodiment (step S5b of FIG. 57) is performed to the semiconductor substrate 1.

In the sixth embodiment, although the second heat treatment of step S5b is performed in the state where the barrier film 13a is formed, conditions and roles of the second heat treatment of step S5b are same as those of the fifth embodiment, therefore, repeated explanations thereof are omitted herein.

In the same manner as in the above fifth embodiment, in the sixth embodiment, the second heat treatment of the step S5b is performed, and thereby, the metal silicide layer 41a of the M$_2$Si phase formed by the first heat treatment of step S3a changes into the metal silicide layer 41b of the MSi phase, and a metal silicide layer 41b that has a low resistivity and stable, and in which the composition ratio of the metal element M and the Si is close to the stoichiometry ratio at 1:1 is formed. Further, in the same manner as in the above fifth embodiment, also in the sixth embodiment, the thickness of the metal silicide layer 41b on the surface of p$^+$ type semiconductor region 10b after the second heat treatment of step S5b becomes thinner than the metal silicide layer 41b on the surface of the n$^+$ type semiconductor region 9b after the second heat treatment of the step S5a. Note that, the MSi phase has a lower specific resistant than the M$_2$Si phase and the MSi$_2$ phase, and the metal silicide layer 41b is maintained as a MSi phase of the low resistance even after step S5b (to the production end of the semiconductor device), and, in manufactured semiconductor device (for example, in the state where the semiconductor substrate 1 is divided into pieces, and becomes semiconductor chips), the metal silicide layer 41b is in the MSi phase of the low resistance.

Finally, the barrier film 13a is a film which is difficult to react with the metal silicide layer 41a, 41b, and also a film which does not react with the metal silicide layer 41a, 41b even if the second heat treatment of step S5b is carried out. If the barrier film 13a reacts with the metal silicide layer 41a, 41b in the second heat treatment of step S5b, the composition of the metal silicide layer 41b may be changed. Therefore, as similar to the above-described second and fourth embodiments, also in the present embodiment, by making the barrier film 13a as a film which is difficult to react with the metal silicide layer 41, it is possible to prevent the barrier film 13a from reacting with the metal silicide layer 41a, 41b in the second heat treatment of step S5b, and to form the metal silicide layer 41b properly or precisely. As such a barrier film 13a that is difficult to react with the metal silicide layer 41a, 41b, a titanium nitride (TiN) film and a titanium (Ti) film are preferable.

After the second heat treatment of step S5b, similar to the above fourth embodiment, also in the present embodiment, by performing wet cleaning process and the like, as shown in FIG. 59, the barrier film 13a is removed (step S12 of FIG. 57). At this moment, the metal silicide layer 41b is left on the surface of the gate electrodes 8a, 8b, the n$^+$ type semiconductor region 9b and the p$^+$ type semiconductor region 10b. The wet cleaning process of step S12 may be performed by the wet cleaning using sulfuric acid, or the wet cleaning using sulfuric acid and oxygenated water. The barrier film 13a removal process of this step S12 in the present embodiment can be performed as same as the barrier film 13a removal process of step S12 in the above second and fourth embodiments.

The processes after that are same to those in the above fourth embodiment. In other words, in the same manner as in the fourth embodiment, as shown in FIG. 60, the insulating film 42 and the insulating film 43 are formed, and contact holes 44 are formed in the insulating films 43, 42 and the plugs 45 are formed in contact holes 44, and the stopper insulating film 51 and the insulating film 52 are formed on the insulating film 43 in which the plug 45 is buried, and the wiring trench 53 is formed, and the barrier conductive film 54 and a copper film are buried in the wiring trench 53 and the wiring 55 is formed.

Also in the present embodiment, in the various heating processes after the second heat treatment of step S5b of FIG. 57 (for example, in the processes with heating of the semiconductor substrate 1 such as the film formation processes of various kinds of insulating films and conductive films), the temperature of the semiconductor substrate 1 is kept so as not to become higher than the heat treatment temperature T$_{12}$ of the second heat treatment of step S5b. Thereby, it is possible to prevent the metal element M forming metal silicide layer (MSi phase) 41b from diffusing in the semiconductor substrate 1 (the gate electrodes 8a, 8b, the n$^+$ type semiconductor region 9b and the p$^+$ type semiconductor region 10b) that causes property fluctuation of the n-channel type MISFET Qn and the p-channel type MISFET Qp, by the heat application after step S5b (the film formation process of, for example, various kinds of insulating films and conductive films).

In the present embodiment, in addition to obtaining the effect of the above third embodiment, the upper limit of the heat treatment temperature T$_{12}$ of the second heat treatment of step S5b is set same as in the second heat treatment of step S5 in the above first embodiment. In other words, the heat treatment temperature T$_{12}$ of the second heat treatment of step S5b is made lower than the temperature T$_3$ at which the lattice size of MSi$_2$ and the lattice size of the semiconductor substrate 1 become same (that is, the above mismatch α becomes 0%) (T$_{12}$<T$_3$), and preferably, it is set lower than the temperature T$_6$ at which the above mismatch α becomes 0.01% (T$_{12}$≦T$_6$), and further preferably it is set lower than the temperature T$_7$ at which the above mismatch α becomes 0.02% (T$_{12}$≦T$_7$). Thereby, in addition to obtaining the effect of the above fourth embodiment, it is possible to prevent the abnormal growth of the metal silicide layer 41b formed on the surface of the n$^+$ type semiconductor region 9b and the p$^+$ type semiconductor region 10b (partial growth of MSi$_2$ part) more precisely, and to reduce the junction leakage current in the n+ type semiconductor region 9b and the p+ type semiconductor region 10b further more, and reduce the unevenness of the junction leakage further more. Moreover, the effect of preventing abnormal growth of MSi2 from the metal silicide layers 41a, 41b to the channel portion in the second heat treatment of step S5b can be further increased. Therefore, it is possible to improve the reliability and performance of the semiconductor device further more.

Further, in the same manner as in the first and second embodiments, in the present embodiment and the above fifth embodiment, the heat treatment temperature of the second heat treatment of step S5b is lower than the temperature $T_3$ at which the lattice size of $MSi_2$ and the lattice size of the semiconductor substrate 1 become same, and thereby, the abnormal growth of the metal silicide layer 41b (partial growth of $MSi_2$ part) is prevented. Therefore, in the same manner as in the first and second embodiments, when the present embodiment and the above fifth embodiment is applied to the case where the metal silicide layers 41a and 41b are formed by the silicide where there can be a $MSi_2$ phase, the effect is large. Further, in the same manner as in the first and second embodiments, when the present embodiment and the above fifth embodiment are applied to the case when the similarity between the crystal structure of the semiconductor substrate 1 and the crystal structure of $MSi_2$ (metal disilicide) is high, and in particular, when the crystal structure of the semiconductor substrate 1 takes the diamond structure and the crystal structure of $MSi_2$ (metal disilicide) takes the fluorite structure, the effect is large.

Therefore, in the same manner as in the first and second embodiments, when the present embodiment and the above fifth embodiment are applied to the case where the metal film 12 is a Ni film or a Ni alloy film (as Ni alloy film, preferably a Ni—Pt alloy film, an Ni—Pd alloy film, a Ni—Y alloy film, a Ni—Yb alloy film, a Ni—Er alloy film, or a Ni-lanthanoid alloy film) as the metal, the effect is large. Further, in the same manner as in the first and second embodiments, in the present embodiment and the above fifth embodiment too, it is most preferable to use single crystal silicon to the semiconductor substrate 1, but, besides single crystal silicon, any material that has the crystal structure of the diamond structure type in the same manner as single crystal silicon.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is effective when applied to the production technology of the semiconductor device equipped with a semiconductor element having a metal silicide layer.

What is claimed is:

1. A method of manufacturing a semiconductor device comprising the steps of:
   (a) providing a semiconductor substrate;
   (b) forming a semiconductor region on the semiconductor substrate;
   (c) forming a metal film on the semiconductor substrate including on the semiconductor region;
   (d) performing a first heat treatment so that the metal film and the semiconductor region are reacted, thereby forming a metal silicide layer formed of a monosilicide of a metal element forming the metal film;
   (e) removing the unreacted metal film, and leaving the metal silicide layer on the semiconductor region after the step (d); then
   (f) performing a second heat treatment whose heat treatment temperature is higher than that of the first heat treatment after the step (e); and
   (g) forming an insulating film on the semiconductor substrate including on the metal silicide layer after the step (f),
   wherein the heat treatment temperature of the second heat treatment of the step (f) is lower than a first temperature at which a lattice size of a disilicide of the metal element forming the metal film and a lattice size of the semiconductor substrate become same with each other.

2. The method of manufacturing a semiconductor device according to claim 1,
   wherein the metal film is a Ni film or a Ni alloy film.

3. The method of manufacturing a semiconductor device according to claim 1,
   wherein the metal film is a Ni film, a Ni—Pt alloy film, a Ni—Pd alloy film, a Ni—Y alloy film, a Ni—Yb alloy film, a Ni—Er alloy film, or a Ni-lanthanoid alloy film.

4. The method of manufacturing a semiconductor device according to claim 1,
   wherein such a process that the temperature of the semiconductor substrate becomes higher than the heat treatment temperature of the second heat treatment is not performed after the step (f).

5. The method of manufacturing a semiconductor device according to claim 1,
   wherein the metal film is a Ni film, and the first temperature is 590° C.

6. The method of manufacturing a semiconductor device according to claim 1,
   wherein a monosilicide phase of the metal element forming the metal film has a resistivity lower than that of a disilicide phase of the metal element forming the metal film, and
   the metal silicide layer remains to be in the monosilicide phase of the metal element also after the second heat treatment of the step (f).

7. The method of manufacturing a semiconductor device according to claim 1,
   wherein the second heat treatment is performed for stabilizing the metal silicide layer.

8. The method of manufacturing a semiconductor device according to claim 1,
   wherein the semiconductor substrate is formed of a silicon-containing material.

9. The method of manufacturing a semiconductor device according to claim 1,
   wherein the semiconductor substrate has a crystal structure of a diamond structure, and the disilicide of the metal element has a crystal structure of a fluorite structure.

10. The method of manufacturing a semiconductor device according to claim 1,
    wherein a difference between the lattice size of the disilicide of the metal element and that of the semiconductor substrate in the heat treatment temperature of the second heat treatment is 0.01% or more of the lattice size of the semiconductor substrate.

11. The method of manufacturing a semiconductor device according to claim 1,
    wherein a difference between the lattice size of the disilicide of the metal element and that of the semiconductor substrate in the heat treatment temperature of the second heat treatment is 0.02% or more of the lattice size of the semiconductor substrate.

12. The method of manufacturing a semiconductor device according to claim 1,
wherein the second heat treatment is performed in an atmosphere of an inert gas or nitrogen gas in the step (f).

13. The method of manufacturing a semiconductor device according to claim 1,
wherein the semiconductor region is a semiconductor region for source or drain.

14. The method of manufacturing a semiconductor device according to claim 13, further comprising the steps of:
after the step (a),
(a1) forming a gate insulating film on the semiconductor substrate; and
(a2) forming a gate electrode on the gate insulating film,
wherein the metal film is formed on the semiconductor substrate including on the semiconductor region so as to cover the gate electrode in the step (c).

15. The method of manufacturing a semiconductor device according to claim 1 further comprising the step of
(c1) forming a first barrier film on the metal film after the step (c) and before the step (d),
wherein the first barrier film and the unreacted metal film are removed in the step (e).

16. The method of manufacturing a semiconductor device according to claim 15,
wherein the first barrier film is a film that causes tensile stress to the semiconductor substrate.

17. The method of manufacturing a semiconductor device according to claim 16,
wherein the first barrier film is a film unreactive with the metal film even when the first heat treatment is performed.

18. The method of manufacturing a semiconductor device according to claim 16 further comprising the step of
(c2) dry-cleaning a surface of the semiconductor region on a main surface of the semiconductor substrate before the step (c),
wherein the step (c) and the step (c1) are performed without exposing the semiconductor substrate to the atmosphere after the step (c2).

19. The method of manufacturing a semiconductor device according to claim 16 further comprising the steps of:
after the step (a),
(a3) forming a groove for device isolation in the semiconductor substrate; and
(a4) forming a device isolation region formed of an insulator buried in the groove for device isolation,
wherein the device isolation region formed in the step (a4) functions to cause compression stress to the semiconductor substrate, and
wherein the semiconductor region is formed in an active region defined by the device isolation region.

20. A method of manufacturing a semiconductor device comprising the steps of:
(a) providing a semiconductor substrate;
(b) forming a device isolation region to the semiconductor substrate, thereby defining an active region to form an n-channel type field effect transistor and an active region to form a p-channel type field effect transistor;
(c) forming a gate insulating film of the n-channel type field effect transistor and a gate insulating film of the p-channel type field effect transistor on the semiconductor substrate;
(d) forming a gate electrode on the gate insulating film of the n-channel type field effect transistor and the gate insulating film of the p-channel type field effect transistor, respectively;
(e) forming a semiconductor region for source or drain of the n-channel type field effect transistor and a semiconductor region for source or drain of the p-channel type field effect transistor on the semiconductor substrate;
(f) forming a metal film on the semiconductor substrate including on the gate electrode and the semiconductor region of the n-channel type field effect transistor and on the gate electrode and the semiconductor region of the p-channel type field effect transistor;
(g) forming a first barrier film on the metal film;
(h) performing a first heat treatment so as to make the metal film and the gate electrode or the semiconductor region of the n-channel type field effect transistor reacted and the metal film and the gate electrode or the semiconductor region of the p-channel type field effect transistor reacted, thereby forming a metal silicide layer;
(i) removing the first barrier film and a metal element forming the metal film after the above step (h), thereby leaving the metal silicide layer on a surface of the gate electrode or the semiconductor region of the n-channel type field effect transistor, and on a surface of the gate electrode or the semiconductor region of the p-channel type field effect transistor; then
(j) performing a second heat treatment; and
(k) forming an insulating film on the semiconductor substrate including on the metal silicide layer after the step (j),
wherein, in the step (h), the first heat treatment is performed in a temperature range where a reaction rate of the metal film when the metal film and the semiconductor region of the p-channel type field effect transistor are reacted becomes lower than a reaction rate of the metal film when the metal film and the semiconductor region of the n-channel type field effect transistor are reacted.

21. The method of manufacturing a semiconductor device according to claim 20,
wherein a thickness of the metal silicide layer formed on the surface of the semiconductor region of the p-channel type field effect transistor is thinner than a thickness of the metal silicide layer formed on the surface of the semiconductor region of the n-channel type field effect transistor in the step (h).

22. The method of manufacturing a semiconductor device according to claim 20,
wherein a thickness of the metal silicide layer formed on the surface of the semiconductor region of the p-channel type field effect transistor is thinner than a thickness of the metal silicide layer formed on the surface of the semiconductor region of the n-channel type field effect transistor in the step (j).

23. The method of manufacturing a semiconductor device according to claim 20,
wherein not all of the metal film is consumed in the reaction of the metal film and the semiconductor region of the p-channel type field effect transistor, and the metal element forming the unreacted metal film remains on the metal silicide layer formed on a surface of the semiconductor region of the p-channel type field effect transistor in the step (h).

24. The method of manufacturing a semiconductor device according to claim 20,
wherein a temperature of the second heat treatment of the step (j) is higher than a temperature of the first heat treatment of the step (h).

25. The method of manufacturing a semiconductor device according to claim 20, wherein the metal silicide layer formed in the step (h) is formed of a dimetal silicide of the metal element forming the metal film, and the metal silicide layer becomes a metal silicide layer formed of a metal monosilicide of the metal element forming the metal film by the second heat treatment in the step (j).

26. The method of manufacturing a semiconductor device according to claim 20, wherein the metal film is a Ni film, a Ni alloy film, or a Pt film.

27. The method of manufacturing a semiconductor device according to claim 20, wherein the metal film is a Ni film, a Ni—Pt alloy film, a Ni—Pd alloy film, a Ni—Y alloy film, a Ni—Yb alloy film, a Ni—Er alloy film, a Ni-lanthanoid alloy film, or a Pt film.

28. The method of manufacturing a semiconductor device according to claim 20, wherein the metal silicide layer formed in the step (h) is formed of a silicide which is more metal-rich than the dimetal silicide of the metal element forming the metal film, and wherein the metal silicide layer becomes a metal silicide layer formed of the dimetal silicide of the metal element forming the metal film by the second heat treatment in the step (i).

29. The method of manufacturing a semiconductor device according to claim 28, wherein the metal film is a Pt film.

30. The method of manufacturing a semiconductor device according to claim 20, wherein the metal film is a Ni film.

31. The method of manufacturing a semiconductor device according to claim 30, wherein a temperature of the first heat treatment of the step (h) is 260° C. or more and lower than 320° C.

32. The method of manufacturing a semiconductor device according to claim 30, wherein a thickness of the metal film formed in the step (f) is 4 to 33 nm.

33. The method of manufacturing a semiconductor device according to claim 20, wherein the first barrier film is a film unreacted with the metal silicide layer even when the first heat treatment is performed.

34. The method of manufacturing a semiconductor device according to claim 20, wherein the first barrier film is a Ti film or a TiN film.

35. The method of manufacturing a semiconductor device according to claim 20 further comprising the step of (f1) dry-cleaning a surface of the gate electrode or the semiconductor region of the n-channel type field effect transistor, and a surface of the gate electrode or the semiconductor region of the p-channel type field effect transistor before the step (f), wherein the step (f) and the step (g) are performed without exposing the semiconductor substrate to the atmosphere after the step (f1).

36. The method of manufacturing a semiconductor device according to claim 20, wherein a heat treatment temperature of the second heat treatment of the step (j) is lower than a first temperature at which a lattice size of a disilicide of the metal element forming the metal film and that of the semiconductor substrate become same with each other.

37. The method of manufacturing a semiconductor device according to claim 36, wherein the semiconductor substrate has a crystal structure of a diamond structure, and the disilicide of the metal element has a crystal structure of a fluorite structure.

38. The method of manufacturing a semiconductor device according to claim 37, wherein a difference between the lattice size of the disilicide of the metal element and the lattice size of the semiconductor substrate at the heat treatment temperature of the second heat treatment is 0.01% or more of the lattice size of the semiconductor substrate.

39. The method of manufacturing a semiconductor device according to claim 38, wherein the difference between the lattice size of the disilicide of the metal element and the lattice size of the semiconductor substrate in the heat treatment temperature of the second heat treatment is 0.02% or more of the lattice size of the semiconductor substrate.

40. The method of manufacturing a semiconductor device according to claim 36, wherein such a process that a temperature of the semiconductor substrate becomes higher than the heat treatment temperature of the second heat treatment is not performed after the step (j).

41. The method of manufacturing a semiconductor device according to claim 36, wherein the metal film is a Ni film, a Ni—Pt alloy film, a Ni—Pd alloy film, a Ni—Y alloy film, a Ni—Yb alloy film, a Ni—Er alloy film, or a Ni-lanthanoid alloy film.

42. The method of manufacturing a semiconductor device according to claim 41, wherein a monosilicide phase of the metal element forming the metal film has a resistivity lower than that of a disilicide phase of the metal element forming the metal film, and the metal silicide layer remains to be in the monosilicide phase of the metal element also after the second heat treatment of the step (j).

43. The method of manufacturing a semiconductor device according to claim 41 further comprising the step of (j1) forming a second barrier film on the semiconductor substrate including on the metal silicide layer after the step (i) and before the step (j), and the method further comprising the step of (j2) removing the second barrier film after the step (j).

* * * * *